(12) United States Patent
Goda et al.

(10) Patent No.: US 7,038,291 B2
(45) Date of Patent: May 2, 2006

(54) SEMICONDUCTOR DEVICE AND METHOD OF FABRICATING THE SAME

(75) Inventors: Akira Goda, Kanagawa-ken (JP); Mitsuhiro Noguchi, Kanagawa-ken (JP); Hiroaki Hazama, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/058,946

(22) Filed: Jan. 30, 2002

(65) Prior Publication Data

US 2002/0149081 A1   Oct. 17, 2002

(30) Foreign Application Priority Data

Feb. 6, 2001 (JP) ............................. 2001-029174
Oct. 16, 2001 (JP) ............................. 2001-317620

(51) Int. Cl.
*H01L 29/00* (2006.01)

(52) U.S. Cl. .................... 257/510; 257/649; 257/314; 257/315; 257/500; 257/501; 257/499; 257/506; 257/324; 257/390

(58) Field of Classification Search ................ 257/510, 257/649, 314, 315, 500, 501, 499, 506, 324, 257/390, 523
See application file for complete search history.

(56) References Cited

U.S. PATENT DOCUMENTS

| | | | |
|---|---|---|---|
| 6,265,293 B1 * | 7/2001 | Yu .............................. | 438/528 |
| 6,301,155 B1 * | 10/2001 | Fujiwara ................ | 365/185.18 |
| 6,326,268 B1 * | 12/2001 | Park et al. ................... | 438/262 |
| 6,376,877 B1 * | 4/2002 | Yu et al. ..................... | 257/317 |
| 6,531,350 B1 * | 3/2003 | Satoh et al. ................ | 438/197 |
| 6,569,742 B1 * | 5/2003 | Taniguchi et al. .......... | 438/303 |
| 6,624,022 B1 * | 9/2003 | Hurley et al. ............... | 438/256 |
| 2002/0033501 A1 * | 3/2002 | Sakagami .................... | 257/315 |

FOREIGN PATENT DOCUMENTS

| | | |
|---|---|---|
| JP | 4-12573 | 1/1992 |
| JP | 8-17948 | 1/1996 |
| JP | 10-256399 | 9/1998 |
| JP | 11-163304 | 6/1999 |
| JP | 2000-286349 | 10/2000 |

OTHER PUBLICATIONS

S. Aritome, et al., "A. 0.67um$^2$ Self-Aligned Shallow Trench Isolation Cell(SA-STI Cell) For 3v-only 256Mbit NAND EEPROMs", IEDM Tech. Digist, 1994, pp. 3.6.1-3.6.4.

* cited by examiner

*Primary Examiner*—Eddie C. Lee
*Assistant Examiner*—Junghwa Im
(74) *Attorney, Agent, or Firm*—Oblon, Spivak, McClelland, Maier & Neustadt, P.C.

(57) ABSTRACT

Provided is a semiconductor device and a method of fabricating the semiconductor device, in which electric characteristics of a gate insulating film thereof in the vicinity of an element isolation region are equal to electric characteristics of the gate insulating film at portions other than the vicinity of the element isolation region. A semiconductor device of the present invention includes a semiconductor substrate, shallow trench isolation regions formed in the semiconductor substrate, source and drain regions formed in the semiconductor substrate, the source and drain regions sandwiching a surface of the semiconductor substrate to define a channel, gate insulating films having equal thicknesses in a central portion of the channel and in portions contacting with on the shallow trench isolation regions, and gate electrodes formed on the gate insulating films.

6 Claims, 49 Drawing Sheets

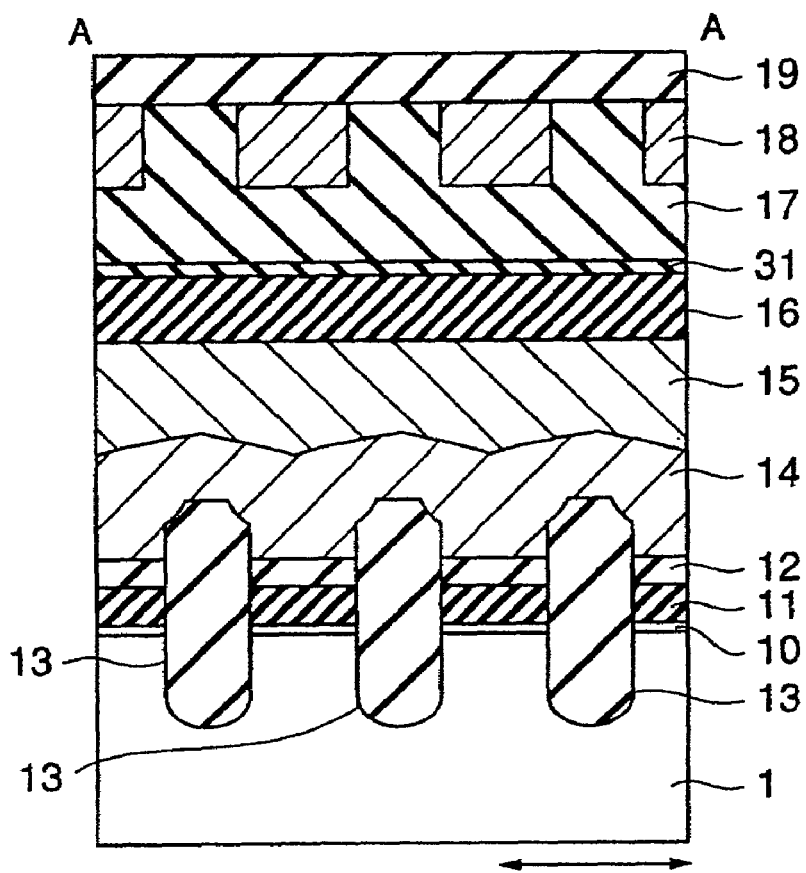
Fig. 1    Row Direction
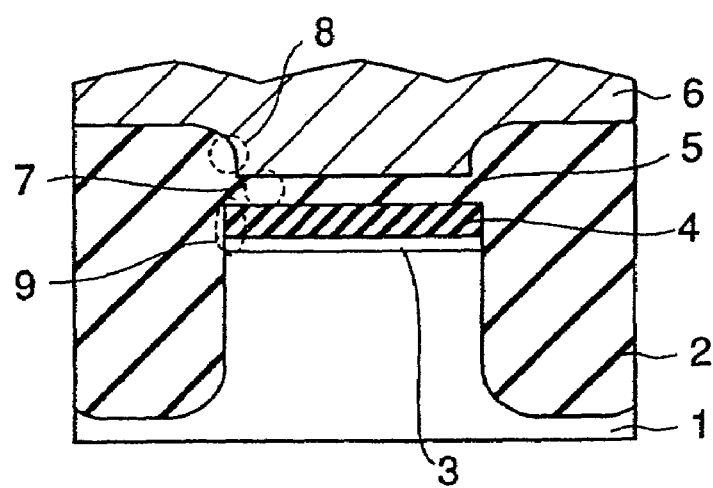
Fig. 2

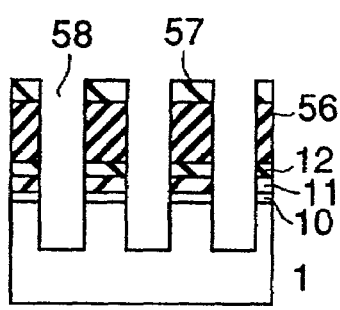
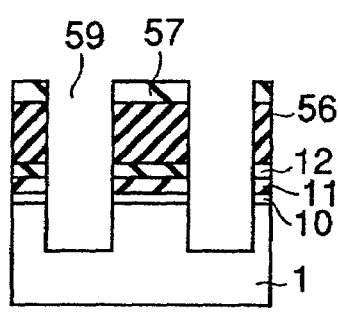
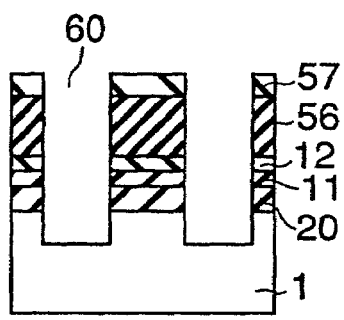
Fig. 17A   Fig. 17B   Fig. 17C
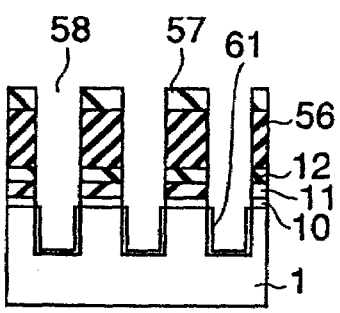
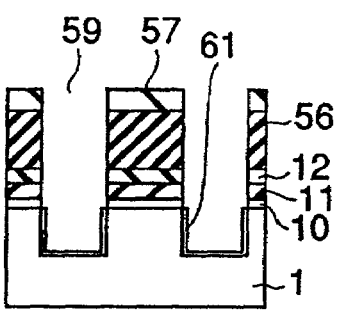
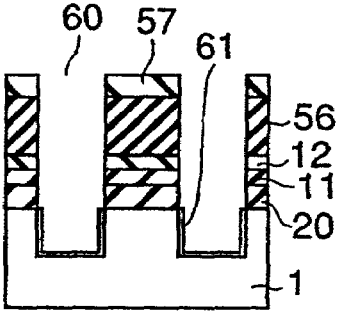
Fig. 18A   Fig. 18B   Fig. 18C
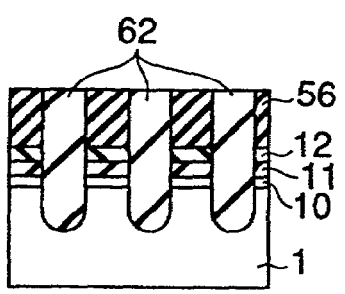
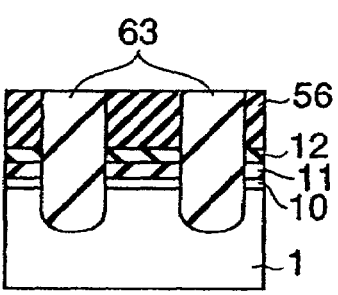
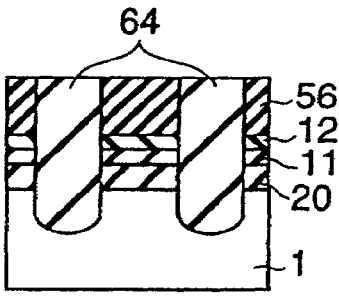
Fig. 19A   Fig. 19B   Fig. 19C

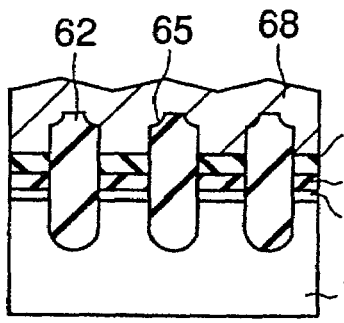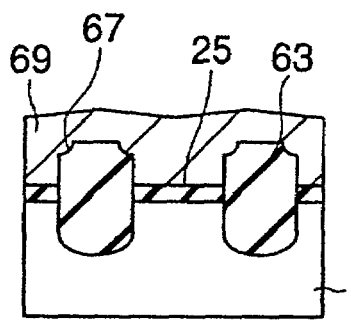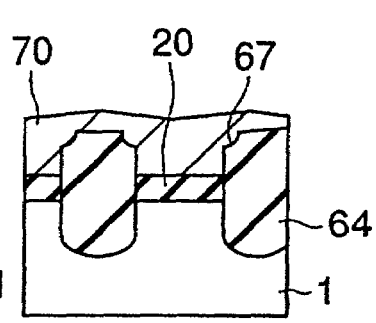
Fig. 23A  Fig. 23B  Fig. 23C
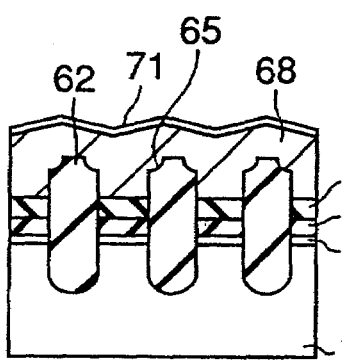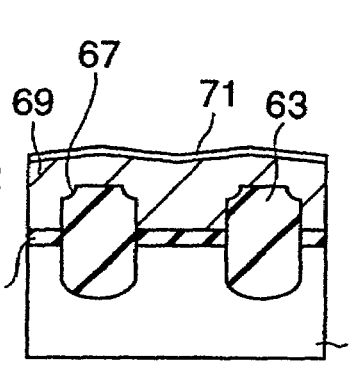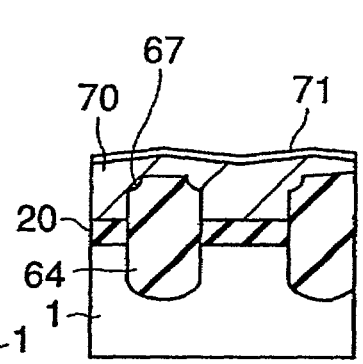
Fig. 24A  Fig. 24B  Fig. 24C
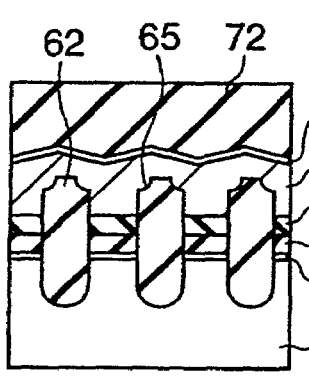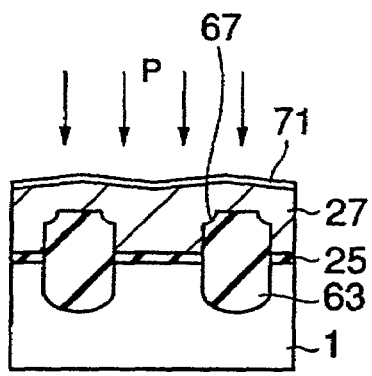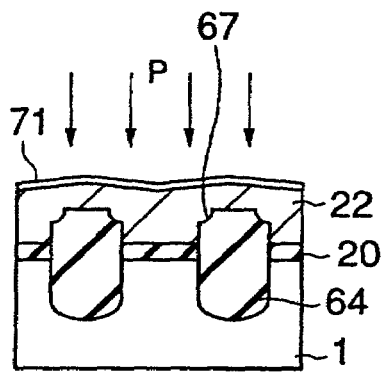
Fig. 25A  Fig. 25B  Fig. 25C

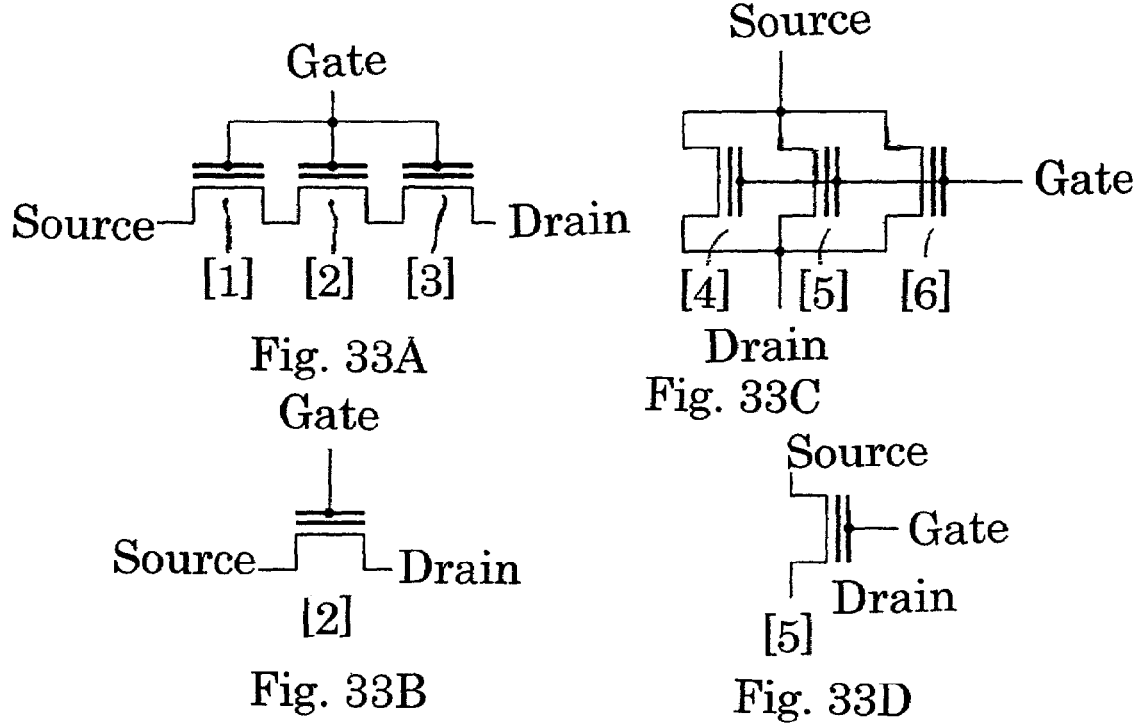
Fig. 33A
Fig. 33B
Fig. 33C
Fig. 33D
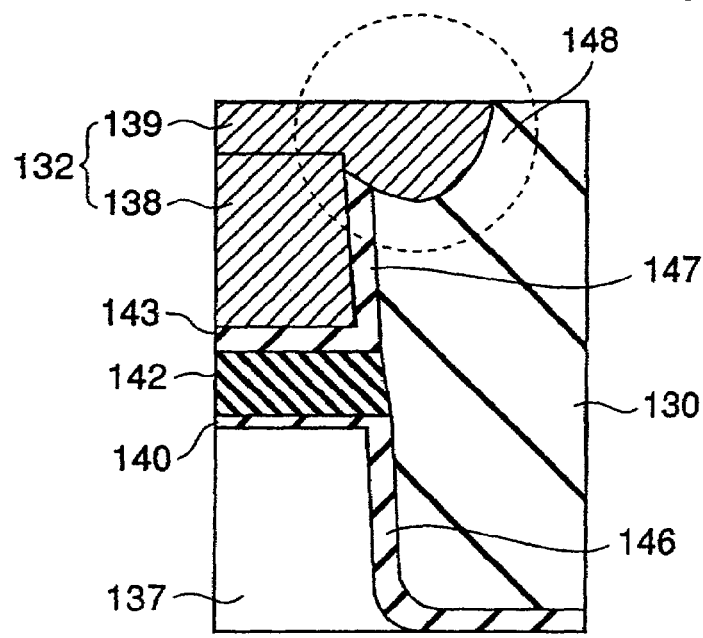
Fig. 34

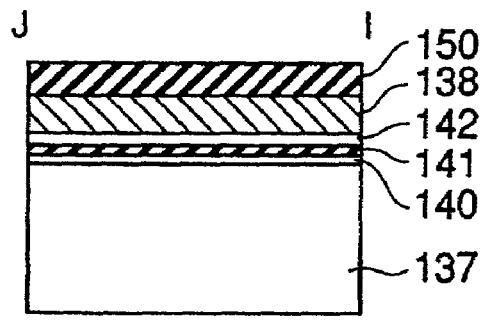
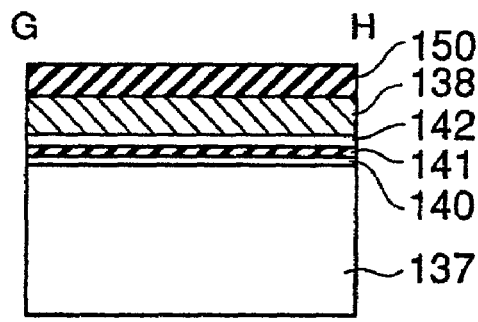
Fig. 35A      Fig. 35B
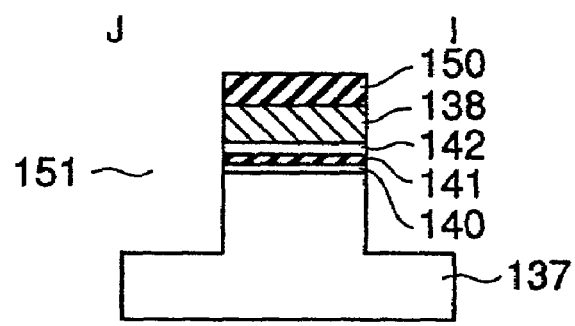
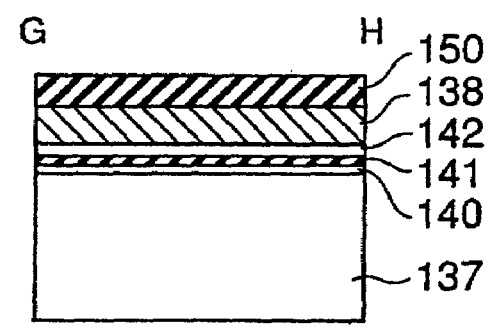
Fig. 36A      Fig. 36B
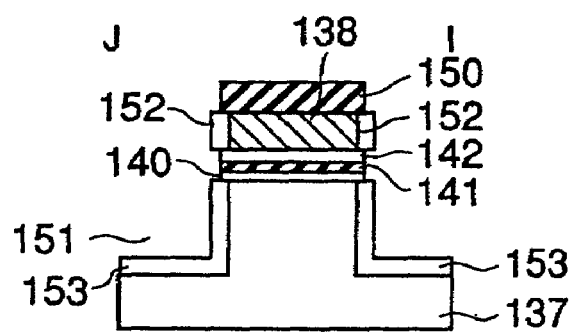
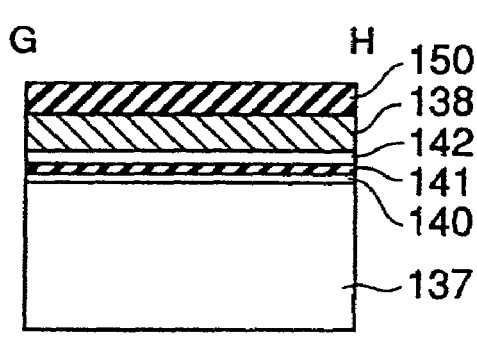
Fig. 37A      Fig. 37B

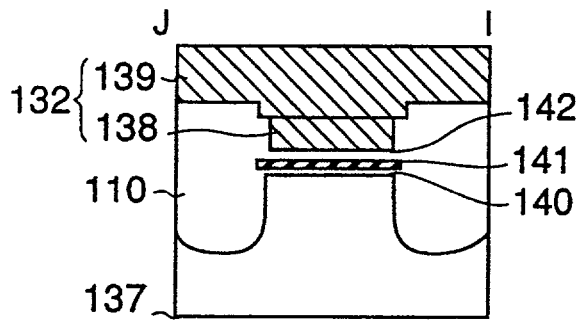 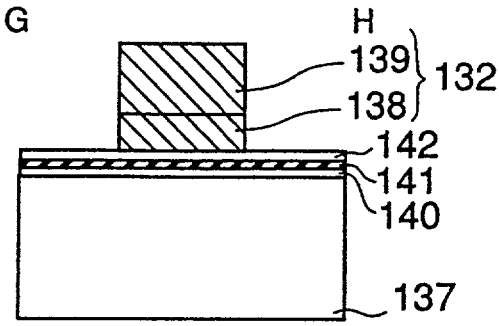
Fig. 41A  Fig. 41B
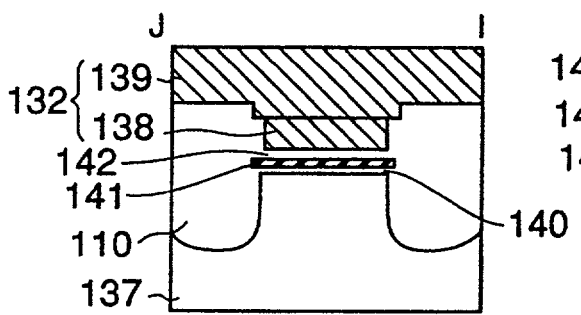 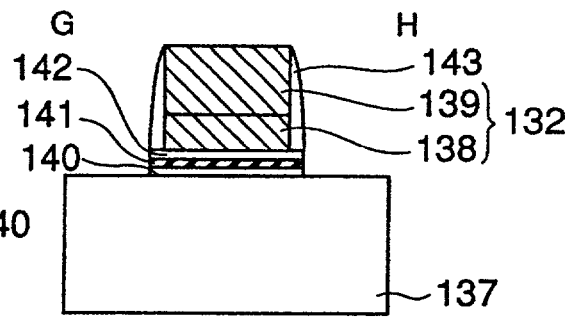
Fig. 42A  Fig. 42B
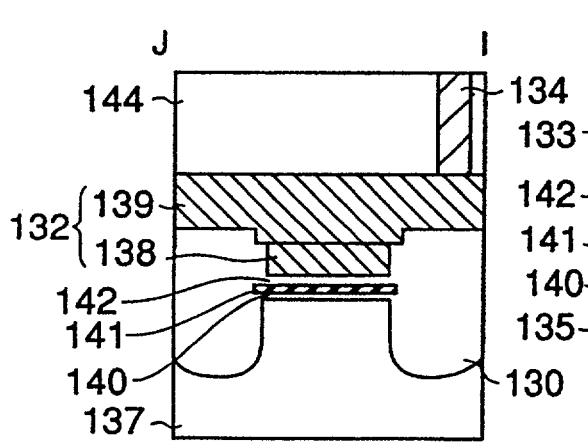 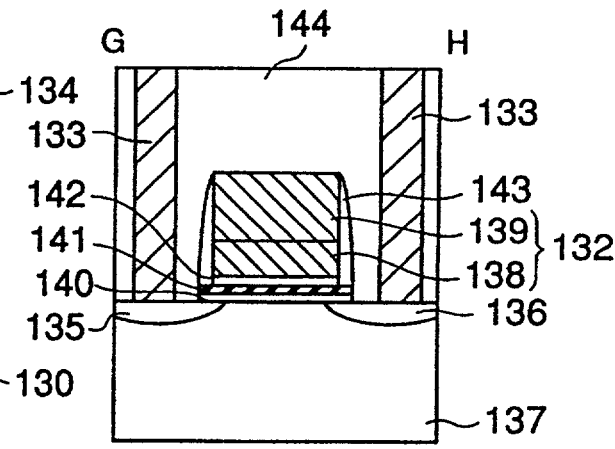
Fig. 43A  Fig. 43B

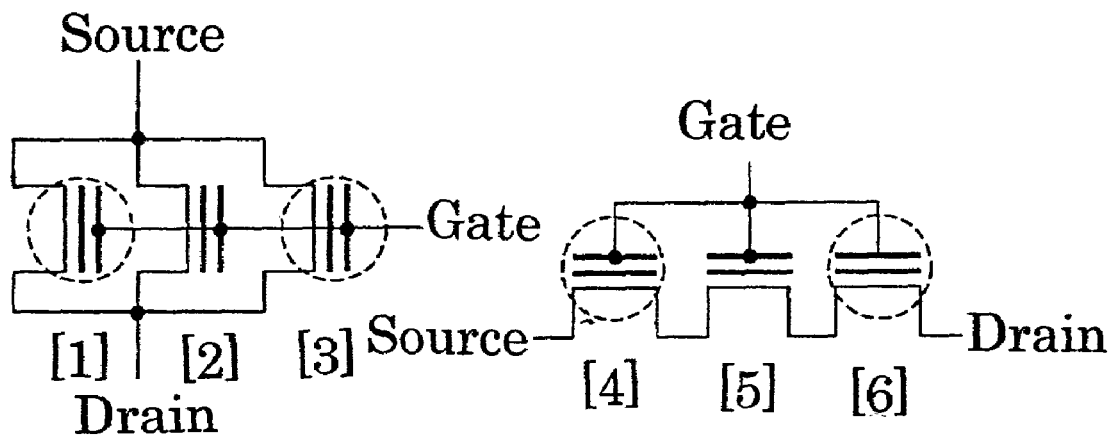
Fig. 53A
Fig. 53C
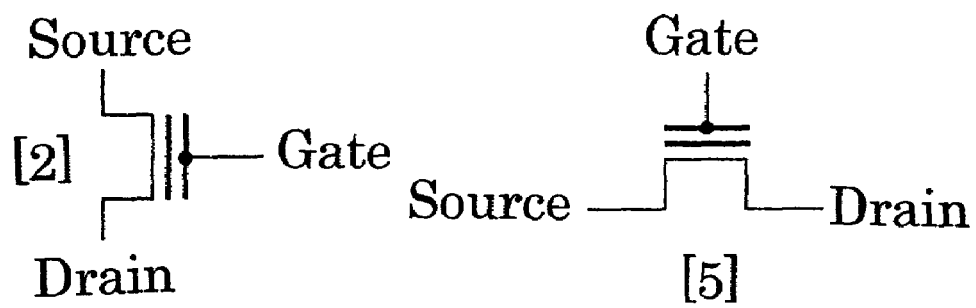
Fig. 53B
Fig. 53D
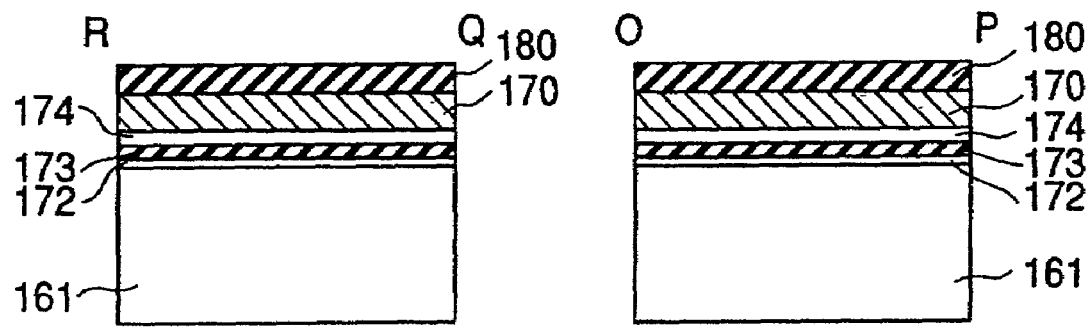
Fig. 54A
Fig. 54B

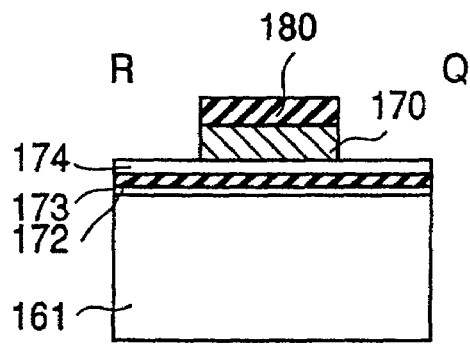
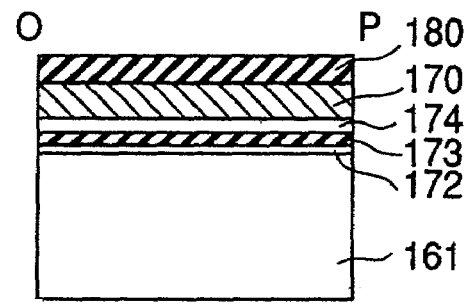
Fig. 55A
Fig. 55B
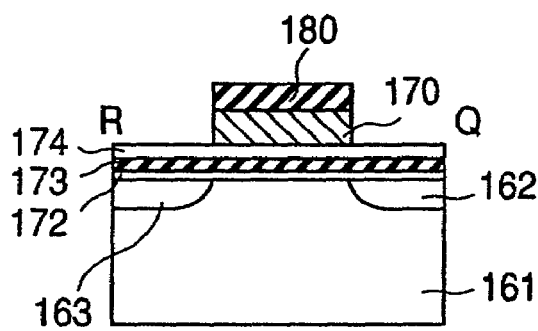
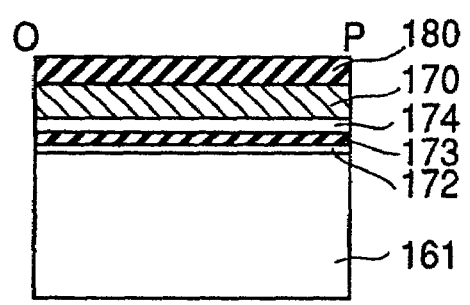
Fig. 56A
Fig. 56B
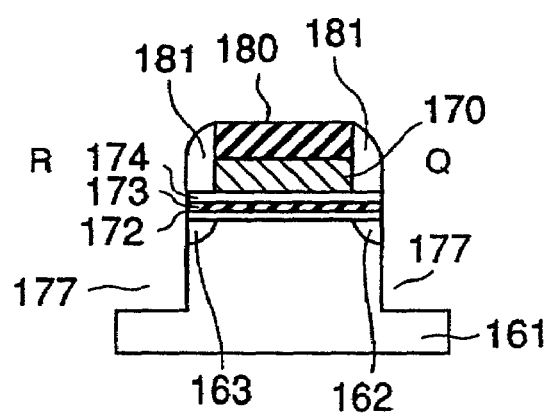
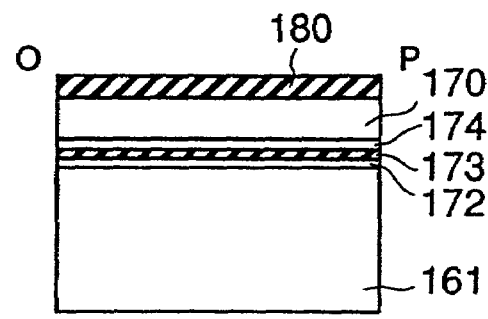
Fig. 57A
Fig. 57B Direction of Currents Flowing →

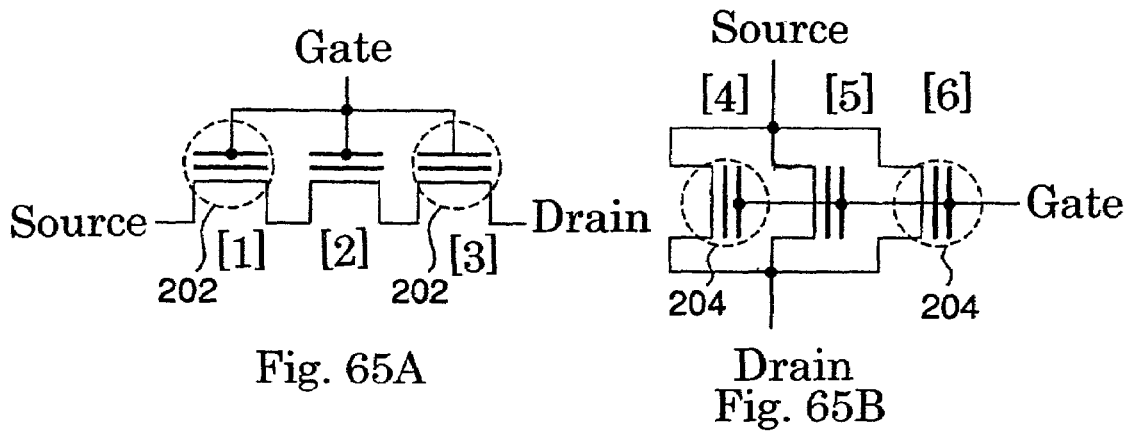
Fig. 65A
Fig. 65B
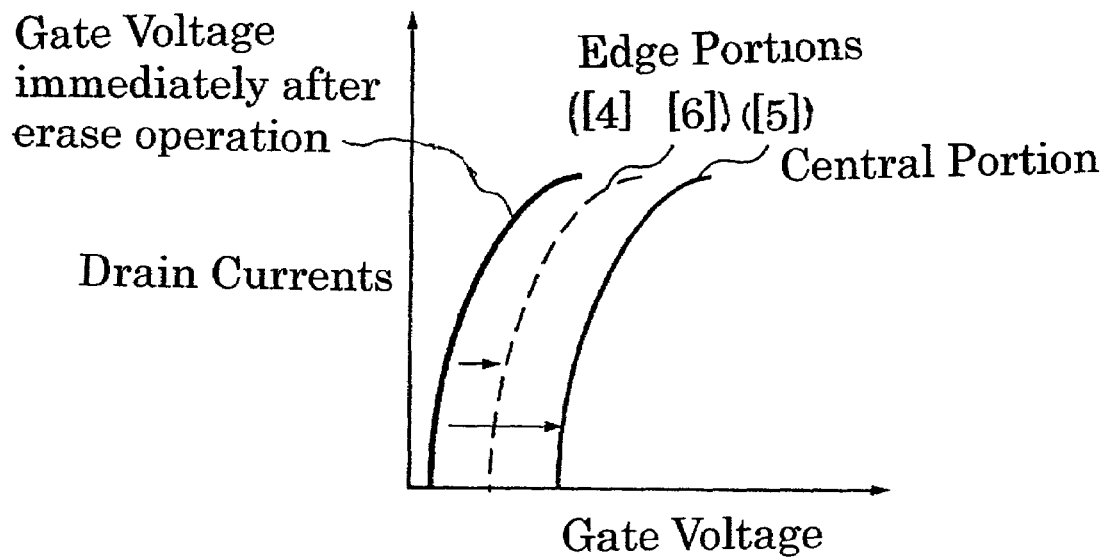
Fig. 65C

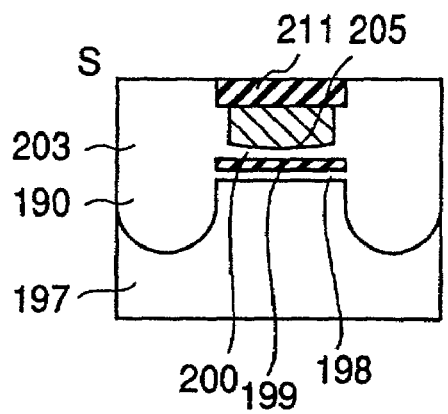
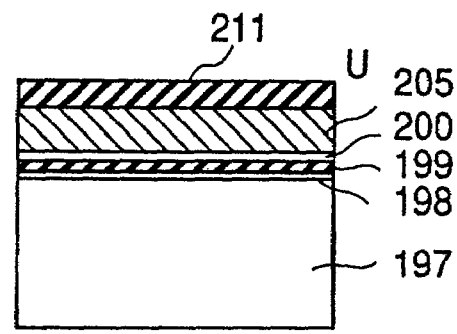
Fig. 71A  Fig. 71B
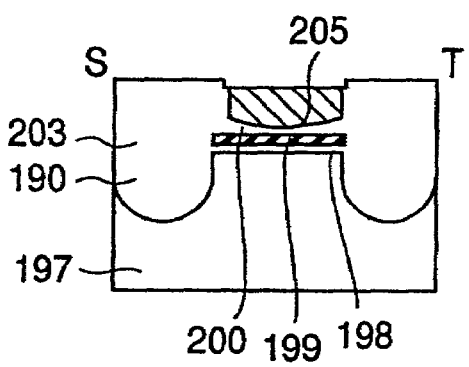
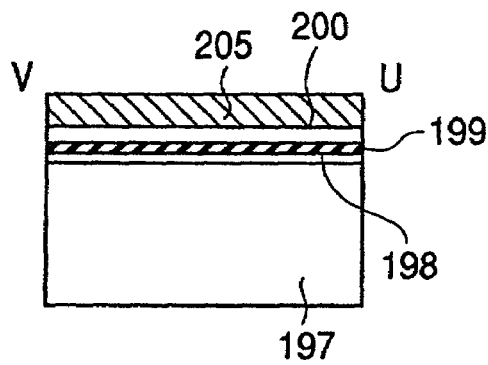
Fig. 72A  Fig. 72B
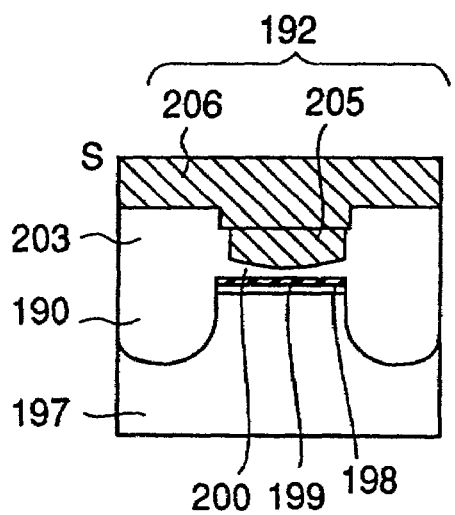
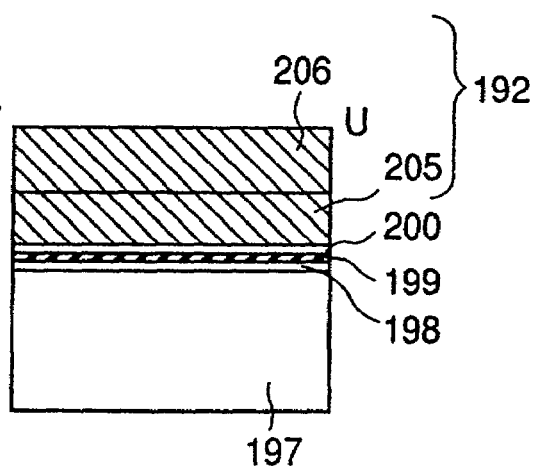
Fig. 73A  Fig. 73B

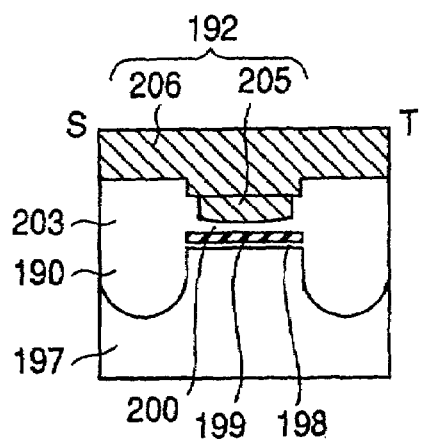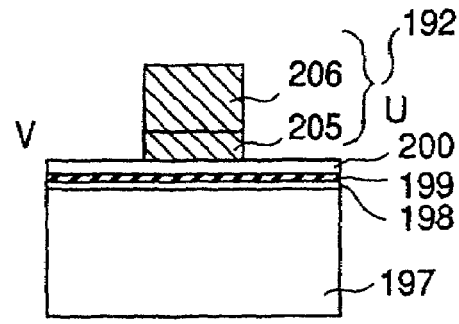
Fig. 74A  Fig. 74B
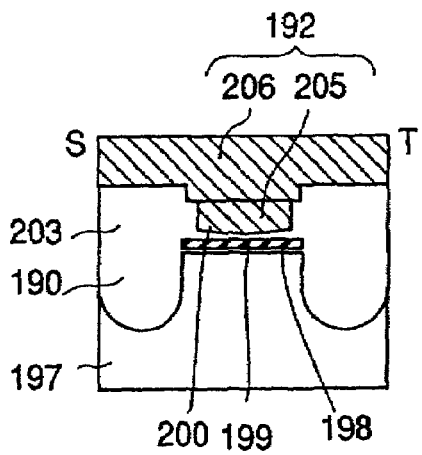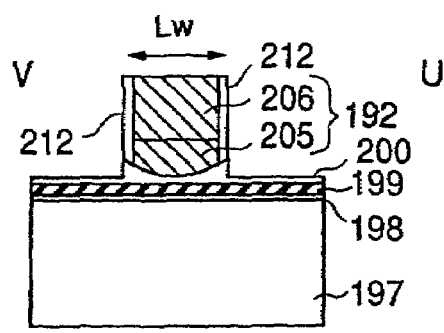
Fig. 75A  Fig. 75B
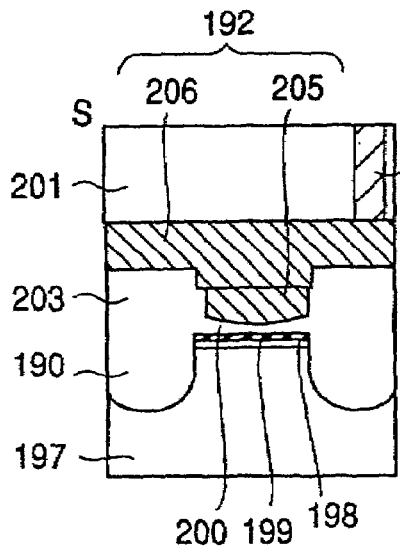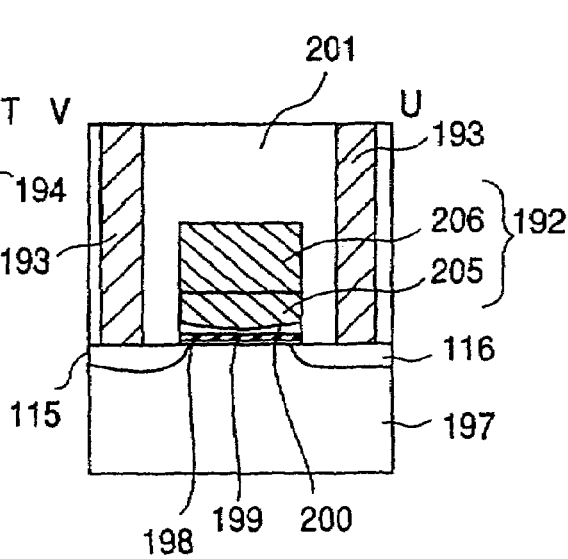
Fig. 76A  Fig. 76B Direction of Currents Flowing

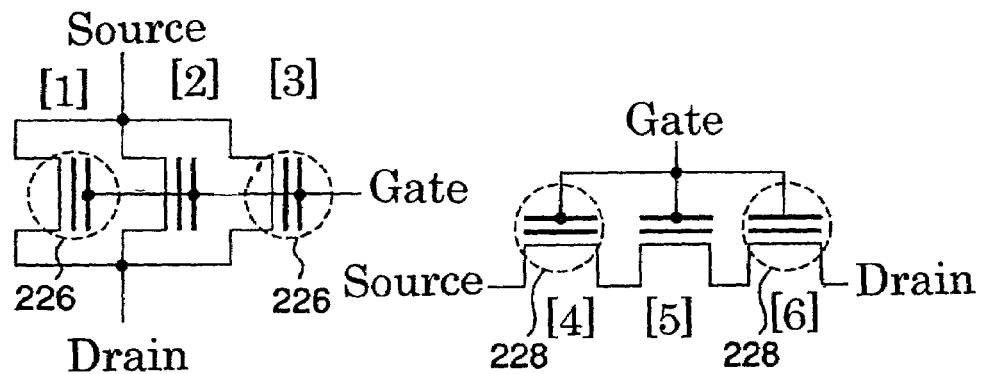
Fig. 78A
Fig. 78B
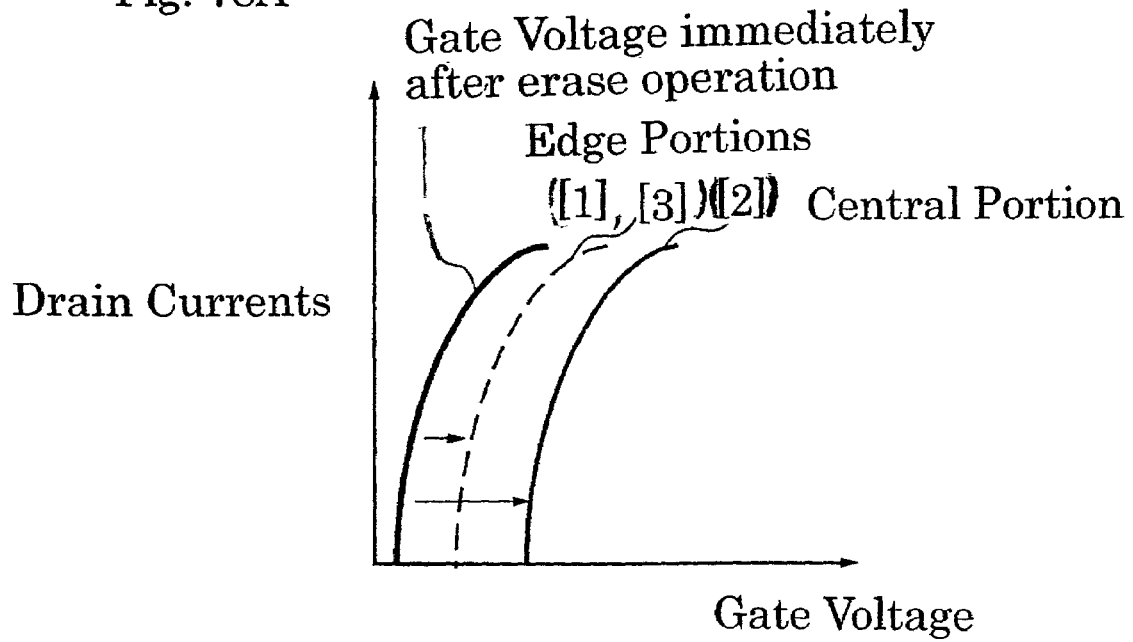
Fig. 78C

SEMICONDUCTOR DEVICE AND METHOD OF FABRICATING THE SAME

CROSS REFERENCE TO RELATED APPLICATIONS

This application is based upon and claims benefit of priority from the prior Japanese Patent Application No. 2001-29174, filed on Feb. 6, 2001 and Japanese Patent Application No. 2001-317620, filed on Oct. 16, 2001; the entire contents of which are incorporated herein by reference.

BACKGROUND OF THE INVENTION

1. Field of the Invention

The present invention relates to a semiconductor device, more specifically, to a minute semiconductor device requiring high-grade characteristics of a gate insulating film therein and a method of fabricating the same.

2. Description of the Related Art

A memory cell comprised of a so-called metal oxide nitride oxide semiconductor (hereinafter referred to as "MONOS": metal—silicon oxide film—silicon nitride film—silicon oxide film—semiconductor) is known as one type of electrically writable and erasable non-volatile semiconductor memory devices, which stores data by trapping electric charges inside a silicon nitride film. A MONOS memory is capable of writing and erasing operations with relatively low voltage compared with a floating-gate memory. In addition, the MONOS memory cell comprised of a single layer gate structure has a smaller aspect ratio of a gate in comparison with the floating-gate memory cell that requires a multilayer gate structure. Therefore, the MONOS memory cell has an advantage that it is suitable for miniaturizing of elements therein.

A cross section of a conventional MONOS memory cell prepared by local oxidation (LOCOS) isolation is illustrated in FIG. 94.

In FIG. 94, a tunnel insulating film 101 of a memory cell is formed on a semiconductor substrate 100, and an element isolation region 102 with a film thickness greater than that of the tunnel insulating film 101 is formed so as to sandwich the tunnel insulating film 101. On the surfaces of the element isolation region 102 and the tunnel insulating film 101, formed is a charge storing layer 103 made of a silicon nitride film. A barrier insulating film 104 is formed on the charge storing layer 103. Furthermore, a gate electrode 105 is formed on the barrier insulating film 104.

Incidentally, shallow trench isolation (STI) is becoming an important technology instead of the conventional LOCOS isolation as miniaturizing progresses. In particular, as an element isolation method suitable for floating-gate non-volatile memories, self-aligned STI is proposed ("A 0.67 $\mu m^2$ SELF-ALIGNED SHALLOW TRENCH ISOLATION CELL (SA-STI CELL) FOR 3V-only 256 Mbit NAND EEPROMs" IEDM Tech. Dig. 1994 pp 61–64). There, a gate insulating film formed under a floating gate is made in a thickness greater than other parts at an edge of a gate electrode. In the self-aligned STI, by forming element isolation trenches by self-alignment with respect to the floating gate, which is a charge storing layer, concentration of electric fields at the element isolation trenches attributable to penetrating of a part of the gate electrode into the element isolation edge is prevented. As a result, unevenness of cell characteristics can be improved whereby high reliability is achieved.

In FIG. 1 and FIG. 3(a) among others in Japanese Patent Publication No. 4-12573, disclosed is a structure of a MONOS non-volatile semiconductor memory device arranged to allow a gate insulating film in a region of an interface with a surrounding selective oxide film to reside entirely inside a trench in order to prevent a sidewalk phenomenon.

It should be further noted that FIG. 4 among others in Japanese Patent Publication No. 11-330277 discloses the fact that a non-volatile memory using an insulating film as a charge storing layer as in MONOS shows inferior read-disturb characteristics.

The following problems arise in the above-described conventional semiconductor device.

An oxide film is formed thick at an element isolation edge 106 attributable to an influence by thermal oxidation for forming an element isolation region, which results in deterioration of write operation and erase operation characteristics in that region. In other words, since the thickness of the insulating film grows large at the element isolation edge, electric fields thereabout are weakened and thresholds are thereby lowered.

Since electric charges are trapped in the silicon nitride film which is the insulating film in the MONOS structure, carriers do not move within the charge storing layer. For this reason, when a write pulse is supplied, only a channel edge is left low in a threshold. Such phenomenon is observed as a subthreshold leakage or a hump with respect to transistor characteristics. The phenomenon referred to as sidewalk is problematic in the MONOS memory cell because the phenomenon narrows a writing/erasing window thereof.

According to the above-mentioned Japanese Patent Publication No. 4-12573, a trench is provided in a semiconductor substrate and an insulating film is provided inside the trench. However, the thickness of the film is larger near an element isolation region thereof. Accordingly, control characteristics are deteriorated due to occurrence of concentration of electric fields thereabout.

BRIEF SUMMARY OF THE INVENTION

A feature of the present invention is a semiconductor device including: a semiconductor substrate; shallow trench isolation regions formed in trenches provided in the semiconductor substrate; a pair of source and drain regions formed in the semiconductor substrate, the pair of source and drain regions using a surface of the semiconductor substrate sandwiched therebetween as a channel; a gate insulating film formed on the semiconductor substrate, in which film thicknesses thereof at a central portion of the channel and at portions contacting with the shallow trench isolation regions are equal; and a gate electrode formed on the gate insulating film.

Another aspect of the present invention is a semiconductor device including: a semiconductor substrate; first shallow trench isolation regions formed in trenches provided in the semiconductor substrate; a first pair of source and drain regions formed in the semiconductor substrate, the first pair of source and drain regions using a surface of the semiconductor substrate sandwiched therebetween as a first channel; a first gate insulating film formed on the semiconductor substrate, in which film thicknesses thereof at a central portion of the first channel and at portions contacting with the first shallow trench isolation regions are equal; a first gate electrode formed on the first gate insulating film; second shallow trench isolation regions formed in trenches provided in the semiconductor substrate; a second pair of source and drain regions formed in the semiconductor substrate, the second pair of source and drain regions using a surface of the semiconductor substrate sandwiched therebetween as a second channel; a second gate insulating film formed on the semiconductor substrate, in which film thicknesses thereof at a central portion of the second channel and at portions contacting with the second shallow trench isolation regions are equal; and a second gate electrode formed on the second gate insulating film.

Another aspect of the present invention is a method of fabricating a semiconductor device, including: forming a gate insulating film on a semiconductor substrate; forming trenches in the semiconductor substrate after forming the gate insulating film; forming shallow trench isolation regions by filling the trenches with insulating materials; and forming a gate electrode on the gate insulating film and the shallow trench isolation regions.

Another aspect of the present invention is a method of fabricating a semiconductor device, including: forming a first insulating film on a semiconductor substrate; forming a second insulating film on the first insulating film; forming trenches in the second insulating film, the first insulating film and the semiconductor substrate; forming shallow trench isolation regions by filling the trenches with insulating materials; removing the second insulating film such that the shallow trench isolation regions protrude from an upper surface of the first insulating film; and forming a gate electrode on the first insulating film exposed and the shallow trench isolation regions.

Another aspect of the present invention is a method of fabricating a semiconductor device, including: forming a first gate insulating film on a semiconductor substrate at a memory section and at a peripheral circuit section, the first gate insulating film being comprised of a multilayer film including a silicon nitride film; forming trenches in the semiconductor substrate at the memory section and the peripheral circuit section after forming the first gate insulating film; forming shallow trench isolation regions by filling the trenches with insulating materials; forming a second gate insulating film at the peripheral circuit section by thermal oxidation after removing the silicon nitride film out of the first gate insulating film at the peripheral circuit section; and forming a gate electrode on the first gate insulating film, on the second insulating film and on the shallow trench isolation regions at the memory section and at the peripheral circuit section.

Another aspect of the present invention is a method of fabricating a semiconductor device, including: forming a first gate insulating film on a semiconductor substrate at a peripheral circuit section, which includes a high-withstand-voltage transistor region and a low-voltage transistor region, and at a memory section; removing the first gate insulating film in the low-voltage transistor region of the peripheral circuit section and at the memory section; forming a second gate insulating film over a surface of all constituents on the semiconductor substrate; forming trenches in the semiconductor substrate at the memory section and at the peripheral circuit section after forming the second gate insulating film; forming shallow trench isolation regions by filling the trenches with insulating materials; forming a low-voltage transistor gate insulating film and a high-withstand-voltage transistor gate insulating film at the peripheral circuit section by thermal oxidation, after removing the silicon nitride film out of the second gate insulating film at the peripheral circuit section; and forming a gate electrode on the gate insulating film at the memory section, on the low-voltage transistor gate insulating film, on the high-withstand-voltage transistor gate insulating film and on the shallow trench isolation regions.

Another aspect of the present invention is a method of fabricating a semiconductor device, including: forming a first gate insulating film on a semiconductor substrate at a memory section including a memory cell transistor region and a selective transistor region and at a peripheral circuit section including a low-voltage transistor region and a high-withstand-voltage transistor region; removing the first gate insulating film in the low-voltage transistor region of the peripheral circuit section and at the memory section; forming a second gate insulating film comprised of a multilayer film including a silicon nitride film; forming trenches in the semiconductor substrate at the memory section and at the peripheral circuit section after forming the second gate insulating film; forming shallow trench isolation regions by filling the trenches with insulating materials; forming a low-voltage transistor gate insulating film and a high-withstand-voltage transistor gate insulating film at the peripheral circuit section by thermal oxidation, after removing the silicon nitride film out of the second gate insulating film in the selective transistor region of the memory section and at the peripheral circuit section; and forming a gate electrode on the gate insulating film in the memory cell transistor region, on the gate insulating film in the selective transistor region, on the low-voltage transistor gate insulating film, on the high-withstand-voltage transistor gate insulating film and on the shallow trench isolation regions.

Another aspect of the present invention is a semiconductor device including; a semiconductor substrate; an element region of a first conductivity type formed in the semiconductor substrate, the element region having four sides substantially; a source electrode and a drain electrode formed on two opposing sides of the element region, respectively, the source electrode and the drain electrode being of a conductivity type reverse to the first conductivity type; a first gate insulating film provided on the element region; a charge storing region provided on the first gate insulating film, including an insulating film capable of storing data as well as electrically writable and erasable, the charge storing region having two edges on two sides without the source electrode and the drain electrode formed thereon; and at least one gate electrode provided on the charge storing region, the gate electrode being formed in a manner that distance of two opposing sides without formation of the source electrode and the drain electrode on a lower plane of the gate electrode is made shorter than distance between two edges on the two opposing sides on an upper plane of the charge storing region without formation of the source electrode and the drain electrode.

Another aspect of the present invention is a semiconductor device including: a semiconductor substrate; an element region of a first conductivity type formed in the semiconductor substrate, the element region having four sides substantially; a first gate insulating film provided on the element region; a source electrode and a drain electrode formed in the semiconductor substrate, the source electrode and the drain electrode being of a conductivity type reverse to the first conductivity type; a charge storing region provided on the first gate insulating film, the charge storing region including: an insulating film capable of storing data as well as electrically writable and erasable; two edges on two opposing sides; and in a state where at least the source electrode and the drain electrode are in a conductive state when a direction of currents flowing on the element region is defined as a first direction and a direction orthogonal to the first direction on the semiconductor substrate is defined as a second direction, two edges in the second direction on an upper plane of the charge storing region; at least one gate electrode provided on the charge storing region, the gate electrode being formed in a manner that lengths of two sides in the second direction on a lower plane of the gate electrode are made shorter than distance between the two edges of the charge storing region in the second direction on an upper plane of the charge storing region; and at least two current terminals connected to the source electrode and the drain electrode, respectively, to detect a state of data storage of the charge storing region depending on any one of a conductive state and an interrupted state between the source electrode and the drain electrode.

Another aspect of the present invention is a semiconductor device including: a semiconductor substrate; an element region formed in the semiconductor substrate; a first gate insulating film provided on the element region; at least one gate electrode; an element isolation region formed on the semiconductor substrate, the element isolation region abutting on at least a part of the gate electrode; and a charge storing region provided on the first gate insulating film, the charge storing region including an insulating film capable of storing data as well as electrically writable and erasable and having an edge positioned in the element isolation region.

Another aspect of the present invention is a semiconductor device including: a semiconductor substrate; an element region of a first conductivity type formed on the semiconductor substrate, the element region having four sides substantially; a first gate insulating film formed on the element region; a charge storing region formed on the first gate insulating film, having an insulating film capable of storing data as well as electrically writable and erasable; at least one gate electrode provided on the charge storing region; a source electrode and a drain electrode of a conductivity type reverse to the first conductivity type, the electrodes being formed on two opposing sides of the element region, respectively; and a second gate insulating film disposed between the charge storing region and the gate electrode, the second gate insulating film being formed thicker at a portion of the second gate insulating film under edges of the gate electrode than a portion of the second gate insulating film under a central portion of the gate electrode facing the charge storing region, regarding two sides of the second gate insulating film without formation of the gate electrode and the drain electrode.

Another aspect of the present invention is a semiconductor device including: a semiconductor substrate; an element region of a first conductivity type formed on the semiconductor substrate, the element region having four sides substantially; a first gate insulating film provided on the element region; a charge storing region provided on the first gate insulating film, the charge storing region being comprised of an insulating film capable of storing data as well as writable and erasable and having two edges on two opposing sides; at least one gate electrode provided on the charge storing region; a source electrode and a drain electrode of a conductivity type reverse to the first conductivity type, the electrodes being provided in the semiconductor substrate; current terminals provided in the source electrode and the drain electrode, respectively, for detecting a state of storage of the charge storing region depending on any one of a conductive state and an interrupted state between the source electrode and the drain electrode; and a second gate insulating film disposed between the charge storing region and the gate electrode, in a case where a direction of currents flowing at least between the current terminals in a conductive state is defined as a first direction and a direction perpendicular to the first direction on the semiconductor substrate is defined as a second direction, a thickness of portions of the second gate insulating film under edges of the gate electrode in the second direction being thicker than a thickness of the second gate insulating film in the second direction under a central portion of the gate electrode facing the charge storing region.

BRIEF DESCRIPTION OF THE DRAWINGS

The accompanying drawings, which are incorporated in and constitute a part of the specification, illustrate presently embodiments of the invention, and together with the general description given above and the detailed description of the invention given below, serve to explain the principles of the invention.

FIG. 1 is a cross-sectional view in a row direction, showing a constitution of a memory section according to a first embodiment of the present invention.

FIG. 2 is a cross-sectional view in the row direction, showing a constitution of a memory section of a prototype of the first embodiment.

FIG. 17A is a cross-sectional view in the row direction, showing one step of the method of fabricating the memory cell transistor and the selective transistor of the first embodiment; FIG. 17B is a cross-sectional view in the row direction, showing one step of the method of fabricating the low-voltage transistor of the first embodiment; and FIG. 17C is a cross-sectional view in the row direction, showing one step of the method of fabricating the high-withstand-voltage transistor of the first embodiment.

FIG. 18A is a cross-sectional view in the row direction, showing one step of the method of fabricating the memory cell transistor and the selective transistor of the first embodiment; FIG. 18B is a cross-sectional view in the row direction, showing one step of the method of fabricating the low-voltage transistor of the first embodiment; and FIG. 18C is a cross-sectional view in the row direction, showing one step of the method of fabricating the high-withstand-voltage transistor of the first embodiment.

FIG. 19A is a cross-sectional view in the row direction, showing one step of the method of fabricating the memory cell transistor and the selective transistor of the first embodiment; FIG. 19B is a cross-sectional view in the row direction, showing one step of the method of fabricating the low-voltage transistor of the first embodiment; and FIG. 19C is a cross-sectional view in the row direction, showing one step of the method of fabricating the high-withstand-voltage transistor of the first embodiment.

FIG. 23A is a cross-sectional view in the row direction, showing one step of the method of fabricating the memory cell transistor and the selective transistor of the first embodiment; FIG. 23B is a cross-sectional view in the row direction, showing one step of the method of fabricating the low-voltage transistor of the first embodiment; and FIG. 23C is a cross-sectional view in the row direction, showing one step of the method of fabricating the high-withstand-voltage transistor of the first embodiment.

FIG. 24A is a cross-sectional view in the row direction, showing one step of the method of fabricating the memory cell transistor and the selective transistor of the first embodiment; FIG. 24B is a cross-sectional view in the row direction, showing one step of the method of fabricating the low-voltage transistor of the first embodiment; and FIG. 24C is a cross-sectional view in the row direction, showing one step of the method of fabricating the high-withstand-voltage transistor of the first embodiment.

FIG. 25A is a cross-sectional view in the row direction, showing one step of the method of fabricating the memory cell transistor and the selective transistor of the first embodiment; FIG. 25B is a cross-sectional view in the row direction, showing one step of the method of fabricating the low-voltage transistor of the first embodiment; and FIG. 25C is a cross-sectional view in the row direction, showing one step of the method of fabricating the high-withstand-voltage transistor of the first embodiment.

FIG. 33A is an equivalent circuit diagram corresponding to the cross section of FIG. 32B relevant to the third embodiment; FIG. 33B is an equivalent circuit diagram corresponding to the cross section of FIG. 32C relevant to the third embodiment; FIG. 33C is an equivalent circuit diagram showing simplification of FIG. 33A; and FIG. 33D is an equivalent circuit diagram showing simplification of FIG. 33B.

FIG. 34 is an enlarged cross-sectional view of a part of FIG. 32C which is the cross-sectional view of the semiconductor device according to the third embodiment.

FIG. 35A is a cross-sectional view showing one step of a method of fabricating the semiconductor device according to the third embodiment, corresponding to a cross section taken along the "I-J" line of FIG. 32A; and FIG. 35B is a cross-sectional view showing one step of the method of fabricating the semiconductor device according to the third embodiment, corresponding to a cross section taken along the "G-H" line of FIG. 32A.

FIG. 36A is a cross-sectional view showing one step of the method of fabricating the semiconductor device according to the third embodiment, corresponding to the cross section taken along the "I-J" line of FIG. 32A; and FIG. 36B is a cross-sectional view showing one step of the method of fabricating the semiconductor device according to the third embodiment, corresponding to the cross section taken along the "G-H" line of FIG. 32A.

FIG. 37A is a cross-sectional view showing one step of the method of fabricating the semiconductor device according to the third embodiment, corresponding to the cross section taken along the "I-J" line of FIG. 32A; and FIG. 37B is a cross-sectional view showing one step of the method of fabricating the semiconductor device according to the third embodiment, corresponding to the cross section taken along the "G-H" line of FIG. 32A.

FIG. 41A is a cross-sectional view showing one step of the method of fabricating the semiconductor device according to the third embodiment, corresponding to the cross section taken along the "I-J" line of FIG. 32A; and FIG. 41B is a cross-sectional view showing one step of the method of fabricating the semiconductor device according to the third embodiment, corresponding to the cross section taken along the "G-H" line of FIG. 32A.

FIG. 42A is a cross-sectional view showing one step of the method of fabricating the semiconductor device according to the third embodiment, corresponding to the cross section taken along the "I-J" line of FIG. 32A; and FIG. 42B is a cross-sectional view showing one step of the method of fabricating the semiconductor device according to the third embodiment, corresponding to the cross section taken along the "G-H" line of FIG. 32A.

FIG. 43A is a cross-sectional view showing one step of the method of fabricating the semiconductor device according to the third embodiment, corresponding to the cross section taken along the "I-J" line of FIG. 32A; and FIG. 43B is a cross-sectional view showing one step of the method of fabricating the semiconductor device according to the third embodiment, corresponding to the cross section taken along the "G-H" line of FIG. 32A.

FIG. 53A is an equivalent circuit diagram corresponding to the cross section of FIG. 52B relevant to the fourth embodiment; FIG. 53B is an equivalent circuit diagram showing simplification of FIG. 53A; FIG. 53C is an equivalent circuit diagram corresponding to the cross section of FIG. 52C relevant to the third embodiment; and FIG. 53D is an equivalent circuit diagram showing simplification of FIG. 53C.

FIG. 54A is a cross-sectional view showing one step of a method of fabricating the semiconductor device according to the fourth embodiment, corresponding to a cross section taken along the "Q-R" line of FIG. 52A; and FIG. 54B is a cross-sectional view showing one step of a method of fabricating the semiconductor device according to the fourth embodiment, corresponding to a cross section taken along the "O-P" line of FIG. 52A.

FIG. 55A is a cross-sectional view showing one step of the method of fabricating the semiconductor device according to the fourth embodiment, corresponding to the cross section taken along the "Q-R" line of FIG. 52A; and FIG. 55B is a cross-sectional view showing one step of the method of fabricating the semiconductor device according to the fourth embodiment, corresponding to the cross section taken along the "O-P" line of FIG. 52A.

FIG. 56A is a cross-sectional view showing one step of the method of fabricating the semiconductor device according to the fourth embodiment, corresponding to the cross section taken along the "Q-R" line of FIG. 52A; and FIG. 56B is a cross-sectional view showing one step of the method of fabricating the semiconductor device according to the fourth embodiment, corresponding to the cross section taken along the "O-P" line of FIG. 52A.

FIG. 57A is a cross-sectional view showing one step of the method of fabricating the semiconductor device according to the fourth embodiment, corresponding to the cross section taken along the "Q-R" line of FIG. 52A; and FIG. 57B is a cross-sectional view showing one step of the method of fabricating the semiconductor device according to the fourth embodiment, corresponding to the cross section taken along the "O-P" line of FIG. 52A.

FIG. 65A is an equivalent circuit diagram corresponding to the cross section of FIG. 64B relevant to the semiconductor device of the fifth embodiment; FIG. 64B is an equivalent circuit diagram corresponding to the cross section of FIG. 64C relevant to the semiconductor device of the fifth embodiment; and FIG. 65C is a graph showing characteristics between drain currents and gate voltage of the semiconductor device of the fifth embodiment.

FIG. 71A is a cross-sectional view showing one step of the method of fabricating the semiconductor device according to the fifth embodiment, corresponding to the cross section taken along the "S-T" line of FIG. 64A; and FIG. 71B is a cross-sectional view showing one step of the method of fabricating the semiconductor device according to the fifth embodiment, corresponding to the cross section taken along the "U-V" line of FIG. 64A.

FIG. 72A is a cross-sectional view showing one step of the method of fabricating the semiconductor device according to the fifth embodiment, corresponding to the cross section taken along the "S-T" line of FIG. 64A; and FIG. 72B is a cross-sectional view showing one step of the method of fabricating the semiconductor device according to the fifth embodiment, corresponding to the cross section taken along the "U-V" line of FIG. 64A.

FIG. 73A is a cross-sectional view showing one step of the method of fabricating the semiconductor device according to the fifth embodiment, corresponding to the cross section taken along the "S-T" line of FIG. 64A; and FIG. 73B is a cross-sectional view showing one step of the method of fabricating the semiconductor device according to the fifth embodiment, corresponding to the cross section taken along the "U-V" line of FIG. 64A.

FIG. 74A is a cross-sectional view showing one step of the method of fabricating the semiconductor device according to the fifth embodiment, corresponding to the cross section taken along the "S-T" line of FIG. 64A; and FIG. 74B is a cross-sectional view showing one step of the method of fabricating the semiconductor device according to the fifth embodiment, corresponding to the cross section taken along the "U-V" line of FIG. 64A.

FIG. 75A is a cross-sectional view showing one step of the method of fabricating the semiconductor device according to the fifth embodiment, corresponding to the cross section taken along the "S-T" line of FIG. 64A; and FIG. 75B is a cross-sectional view showing one step of the method of fabricating the semiconductor device according to the fifth embodiment, corresponding to the cross section taken along the "U-V" line of FIG. 64A.

FIG. 76A is a cross-sectional view showing one step of the method of fabricating the semiconductor device according to the fifth embodiment, corresponding to the cross section taken along the "S-T" line of FIG. 64A; and FIG. 76B is a cross-sectional view showing one step of the method of fabricating the semiconductor device according to the fifth embodiment, corresponding to the cross section taken along the "U-V" line of FIG. 64A.

FIG. 78A is an equivalent circuit diagram corresponding to the cross section of FIG. 77B relevant to the semiconductor device of the sixth embodiment; FIG. 78B is an equivalent circuit diagram corresponding to the cross section of FIG. 77C relevant to the semiconductor device of the sixth embodiment; and FIG. 78C is a graph showing characteristics between drain currents and gate voltage of the semiconductor device of the sixth embodiment.

Figure 77A:
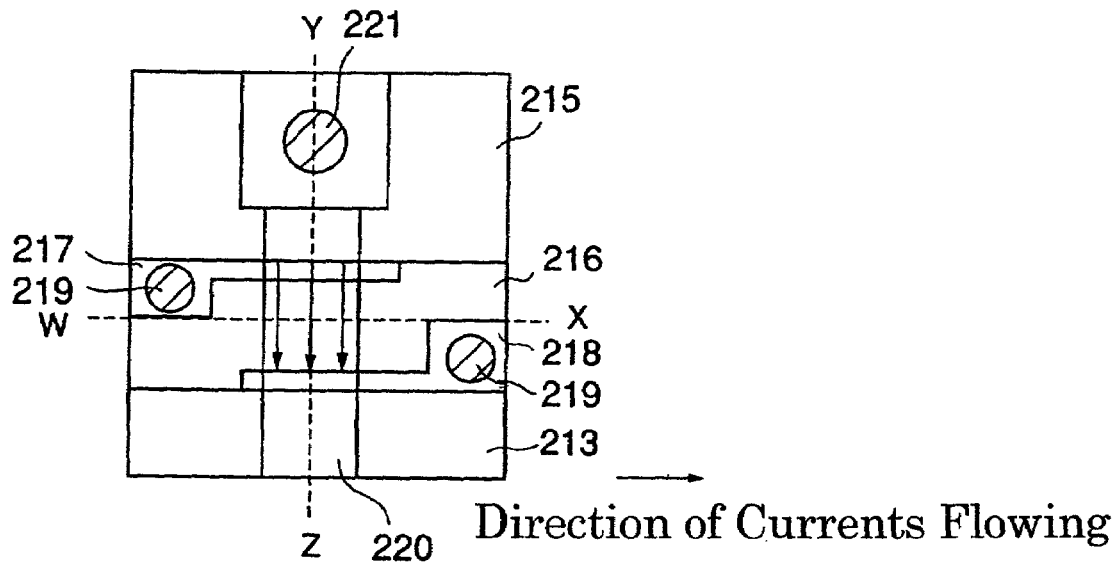
FIG. 77A is a top plan view of a semiconductor device of a sixth embodiment.

86B is a cross-sectional view showing one step of the method of fabricating the semiconductor device according to the sixth embodiment, corresponding to the cross section taken along the "W-X" line of FIG. 77A.

Figure 87A:
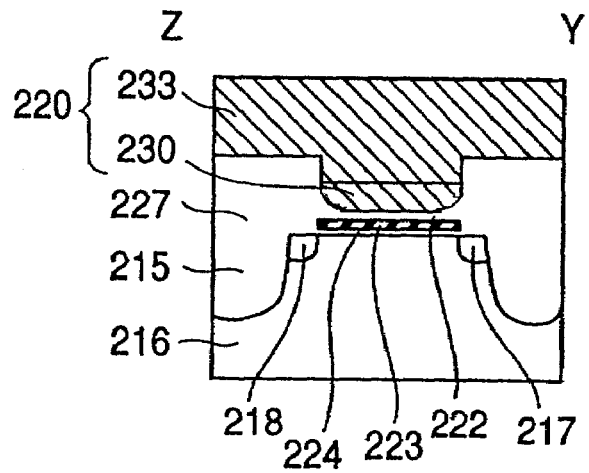
Figure 87B:
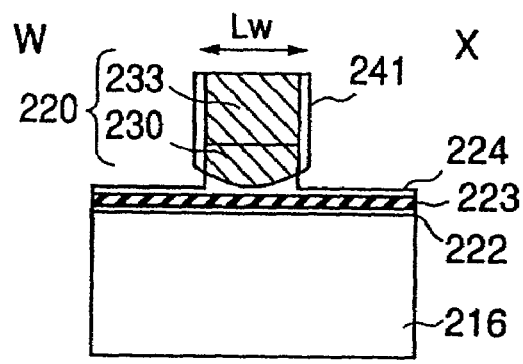

FIG. 87A is a cross-sectional view showing one step of the method of fabricating the semiconductor device according to the sixth embodiment, corresponding to the cross section taken along the "Y-Z" line of FIG. 77A; and FIG. 87B is a cross-sectional view showing one step of the method of fabricating the semiconductor device according to the sixth embodiment, corresponding to the cross section taken along the "W-X" line of FIG. 77A.

Figure 88A:
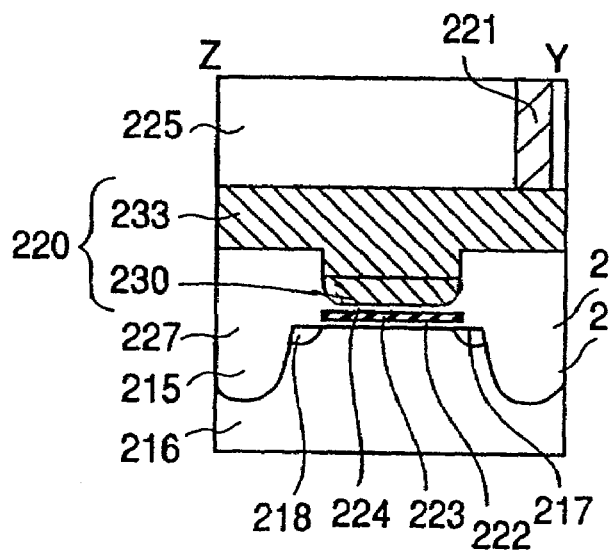
Figure 88B:
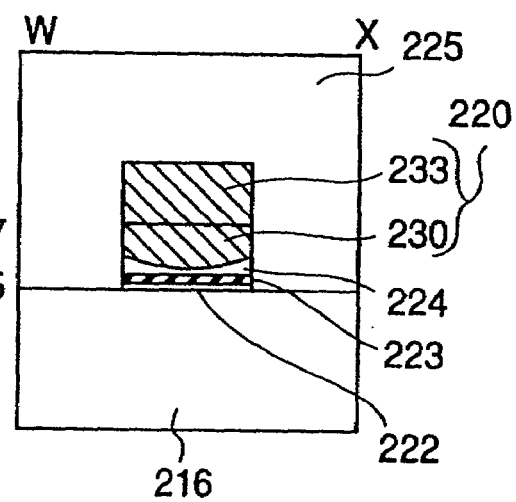

FIG. 88A is a cross-sectional view showing one step of the method of fabricating the semiconductor device according to the sixth embodiment, corresponding to the cross section taken along the "Y-Z" line of FIG. 77A; and FIG. 88B is a cross-sectional view showing one step of the method of fabricating the semiconductor device according to the sixth embodiment, corresponding to the cross section taken along the "W-X" line of FIG. 77A.

Figure 89:
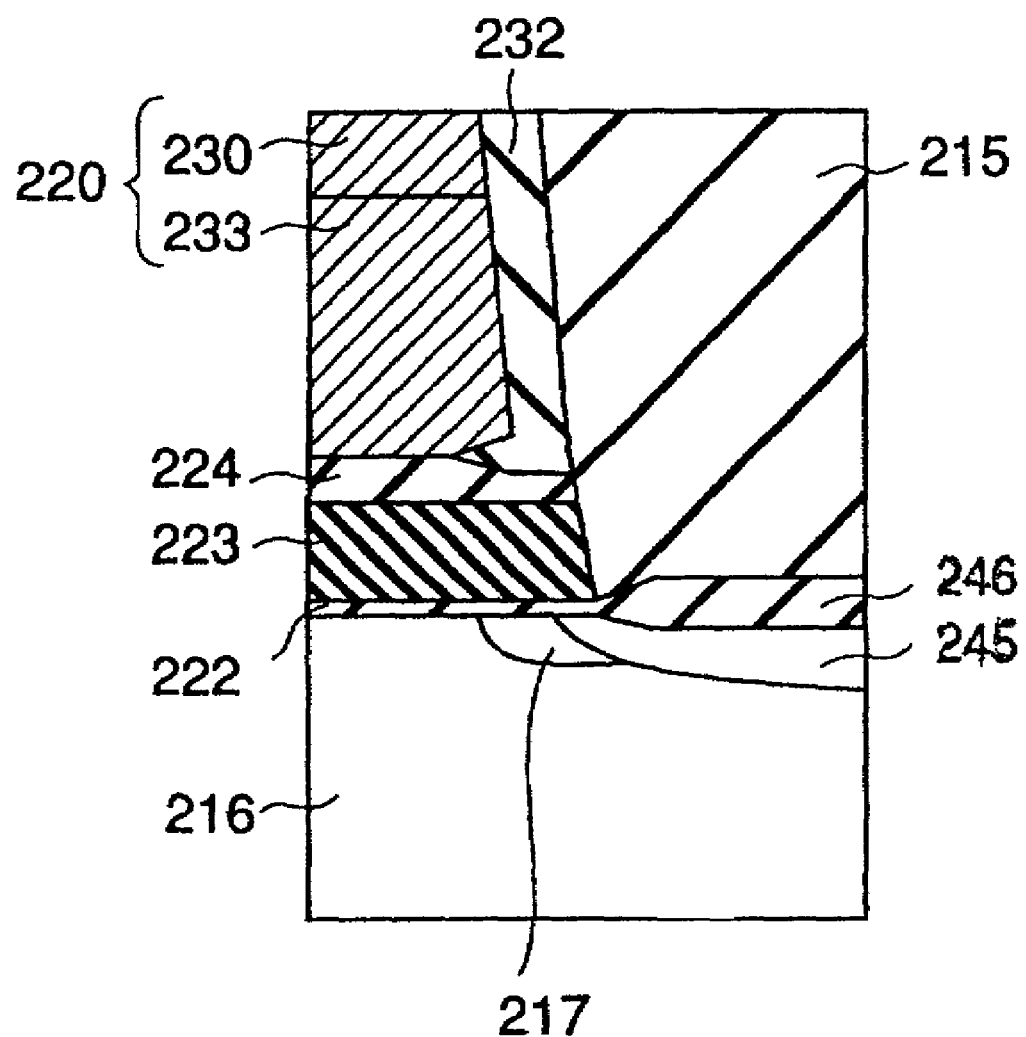

FIG. 89 is a cross-sectional view showing a semiconductor device according to a modified example of the sixth embodiment, corresponding to a part of a cross section taken along the "Y-Z" line of FIG. 77A.

Figure 90A:
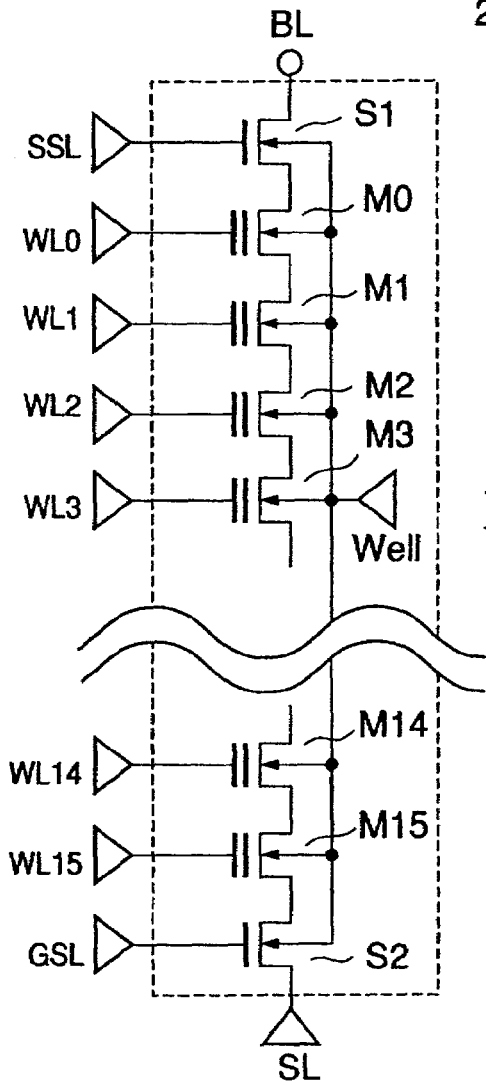
Figure 90B:
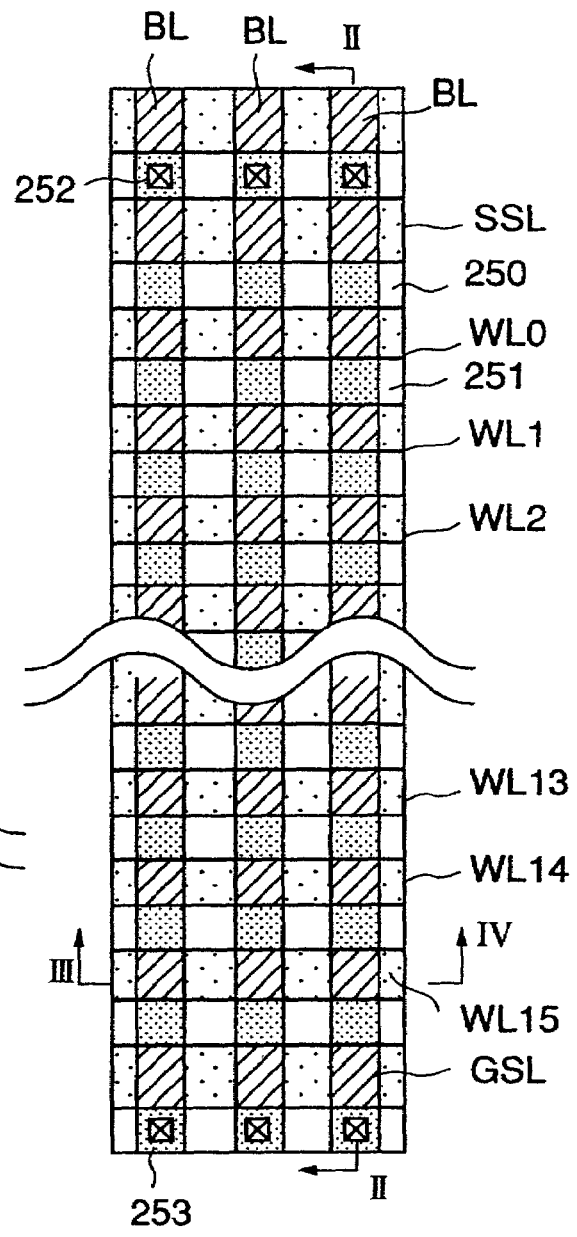

FIG. 90A is a circuit diagram showing one memory cell in a semiconductor device of a seventh embodiment, and FIG. 90B is a top plan view showing a structure of the memory cell in the semiconductor device of the seventh embodiment.

Figures 91A, 91B:
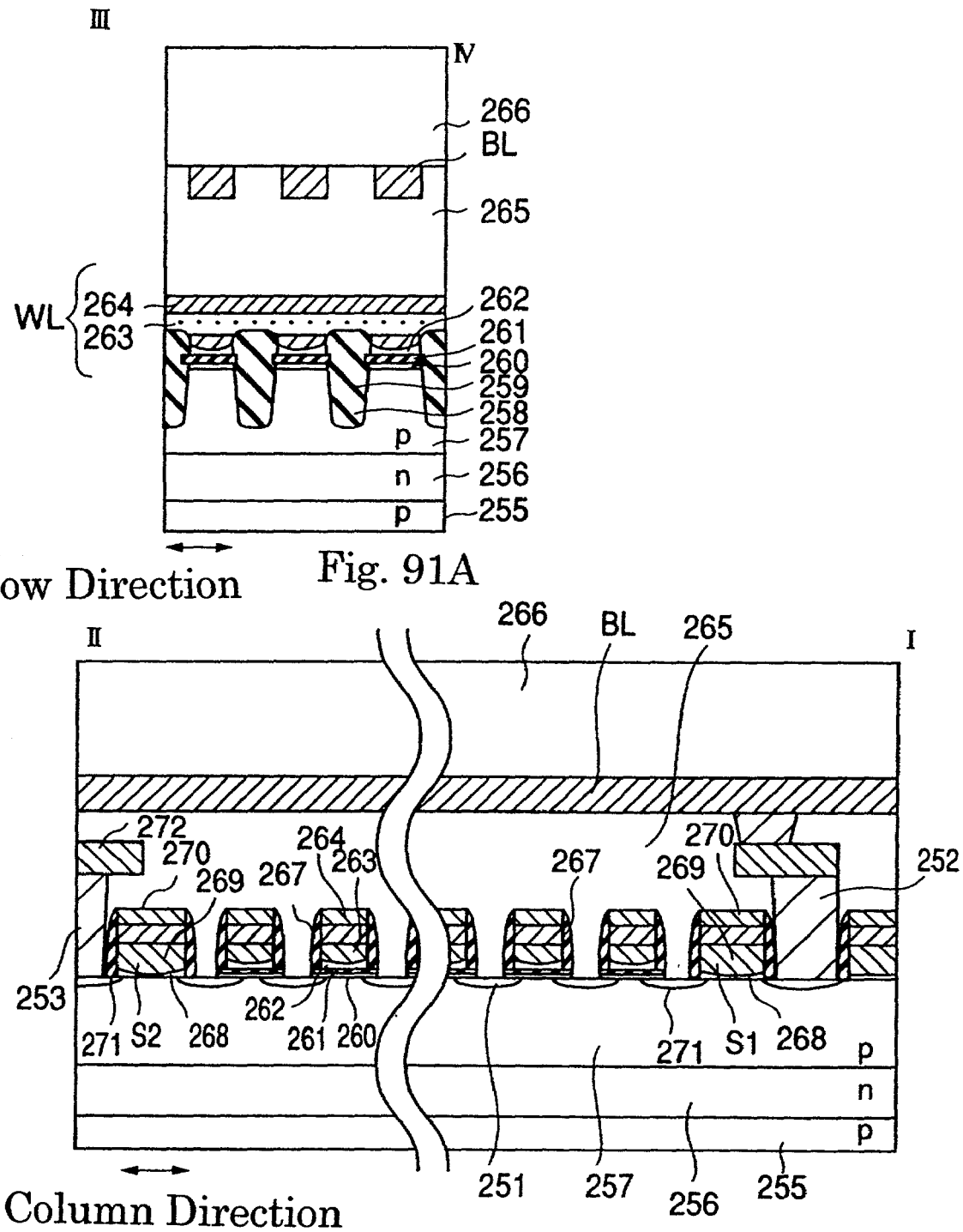

FIG. 91A is a cross-sectional view of the semiconductor device of the seventh embodiment, corresponding to a cross section taken along the "III-IV" line of FIG. 90B; and FIG. 91B is a cross-sectional view of the semiconductor device of the seventh embodiment, corresponding to a cross section taken along the "I-II" line of FIG. 90B.

Figure 92:
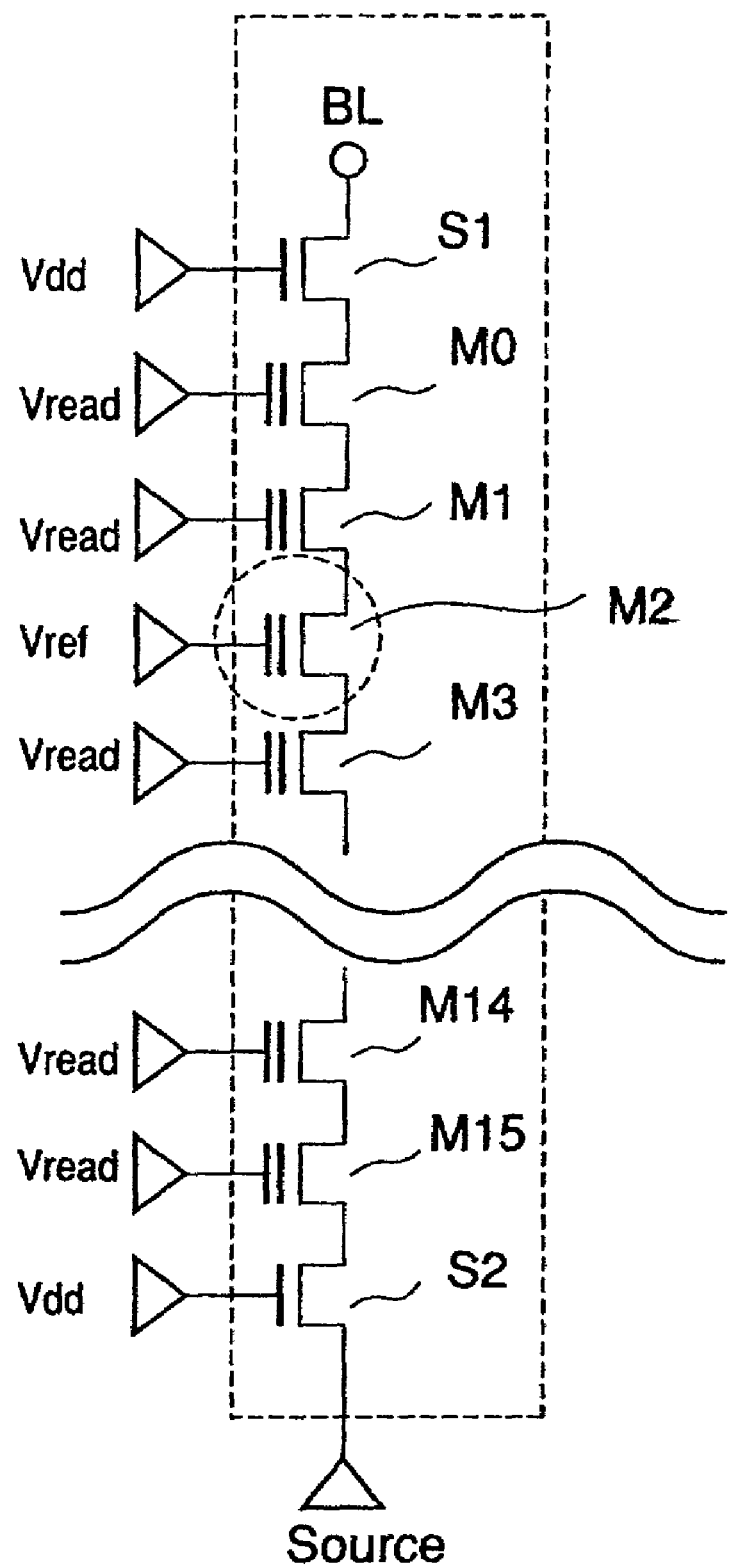

FIG. 92 is a circuit diagram showing a reading mode of one memory cell in the semiconductor device of the seventh embodiment.

Figures 93A, 93B:
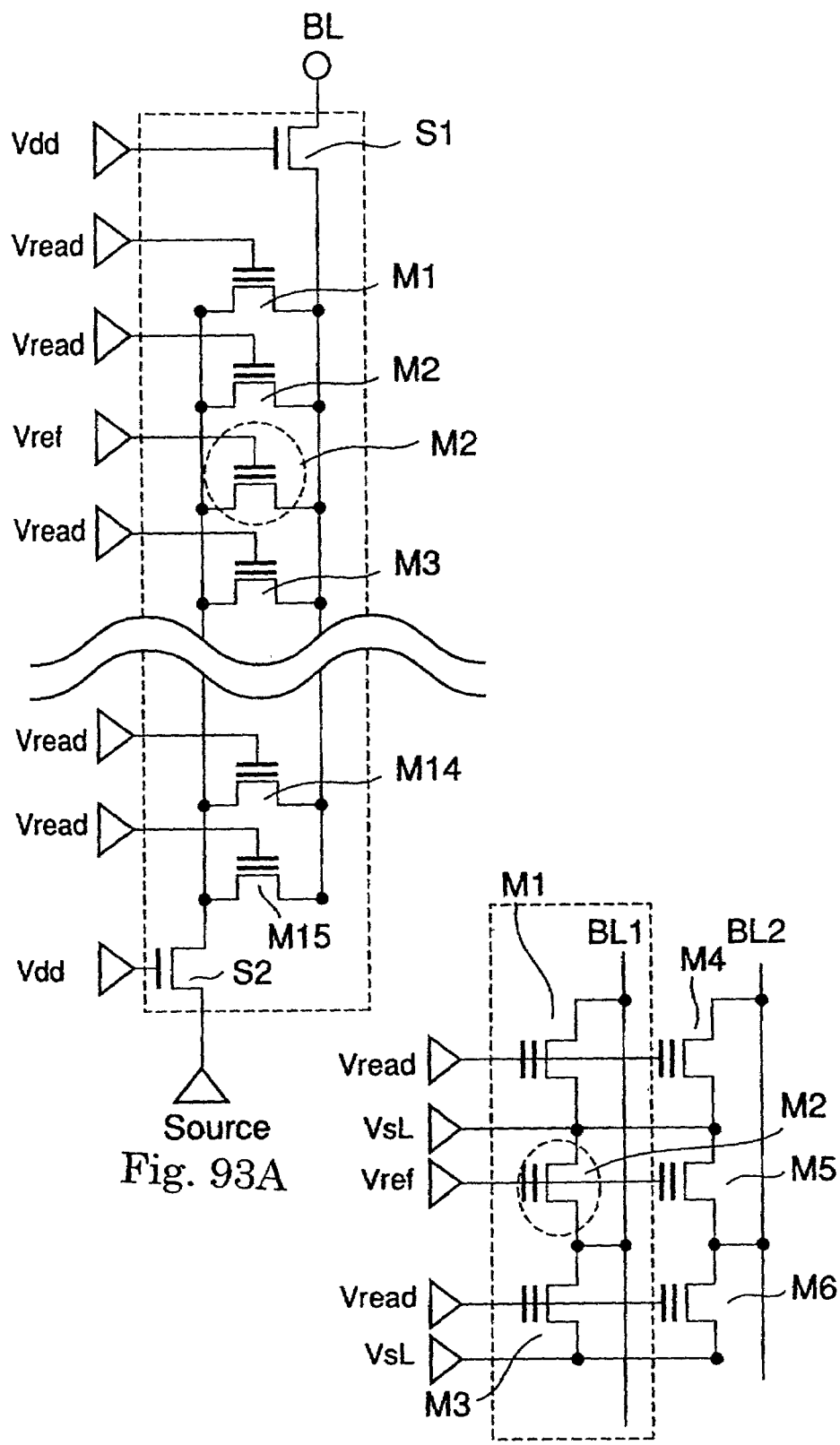

FIG. 93A is a circuit diagram showing a read operation mode of one memory cell in an AND-type EEPROM which is a modified example of the seventh embodiment, and FIG. 93B is a circuit diagram showing a read operation mode of a memory cell in a NOR-type EEPROM which is another modified example of the seventh embodiment.

Figure 94:
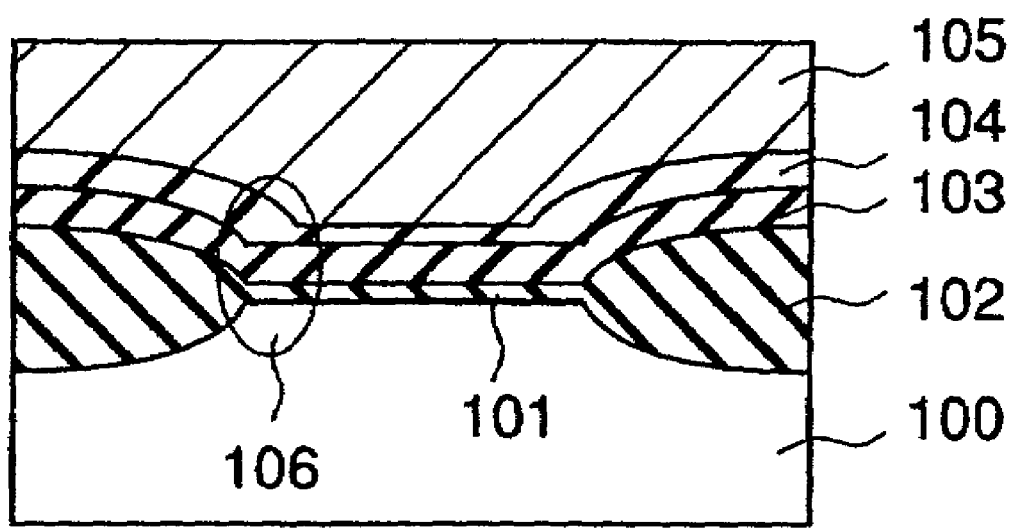

FIG. 94 is a cross-sectional view of a conventional MONOS (metal-silicon oxide film-silicon nitride film-silicon oxide film-semiconductor) memory cell using shallow trench isolation formed by a selective thermal oxidation method.

DETAILED DESCRIPTION OF THE INVENTION

Now, embodiments of the present invention will be described with reference to the accompanying drawings. Concerning the description in the drawings, identical or similar parts are denoted by identical or similar marks. Nevertheless, it should be noted that the drawings are schematic; accordingly, relations between thicknesses and plane dimensions, ratios of thicknesses of respective layers or the like are different from reality. Therefore, the concrete thicknesses or the dimensions should be judged with reference to the description hereunder. It should be further noted that the drawings also include portions that are different in the relations of dimensions or the ratios from one another.

FIRST EMBODIMENT

A prototype in the case of forming a MONOS cell of a floating-gate flash memory by a self-aligned shallow trench isolation (hereinafter referred to as "SA-STI") process is illustrated in FIG. 2.

Here, a plurality of shallow trench isolation regions 2 are formed on a semiconductor substrate 1. A tunnel insulating film 3 made of a silicon oxide film is formed in the vicinity of a surface of the semiconductor substrate between two adjacent shallow trench isolation regions 2. A charge storing layer 4 made of a silicon nitride film is formed on the tunnel insulating film 3. A block insulating film 5 made of a silicon oxide film is formed on the charge storing layer 4. This block insulating film 5 is integrated with the shallow trench isolation regions 2 of the same material. A gate electrode 6 is formed on the block insulating film 5 and the shallow trench isolation regions 2.

In this case, a portion of the gate electrode 6 sandwiched by the shallow trench isolation regions 2 is first formed, then after formation of the shallow trench isolation regions 2, the gate electrode 6 is additionally formed on the shallow trench isolation regions 2. That is, although the gate electrode seems one item, the gate electrode is formed by different steps depending on location thereof. Accordingly, a gate insulating film includes a natural oxide film.

Adoption of such a structure can improve a sidewalk phenomenon in comparison with a MONOS using LOCOS isolation. Moreover, since the charge storing layer 4 is not formed on the shallow trench isolation regions 2, data loss that has been conventionally caused owing to movement of electric charges to an adjacent cell via the charge storing layer 4 on the element isolation regions can be prevented.

Figure 3:
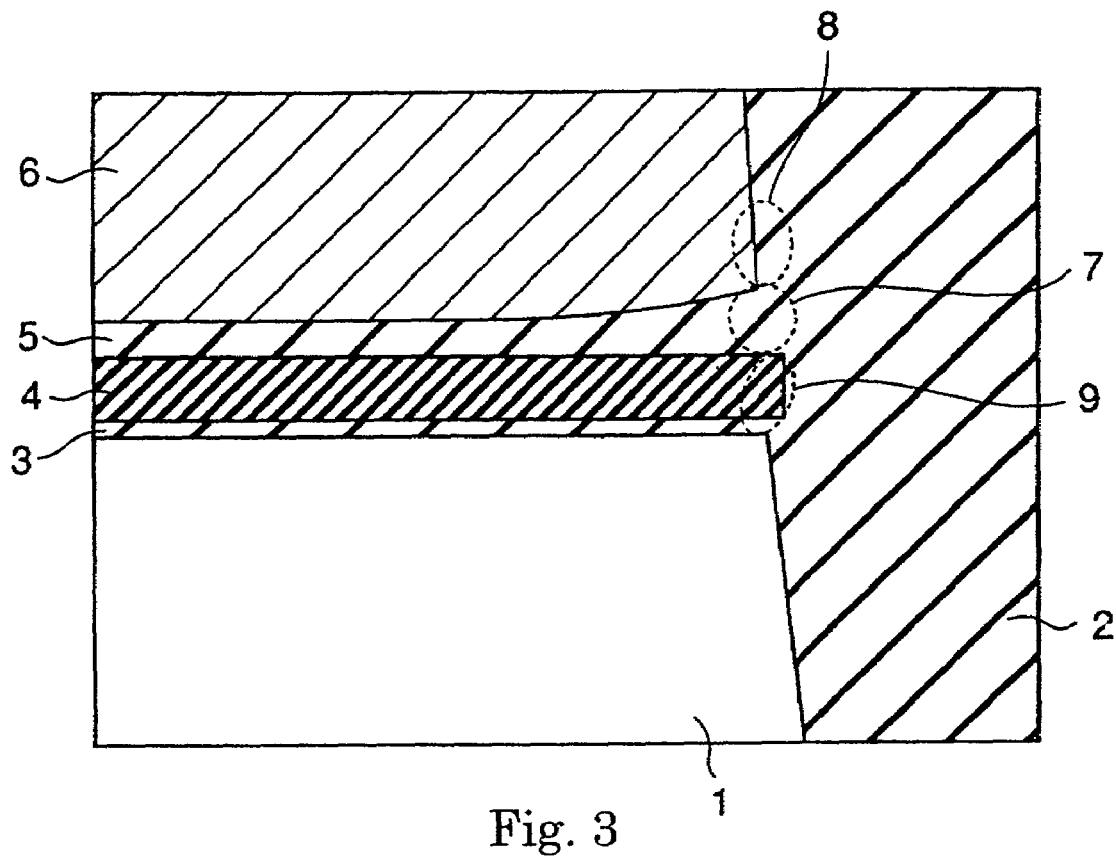
FIG. 3 is an enlarged view of an edge portion of a shallow trench isolation region in the row direction of the memory section of the prototype of the first embodiment.

In the case of using the SA-STI as described above, there is almost no thickening of gate edges (edges of the gate electrode 6 sandwiched by the shallow trench isolation regions 2) of the tunnel insulating film 3. However, when a surface of the semiconductor is subjected to oxidation for recovery from defects after formation of the trenches, a bird's beak appears on polycrystalline silicon that constitutes the gate electrode 6, whereby the block insulating film 5 is thickened at edges of the shallow trench isolation regions and a bird's beak 7 is resultantly caused. Specifically, an enlarged view of a contacting portion of the shallow trench isolation region 2 with the gate electrode 6 is illustrated in FIG. 3.

In addition, as the polycrystalline silicon constituting the gate electrode 6 recedes due to oxidation, a protrusion 8 of the shallow trench isolation region 2 is formed. As described above, the charge storing layer protrudes out from the gate electrode 6 extending over the width of the gate electrode 6 sandwiched by the shallow trench isolation regions 2, whereby the charge storing layer has a greater length according to the cross section in FIG. 2 and a protrusion 9 is formed as shown therein.

Here, since electric fields adequate for writing/erasing are not applied to the protrusion 9 in FIG. 2 from the gate electrode 6 upon application of voltage to the gate electrode 6, a threshold in such a region 9 can not be controlled.

Figure 4:
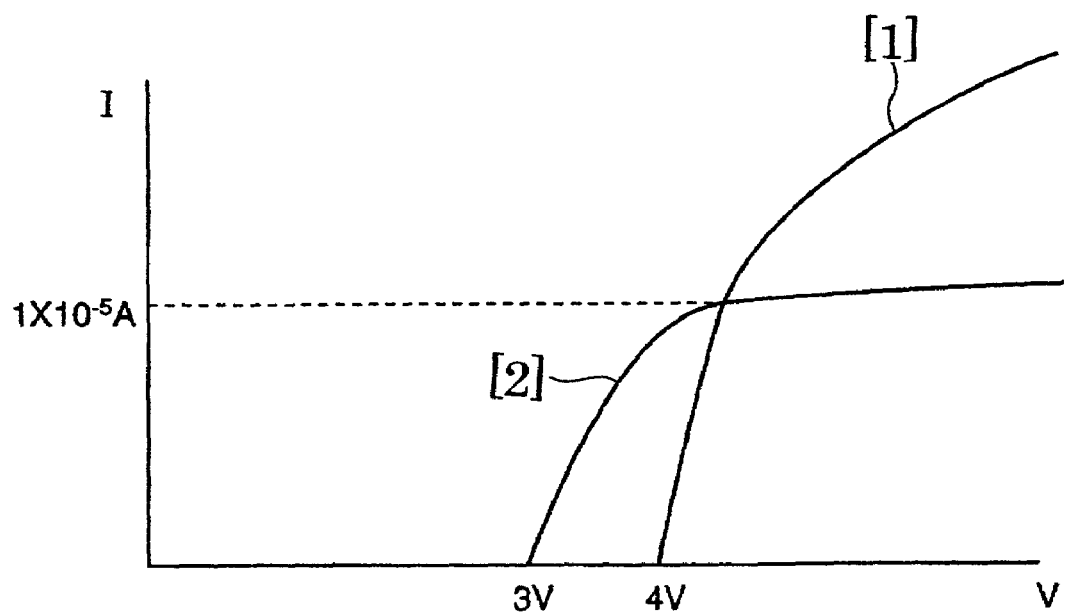
FIG. 4 is a graph showing voltage-current characteristics in a write operation mode for respective regions of a memory cell transistor of the prototype of the first embodiment.
Figure 5:
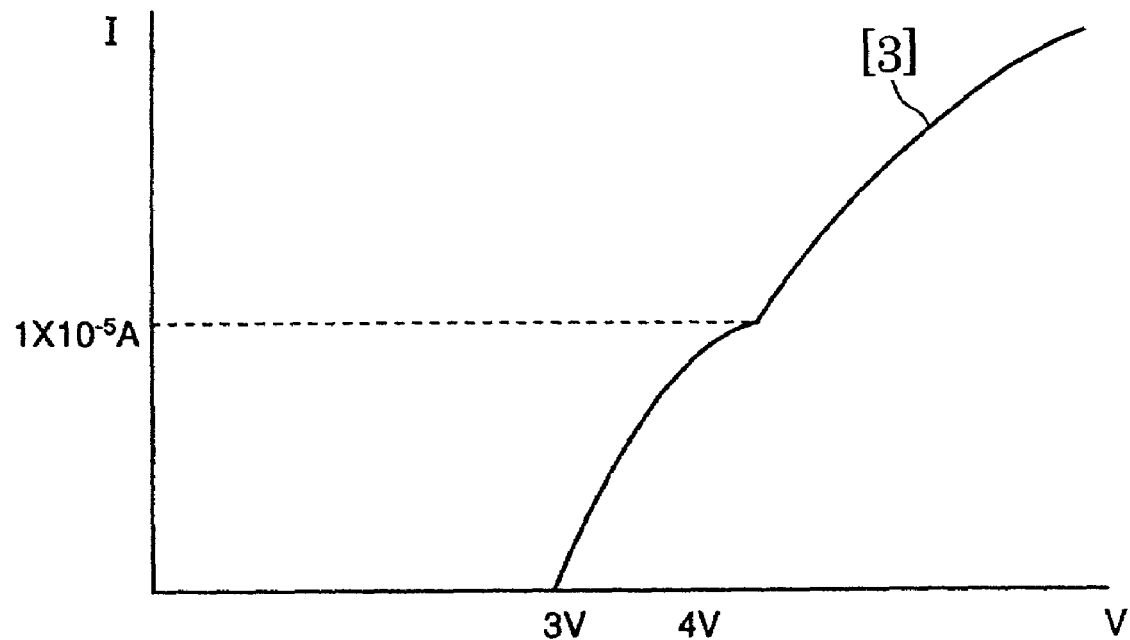
FIG. 5 is another graph showing the voltage-current characteristics in the write operation mode of the memory cell transistor of the prototype of the first embodiment.

Specifically, subthreshold characteristics in a writing mode of a cell of a semiconductor memory device are illustrated in FIG. 4. A reference numeral [1] denotes the characteristic at a central portion of a channel thereof, and the characteristic at a channel edge (an interface with the element isolation region) as denoted by a reference numeral [2] has a feature that a threshold for writing is lower than that of the central portion. This is attributable to a decrease in a current for writing caused by abatement of electric fields for writing owing to thickening of the gate insulating film at the edges. The subthreshold characteristics of the cell as a whole become one having a hump in a low-voltage portion thereof, as denoted by a reference numeral [3] in FIG. 5.

Figure 6:
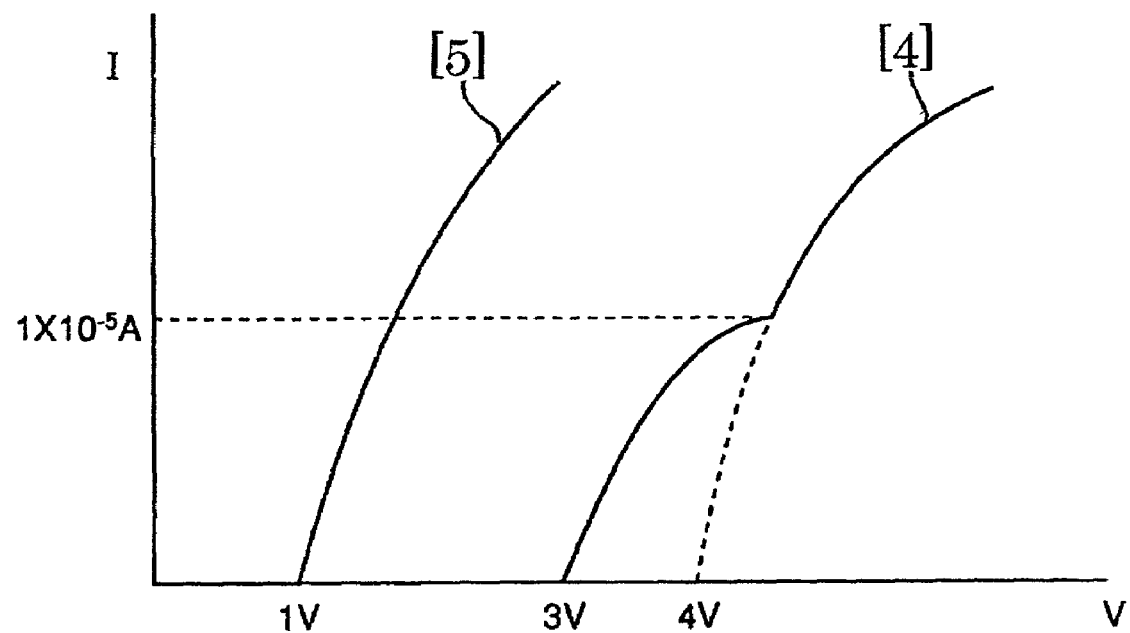
FIG. 6 is a graph showing voltage-current characteristics in a write operation mode and an erase operation mode of the memory cell transistor of the prototype of the first embodiment.

Subthreshold characteristics in both the writing operation mode and an erase operation mode are plotted in FIG. 6. The characteristic in the write operation mode is denoted by a reference numeral [4] and the characteristic in the erase operation mode is denoted by a reference numeral [5]. Since a threshold at the channel edge is higher than a threshold at the central portion of the channel in the erase operation mode, the characteristic at the channel edge does not affect the characteristic of the cell as a whole. Eventually, an influence of a decrease of sidewalk in the cell characteristics emerges as deterioration of write operation characteristics.

An embodiment for resolving such a problem in the prototype using the SA-STI process will be described in the following.

FIG. 1 is a cross-sectional view in the row direction of a memory cell transistor and a selective transistor in a memory section of a semiconductor device of this embodiment. A tunnel insulating film 10 made of a silicon oxide film or a silicon oxynitride film is formed on a semiconductor substrate 1 in a film thickness from about 0.5 nm to 5 nm, for example. Here, a well of a conductivity type reverse to the semiconductor substrate may be formed within the semiconductor substrate 1 in the vicinity of a surface thereof. Furthermore, another well of the same conductivity type as the semiconductor substrate may be formed on the well of the reverse conductivity type and so on. Formed on the tunnel insulating film 10 is a charge storing layer 11 in a thickness, for example, from about 3 nm to 30 nm, which is made of a silicon nitride film, a silicon oxynitride film, or other insulating films such as $Ta_2O_5$, $TiO_2$ or $Al_2O_3$. A block insulating film 12 made of a silicon oxide film or a silicon oxynitride film is formed in a film thickness from about 1 nm to 20 nm, for example, on the charge storing layer 11.

The tunnel insulating film 10, the charge storing layer 11 and the block insulating film 12 are separated one another by shallow trench isolation regions 13 made of a silicon oxide film in a depth from about 20 nm to 500 nm, for example. On the shallow trench isolation regions 13 and the block insulating film 12, formed are a first gate electrode 14 of the memory cell, made of polycrystalline silicon, for example, and a second gate electrode 15 made of, for example, polycide or metal in a film thickness from about 5 nm to 500 nm. Here, as for the polycide, WSi, NiSi, MOSi, TiSi, CoSi or the like is applicable.

Formed on the second gate electrode 15 is a gate cap insulating film 16 made of a silicon nitride film or the like. Formed on the gate cap insulating film 16 is a barrier insulating film 31 made of a silicon nitride film or the like. An interlayer film 17 is formed on the barrier insulating film 31. Bit lines 18 are buried in the vicinity of an upper surface of the interlayer film 17. On the bit lines 18 and the interlayer film 17, formed is a protective film 19.

Here, the surface of the semiconductor substrate 1 below the first gate electrode 14 in a portion sandwiched by two shallow trench isolation regions 13 constitutes a channel. Each of the tunnel insulating film 10, the charge storing layer 11 and the block insulating film 12 is formed in a substantially uniform film thickness at a central portion of the channel as well as at portions contacting with the shallow trench isolation regions 13. Note that at least the thickness of the block insulating film 12 below the first gate 14 is formed substantially uniform at the central portion of the channel as well as at the portions contacting with the shallow trench isolation regions 13.

Moreover, the thickness of the tunnel insulating film 10 on the semiconductor substrate 1 is formed substantially uniform at the central portion of the channel as well as at the portions contacting with the shallow trench isolation regions 13. As the case may be, the semiconductor device may adopt a structure, in which the tunnel insulating film 10 is formed on the semiconductor substrate 1, the charge storing layer 11 is formed thereon, and the first gate 14 is directly formed thereon. Moreover, each of the tunnel insulating film 10, the charge storing layer 11 and the block insulating film 12 is formed to have a substantially uniform length in the row direction, and each of them contacts with side faces of the shallow trench isolation regions 13 on an equal horizontal plane. Furthermore, a length of the first gate electrode 14 in the portion sandwiched by the shallow trench isolation regions 13 has substantially the same length in the row direction as the lengths in the row direction of the tunnel insulating film 10, the charge storing layer 11 and the block insulating film 12 sandwiched by the shallow trench isolation regions 13.

Here, the first gate 14 is directly formed on the shallow trench isolation regions 13; that is, neither of the tunnel insulating film 10, the charge storing layer 11 nor the block insulating film 12 is interposed therebetween. Accordingly, movement of electric charges to an adjacent gate via the charge storing layer 11 is prevented. Note that there may be also a case that notches, which are hollows, are formed on upper edges of the shallow trench isolation regions 13.

Figure 7:
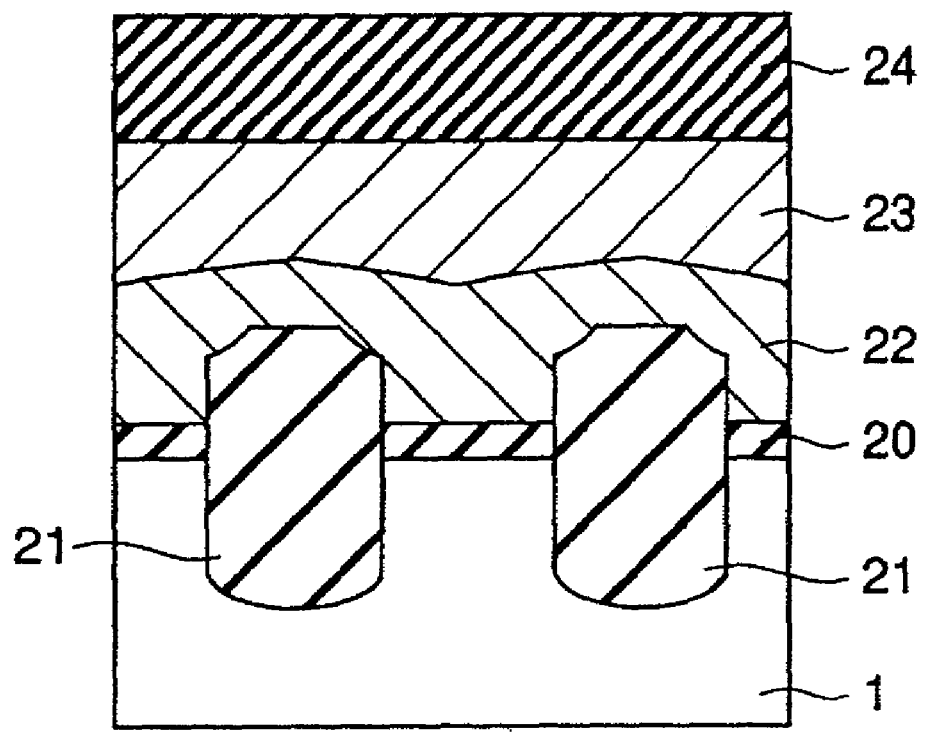
FIG. 7 is a cross-sectional view in the row direction of a high-voltage transistor of the first embodiment.

Next, a cross section in the row direction of a high-withstand-voltage transistor in a peripheral circuit section is illustrated in FIG. 7. Here, on the semiconductor substrate 1, a gate insulating film 20 made of a silicon oxide film or a silicon oxynitride film is formed in a thickness, for example, from about 8 nm to 40 nm. Shallow trench isolation regions 21 are formed so as to separate the gate insulating film 20 on the semiconductor substrate 1. Depths of the shallow trench isolation regions 21 are formed shallower than the thicknesses of the shallow trench isolation regions 13 in the memory section. Specifically, a difference between the depths and the thicknesses is equivalent to a value obtained by subtracting the thickness of the tunnel insulating film 10 in the memory section from the thickness of the gate insulating film 20 of the high-withstand-voltage transistor.

A first gate electrode 22, which is of the same composition and approximately the same film thickness as the first gate electrode 14 in the memory section, is formed on the shallow trench isolation regions 21 and the gate insulating film 20. A second gate electrode 23, which is of the same composition and approximately the same film thickness as the second gate electrode 15 in the memory section, is formed on the first gate electrode 22. A gate cap insulating film 24, which is of the same composition and approximately the same film thickness as the gate cap insulating film 16 in the memory section, is formed on the second gate electrode 23. As shown in FIG. 1, the barrier insulating film 31, the interlayer film 17 and the like are formed on the gate cap insulating film 24; however, illustration thereof is omitted.

Here, the gate insulating film 20 is formed to have an approximately uniform film thickness at a central portion of the channel as well as at portions contacting with the shallow trench isolation regions 21. In other words, unlike the conventional example or the prototype, the gate insulating film is not formed thicker at the portions contacting with the shallow trench isolation regions as compared to other portions.

Moreover, the gate insulating film 20 sandwiched by the shallow trench isolation regions 21 is formed to have substantially the same length in the row direction as a length in the row direction of a portion of the first gate electrode 22 sandwiched by the shallow trench isolation regions 21. Furthermore, notches, which are hollows, are formed on upper edges of the shallow trench isolation regions 21. Such notches are formed deeper than the notches in the memory section.

Figure 8:
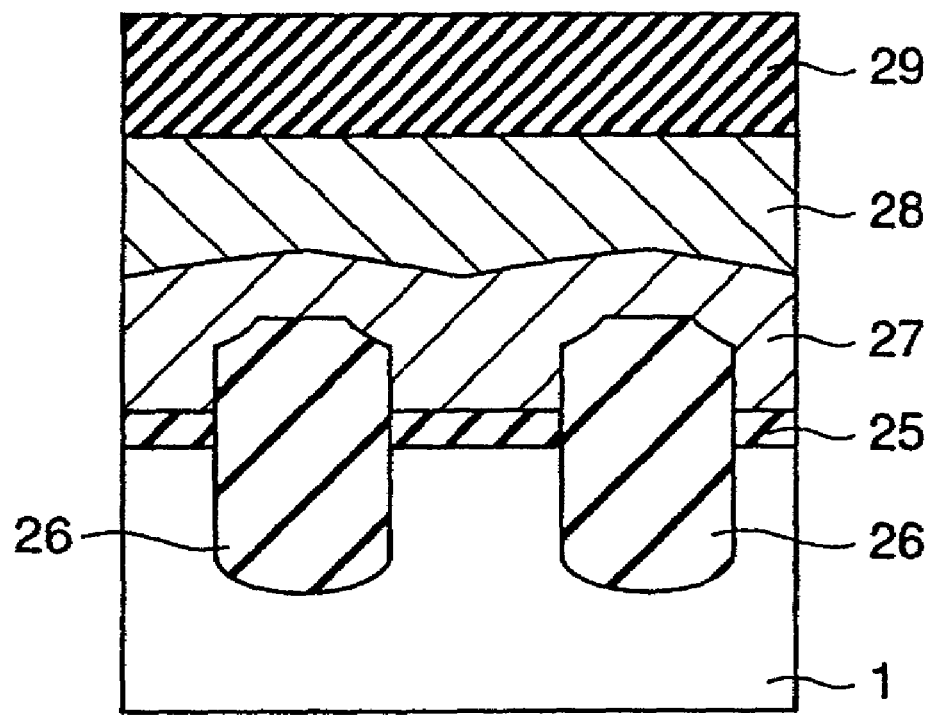
FIG. 8 is a cross-sectional view in the row direction of a low-voltage transistor of the first embodiment.

Next, a cross section in the row direction of a low-voltage transistor in the peripheral circuit section is illustrated in FIG. 8. Here, on the semiconductor substrate 1, a gate insulating film 25 made of a silicon oxide film or a silicon oxynitride film is formed in a thickness, for example, from about 0.5 nm to 10 nm. Shallow trench isolation regions 26 are formed so as to separate the gate insulating film 25 on the semiconductor substrate 1. Thicknesses of the shallow trench isolation regions 26 are formed approximately equal to the depths of the shallow trench isolation regions 13 in the memory section.

A first gate electrode 27, which is of the same composition and approximately the same film thickness as the first gate electrode 14 in the memory section, is formed on the shallow trench isolation regions 26 and the gate insulating film 25. A second gate electrode 28, which is of the same composition and approximately the same film thickness as the second gate electrode 15 in the memory section, is formed on the first gate electrode 27. A gate cap insulating film 29, which is of the same composition and approximately the same film thickness as the gate cap insulating film 16 in the memory section, is formed on the second gate electrode 28. As shown in FIG. 1, the barrier insulating film 31, the interlayer film 17 and the like are formed on the gate cap insulating film 29; however, illustration thereof is omitted.

Here, the gate insulating film 25 is formed to have an approximately uniform film thickness at a central portion of the channel as well as at portions contacting with the shallow trench isolation regions 26. In other words, unlike the conventional example or the prototype, the gate insulating film is not formed thicker at the portions contacting with the shallow trench isolation regions as compared to other portions.

Moreover, the gate insulating film 25 sandwiched by the shallow trench isolation regions 26 is formed to have substantially the same length in the row direction as a length in the row direction of a portion of the first gate electrode 27 sandwiched by the shallow trench isolation regions 26. Furthermore, notches, which are hollows, are formed on upper edges of the shallow trench isolation regions 26. Such notches are formed deeper than the notches in the memory section. In addition, a height from the surface of the semiconductor substrate to upper parts of the shallow trenches in the peripheral circuit section is made lower than a height from the surface of the semiconductor substrate to upper parts of the shallow trenches in the memory section.

The following Table 1 shows depths of STI, which are element isolation regions, dimensions of concave portions at upper edges of the STI, relations between widths of gate electrodes and semiconductor substrates, radii of curvature of the edges and characteristics of gate electrodes, regarding multiple types of gate insulating films of the above-described structure. Here, the gate insulating films include structures in which gate electrodes of both polarities are formed severally.

TABLE 1

| Type of Gate Insulating Film | STI Depth (from Substrate Surface) | Dimension of Concave at STI Upper Edge | Relation between Gate Electrode Width and Si Substrate Width | Curvature Radius of Edge | Gate Electrode |
|---|---|---|---|---|---|
| ONO | A | C | Electrode ≧ Substrate | Electrode ≦ Substrate | p+/n+ severally formable |
| SiO₂ (thin-film) | A | D | | | |
| SiO₂ (thick-film) | B | D | | | |

As it can be understood from Table 1, the depths "A" of the STI, which are the element isolation regions, in the cases of the gate insulating films made of ONO and thin-film silicon oxide are deeper than the depth "B" in the case of the gate insulating film made of thick-film silicon oxide.

Moreover, regarding the magnitudes of concave portions at upper edges of the STI, a dimension "C" in the case of the gate insulating film made of ONO is smaller than a dimension "D" in the cases of the gate insulating films made of silicon oxide. Furthermore, irrespective of the types of the gate insulating films, widths of gate electrodes sandwiched by two element isolation regions are greater than widths of semiconductor substrates sandwiched by the same two element isolation regions.

In addition, radii of curvature at edge portions of the gate electrodes contacting with the element isolation regions are smaller than radii of curvature at edge portions in the vicinity of the gate electrodes of the semiconductor substrates contacting with the element isolation regions. Moreover, the gate electrodes can be formed severally as p-plus electrodes as well as n-plus electrodes. In other words, transistors with p-plus electrodes and transistors with n-plus electrodes may coexist in one semiconductor device in a manner that film thicknesses of gate electrode films of both types of transistors are formed equal.

Figure 9:
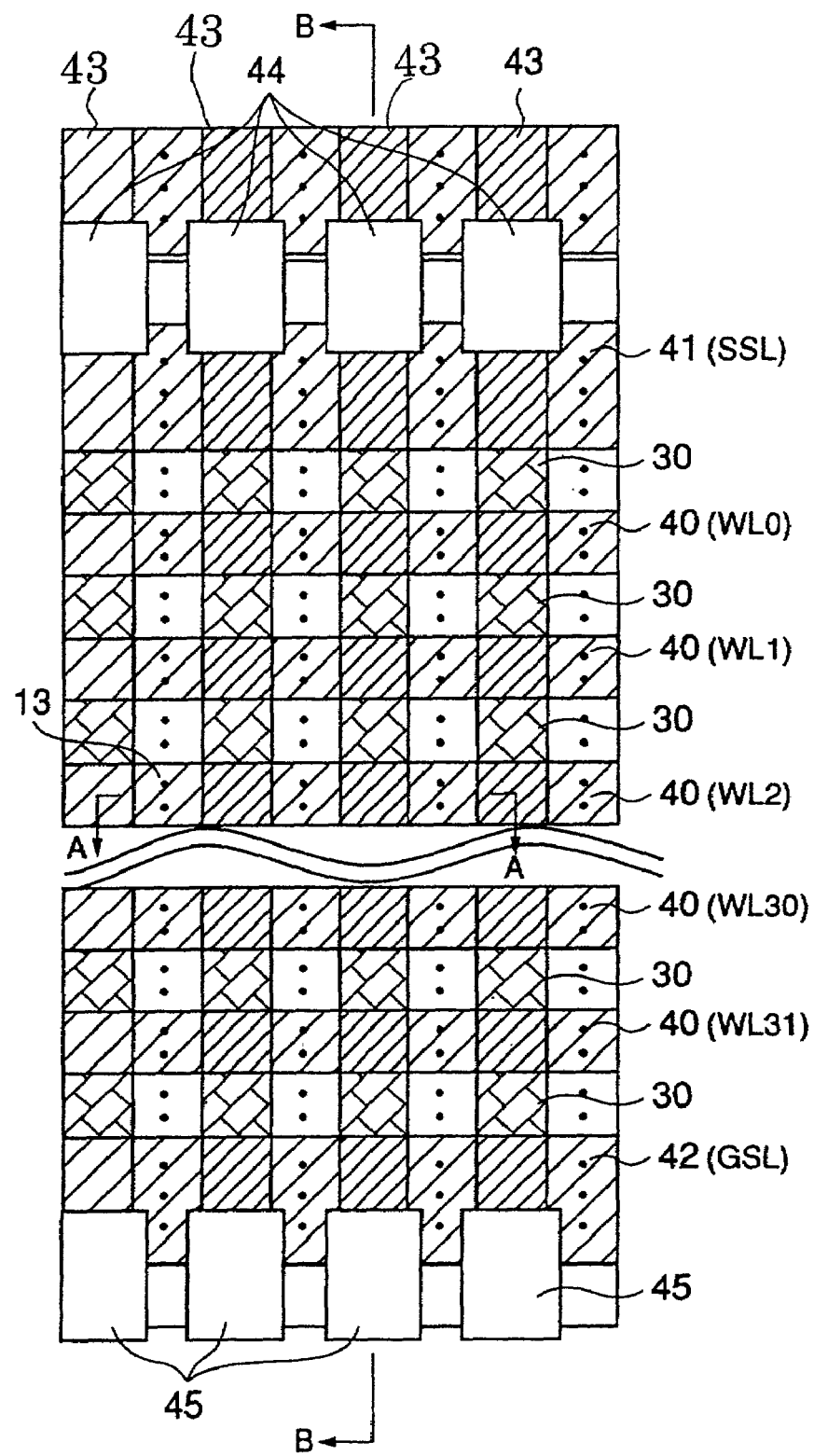
FIG. 9 is a plan view showing a constitution of the memory section of the first embodiment.

Now, FIG. 9 shows a plan view of the memory section of this embodiment. In the plan view, a cross-sectional view taken along the "A—A" line corresponds to FIG. 1. As shown in FIG. 9, a plurality of bit lines (BL) 43 are disposed linearly and parallel to one another with constant intervals in the vertical direction in the drawing. Perpendicularly to these bit lines 43, a plurality of data selective lines (word lines) 40 parallel to one another are disposed below the bit lines 43. Shallow trench isolation regions 13 are formed at spaces between the word lines 40 (WL 0 to WL 31) except for places under the bit lines 43, whereby source and drain regions 30 are insulatingly isolated. Bit-line contacts 44 are formed in the source and drain regions 30 of the bit lines 43 adjacent to a bit-line selective signal line 41. Moreover, source-line contacts 45 provided with ground potential are connected with the source and drain regions 30 of the bit lines 43 adjacent to a common source-line selective signal line 42. In FIG. 9, the data selective lines 40 are indicated by slant lines, the shallow trench isolation regions 13 are indicated by dot patterns and the source and drain regions 30 are indicated by slant brick wall patterns.

Practically, the constitution illustrated in FIG. 9 is repetitively formed, in reality, in the vertical direction in FIG. 9.

Figure 10:
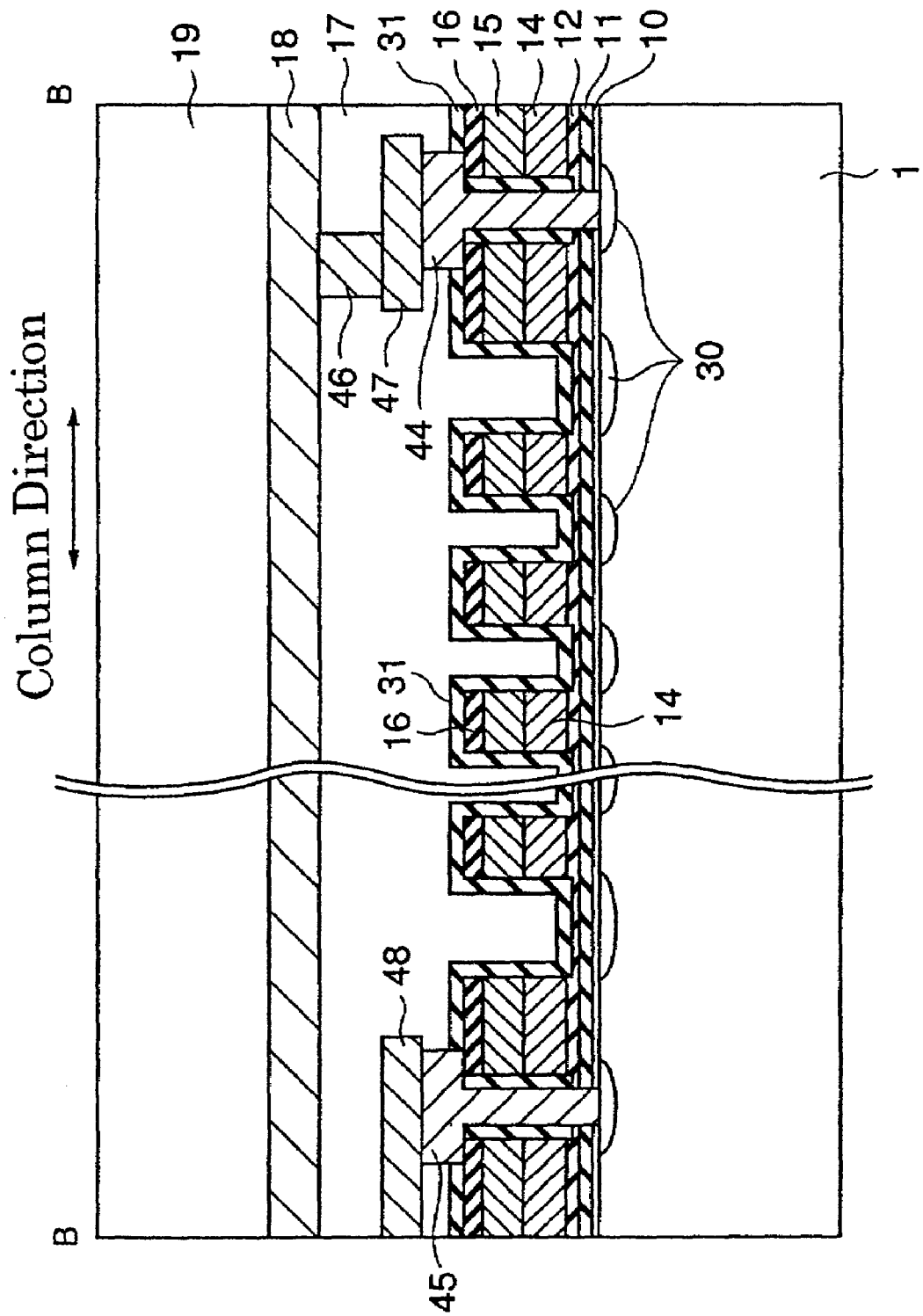
FIG. 10 is a cross-sectional view in a column direction of the memory section of the first embodiment.

In a cross-sectional view of the memory section in the column direction shown in FIG. 10, a plurality of the source and drain regions 30 are provided on the semiconductor substrate 1. The tunnel insulating film 10, the charge storing layer 11 and the block insulating film 12 are provided on the semiconductor substrate 1. In gate-forming portions on the block insulating film 12, formed are a plurality of gates, each of which is comprised of the first gate electrode 14 and the second gate electrode 15. The gate cap insulating film 16 is provided to cover the gate-forming portions. The barrier insulating film 31 is further provided to cover the gate cap insulating film 16 and the exposed block insulating film 12.

In FIG. 10, the bit-line contact 44 is formed near the right end of the drawing. The bit-line contact 44 is connected with bit-line outgoing wiring 47. The bit-line extension wiring 47 is connected with a bit-line outgoing contact 46, and the bit-line extension contact 46 is connected with the bit line 18.

In FIG. 10, the source-line contact 45 is formed near the left end of the drawing. The source-line contact 45 is connected with source-line wiring 48.

The gate-forming portions, the bit-line contact 44, the bit-line extension wiring 47, the bit-line extension contact 46, the source-line contact 45 and the source-line wiring 48 are covered with the interlayer film 17.

Moreover, the bit line 18 and the interlayer film 17 are covered with the protective film 19. Note that a twin-well structure, in which a first well of a conductivity type reverse to the semiconductor substrate is provided on the semiconductor substrate and a second well of the same conductivity type as the semiconductor substrate is further provided thereon, may be also applicable.

Figure 11:
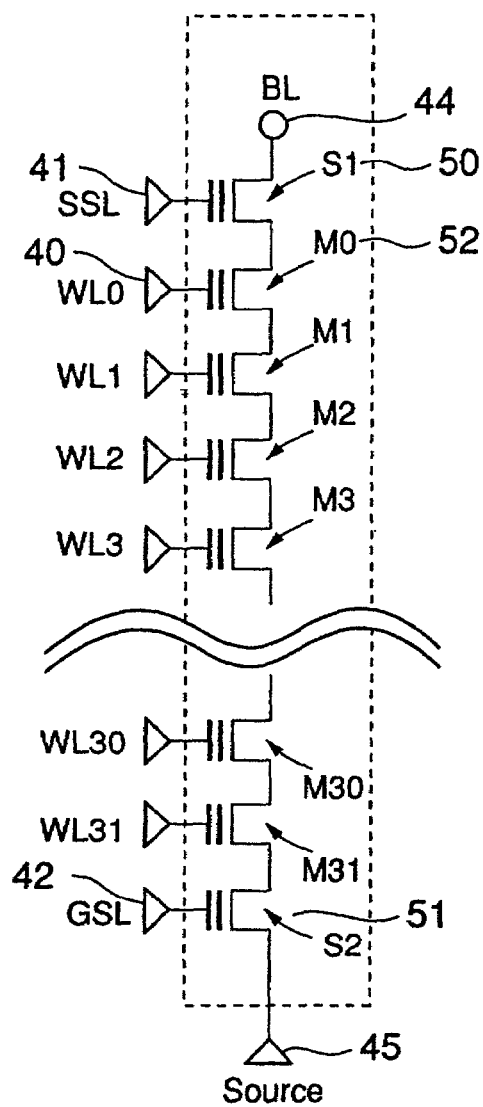
FIG. 11 is a circuit diagram showing a NAND string of the memory section of the first embodiment.

FIG. 11 is a circuit diagram describing a part of FIG. 9. Here, an array structure of the memory cell is a NAND type, wherein one end of a serially-connected memory cell is connected with the bit-line contact 44 via a selective transistor (S1) 50, and the other end thereof is connected with the source-line contact 45 via a selective transistor (S2) 51.

Each of the gate electrodes of serially-connected memory cell transistors (M0 to M31) 52 is connected with each of the data selective lines (WL0 to WL 31) 40. The gate electrode of the selective transistor (S1) 50 is connected with the bit-line selective signal line (SSL) 41, and the gate electrode of the selective transistor (S2) 51 is connected with the common source-line selective signal line (GSL) 42. An array of the memory cell transistors 52 sandwiched by the selective transistor (S1) 50 and the selective transistor (S2) 51 is referred to as a NAND string. Such NAND strings are connected by thousands in series as well as by thousands in parallel, each of which is connected with the data line, the bit line and the common source line, thus constituting a semiconductor memory device with a memory capacity of several megabits.

Moreover, in this embodiment, the selective transistors 50 and 51 adopt a MONOS structure, which is the same as the memory cell transistors 52. For this reason, it is not necessary to form the gate insulating film severally for the memory cells and for the selective transistors, and thus it is suitable for miniaturizing of elements and for cost reduction. Moreover, transistors constituting peripheral circuits adopt a MOS structure including two types of transistors different in film thicknesses of gate insulating films thereof. Here, it should be noted that this embodiment is also applicable to a case in which the transistors constituting peripheral circuits include three or more different types of the film thicknesses of the gate insulating films thereof.

According to this embodiment, the sidewalk phenomenon attributable to deterioration of writing and erasing characteristics at edges of the element isolation regions is resolved, whereby writing and erasing operations can be speeded up.

Now, a method of fabricating a semiconductor device of this embodiment will be described with reference to FIG. 12 to FIG. 27. Here, the fabricating method will be described according to the cross-sectional views in the row direction shown in FIGS. 1, 7 and 8, which represent the characteristics of this embodiment. Throughout the following FIG. 12 to FIG. 27, drawings suffixed with "A" are process diagrams showing a method of fabricating a memory cell transistor and a selective transistor in a memory section, drawings suffixed with "B" are process diagrams showing a method of fabricating a low-voltage transistor in a peripheral circuit section and drawings suffixed with "C" are process diagrams showing a method of fabricating a high-withstand-voltage transistor in the peripheral circuit section.

Figures 12A, 12B, 12C:
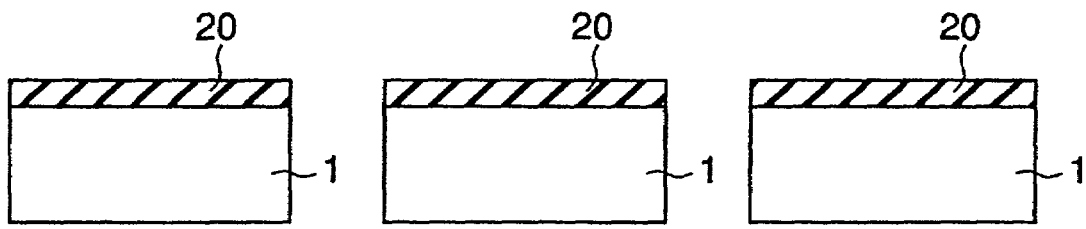
FIG. 12A is a cross-sectional view in the row direction, showing one step of a method of fabricating a memory cell transistor and a selective transistor of the first embodiment.
FIG. 12B is a cross-sectional view in the row direction, showing one step of a method of fabricating a low-voltage transistor of the first embodiment.
FIG. 12C is a cross-sectional view in the row direction, showing one step of a method of fabricating a high-withstand-voltage transistor of the first embodiment.

First, as shown in FIGS. 12A, 12B and 12C, a sacrificial oxide film (not shown) in a thickness from about 5 nm to 20 nm is formed on the semiconductor substrate 1, and then impurities (not shown) are doped for forming wells in the memory section and the peripheral circuit section and forming channels as appropriate. After the sacrificial film is exfoliated, the gate insulating film 20 for the high-withstand-voltage transistors in the peripheral circuit section is formed over the entire surface of the semiconductor substrate 1. Here, the gate insulating film 20 is either a silicon oxide film or a silicon oxynitride film in a thickness from about 8 nm to 40 nm, for example. However, adjustment should be made in order to achieve a targeted thickness ultimately, by reverse operation considering changes of the film thickness attributable to subsequent processes.

Figure 13A:
FIG. 13A is a cross-sectional view in the row direction, showing one step of the method of fabricating the memory cell transistor and the selective transistor of the first embodiment.
Figure 13B:
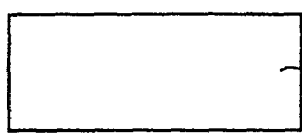
FIG. 13B is a cross-sectional view in the row direction, showing one step of the method of fabricating the low-voltage transistor of the first embodiment.
Figure 13C:
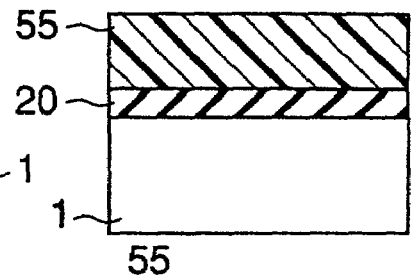
FIG. 13C is a cross-sectional view in the row direction, showing one step of the method of fabricating the high-withstand-voltage transistor of the first embodiment.

Next, as shown in FIG. 13C, the entire surface is covered with resist 55 in the case of fabricating the high-withstand-voltage transistor. Meanwhile, as shown in FIGS. 13A and 13B, the gate insulating film 20 is exfoliated in the case of fabricating the memory section or the low-voltage transistor.

Figure 14A:
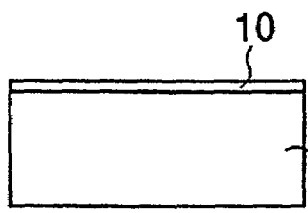
FIG. 14A is a cross-sectional view in the row direction, showing one step of the method of fabricating the memory cell transistor and the selective transistor of the first embodiment.
Figure 14B:
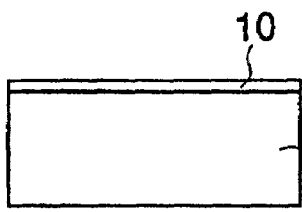
FIG. 14B is a cross-sectional view in the row direction, showing one step of the method of fabricating the low-voltage transistor of the first embodiment.
Figure 14C:
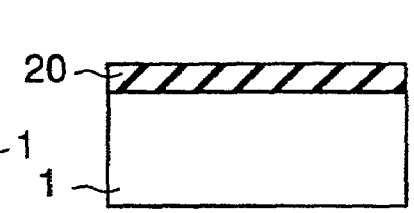
FIG. 14C is a cross-sectional view in the row direction, showing one step of the method of fabricating the high-withstand-voltage transistor of the first embodiment.

Next, after the resist 55 is removed as shown in FIG. 14C, a silicon oxide film or a silicon oxynitride film is formed in a thickness from 0.5 nm to 5 nm, for example, as the tunnel insulating film 10 for the MONOS memory cell as shown in FIGS. 14A and 14B.

Figure 15A:
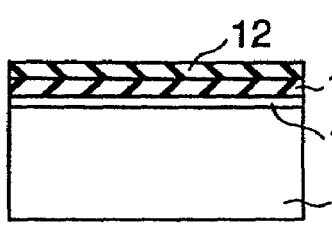
FIG. 15A is a cross-sectional view in the row direction, showing one step of the method of fabricating the memory cell transistor and the selective transistor of the first embodiment.
Figure 15B:
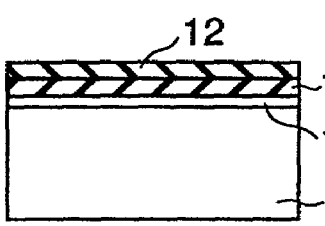
FIG. 15B is a cross-sectional view in the row direction, showing one step of the method of fabricating the low-voltage transistor of the first embodiment.
Figure 15C:
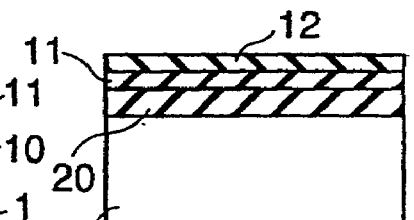
FIG. 15C is a cross-sectional view in the row direction, showing one step of the method of fabricating the high-withstand-voltage transistor of the first embodiment.

Next, as shown in FIGS. 15A, 15B and 15C, deposited is the charge storing layer 11 made of a silicon nitride film, a silicon oxynitride film or other insulating films of $Ta_2O_5$, $TiO_2$, $Al_2O_3$ or the like, in a thickness from about 3 nm to 30 nm, for example. In addition, either a silicon oxide film or a silicon oxynitride film is formed as the block insulating film 12 in a thickness from 1 nm to 20 nm.

Figure 16A:
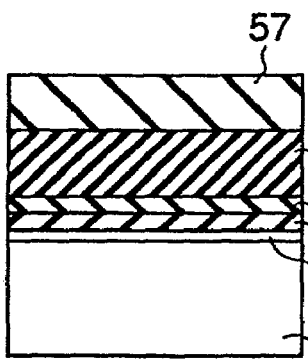
FIG. 16A is a cross-sectional view in the row direction, showing one step of the method of fabricating the memory cell transistor and the selective transistor of the first embodiment.
Figure 16B:
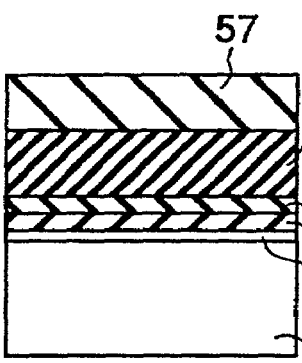
FIG. 16B is a cross-sectional view in the row direction, showing one step of the method of fabricating the low-voltage transistor of the first embodiment.
Figure 16C:
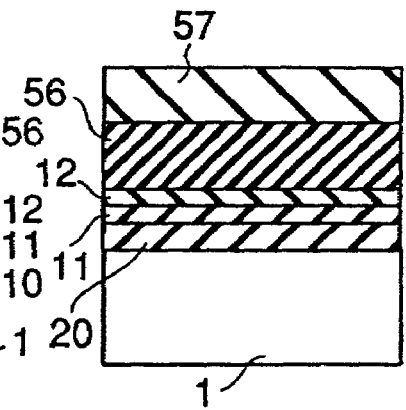
FIG. 16C is a cross-sectional view in the row direction, showing one step of the method of fabricating the high-withstand-voltage transistor of the first embodiment.

Next, as shown in FIGS. 16A, 16B and 16C, deposited is a silicon nitride film as a stopper film 56 for a chemical mechanical polishing (CMP) method for planarization of filler in the element isolation regions, in a thickness from about 10 nm to 500 nm, for example. Here, requirements for the stopper film 56 should include at least the following three points of: (1) a sufficient selective ratio with respect to the filler in the element isolation regions as a stopper film for CMP; (2) a sufficient selective ratio with respect to the block insulating film 12 of the MONOS while exfoliation of the stopper film 56; and (3) a film not oxidized while oxidation of the surface of the substrate for recovery from damage, which is to take place after anisotropic etching for forming the element isolation regions.

Here, in the case where the filler and the block insulating film of the element isolation regions are made of oxide films, then a silicon nitride film is suitable for the stopper film 56. In addition, a silicon oxide film in a thickness from 20 nm to 500 nm, for example, is deposited as a mask material 57 for anisotropic etching for the element isolation regions. It should be noted that an upper surface of the mask material 57 shown in FIG. 16C is formed to be higher than upper surfaces of the mask material 57 shown in FIGS. 16A and 16B, because the gate insulating film 20 in the high-withstand-voltage transistor region shown in FIG. 16C is thicker than the tunnel insulating film 10 in the memory section or in the low-voltage transistor region shown in FIGS. 16A and 16B.

Next, as shown in FIGS. 17A, 17B and 17C, the resist (not shown) is patterned and the mask material 57 is processed by anisotropic etching. Subsequently, the stopper film 56, the block insulating film 12, the charge storing layer 11, the tunnel insulating film 10 and the gate insulating film 20 are processed, and then the semiconductor substrate 1 is etched to a desirable depth, whereby element isolation trenches 58, 59, and 60 are formed.

In this event, in the region shown in FIG. 17C, the thickness of the gate insulating film 20 formed on the semiconductor substrate 1 is made greater than the thickness of the tunnel insulating film 10 shown in FIGS. 17A and 17B. Accordingly, the depth of the element isolation trench 60 is made shallower than the depths of the element isolation trenches 58 and 59 shown in FIGS. 17A and 17B, corresponding to the additional thickness. Moreover, since sizes of the transistors in the memory section are smaller than those in the peripheral circuit section, a width of the element isolation trench 58 or intervals of the element isolation trenches are made smaller than those of the element isolation trenches 59 and 60 in the peripheral circuit section.

Next, as shown in FIGS. 18A, 18B and 18C, a silicon oxide film 61 in a thickness from 2 nm to 50 nm, for example, is formed on the surface of the semiconductor substrate 1 inside the element isolation trenches by annealing in an oxygen atmosphere, in order to recover the semiconductor substrate 1 from damage such as defects caused by etching. The mask material 57 is not oxidized in this event; accordingly, bird's beaks are not caused. Therefore, thickening of the block insulating film 12 at element isolation edges does not occur.

In this way, the film thicknesses of the block insulating film 12 on the center of the channel region and at the portions contacting with the shallow trench isolation regions are made equal. Note that the equal film thickness herein refers to virtual equality of physical film thicknesses thereof. To be more precise, a difference in the film thicknesses at the element isolation edges and in the center of the channel should be preferably less than about 2 nm, more preferably, about 1 nm or less. That is, when the difference in the film thicknesses is 2 nm or more, the sidewalk phenomenon occurs. In this way, deterioration of write operation and erase operation characteristics at the element isolation edges can be prevented, whereby fine transistor characteristics without the sidewalk phenomenon become obtainable.

Next, as shown in FIGS. 19A, 19B and 19C, the respective element isolation trenches 58, 59 and 60 are filled with element isolation insulating films (filler) 62, 63 and 64, and then upper surfaces of the respective element isolation insulating film 62, 63 and 64 are planarized by the CMP method. Each of the upper surfaces of the element isolation insulating films is formed to have a height in a range from about 100 nm to 300 nm, for example, from the surface of the semiconductor substrate.

Figure 20A:
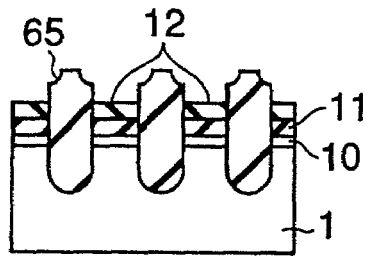
FIG. 20A is a cross-sectional view in the row direction, showing one step of the method of fabricating the memory cell transistor and the selective transistor of the first embodiment.
Figure 20B:
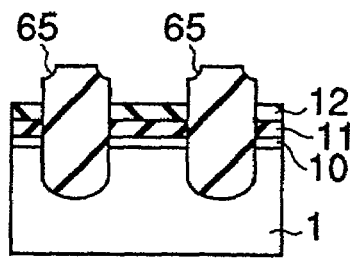
FIG. 20B is a cross-sectional view in the row direction, showing one step of the method of fabricating the low-voltage transistor of the first embodiment.
Figure 20C:
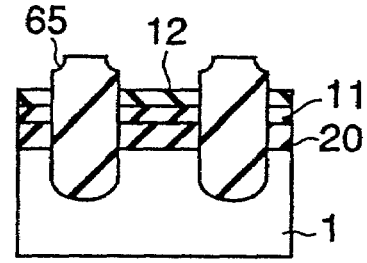
FIG. 20C is a cross-sectional view in the row direction, showing one step of the method of fabricating the high-withstand-voltage transistor of the first embodiment.

Next, as shown in FIGS. 20A, 20B and 20C, the mask material 57 is exfoliated with phosphoric acid heated up to a range from 80 to 200° C., for example. A surface after exfoliation of the mask material 57 constitutes a state where the block insulating film 12 is exposed. In this event, hollows 65 of approximately the same size are formed on edges of the upper surfaces of the respective element isolation insulating films 62, 63 and 64, depending on conditions for exfoliation of the mask material 57.

Figure 21A:
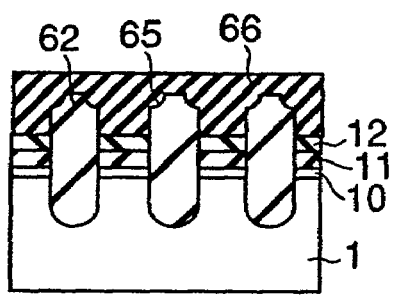
FIG. 21A is a cross-sectional view in the row direction, showing one step of the method of fabricating the memory cell transistor and the selective transistor of the first embodiment.
Figure 21B:
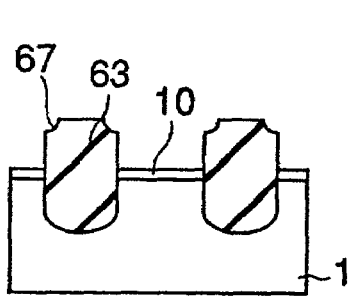
FIG. 21B is a cross-sectional view in the row direction, showing one step of the method of fabricating the low-voltage transistor of the first embodiment.
Figure 21C:
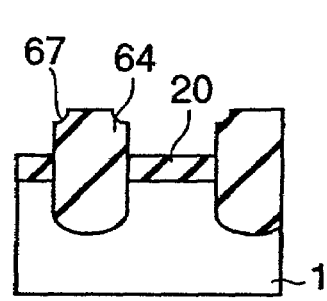
FIG. 21C is a cross-sectional view in the row direction, showing one step of the method of fabricating the high-withstand-voltage transistor of the first embodiment.

Next, as shown in FIG. 21A, the memory cell transistor region and the selective transistor region are covered with resist 66. Then, as shown in FIGS. 21B and 21C, the block insulating film 12 and the charge storing layer 11 in the peripheral circuit section are exfoliated by isotropic etching such as chemical dry etching (CDE).

In this event, hollows 67 of approximately the same size are formed on the edges of the upper surfaces of the respective element isolation insulating films 63 and 64 in the peripheral circuit section. The hollows 67 become larger than the hollows 65 formed in the precedent process. Depths of the hollows 67 reach 5 nm or deeper, for example. Moreover, since the element isolation insulating film 62 in the memory section is covered with the resist 66 during this process, the sizes of the hollows 65 do not change. In other words, concave portions are not formed.

Moreover, as for exfoliation of the insulating film in the peripheral circuit section, only the block insulating film 12 may be subjected to anisotropic etching, such as RIE. In this case, because of etching, the heights, from the surface of the semiconductor substrate, of the upper surfaces of the element isolation regions in the peripheral circuit section are made lower than the heights, from the surface of the semiconductor substrate, of the upper surfaces of the element isolation regions in the memory section. The following Table 2 collectively shows depths of STI in the element isolation regions from the surface of the semiconductor substrate, heights of upper parts of the STI from the surface of the semiconductor substrate, relations in size between widths of the gate electrodes and the semiconductor substrates, radii of curvature of the edges and characteristics of gate electrodes, regarding multiple types of gate insulating films in this case.

TABLE 2

| Type of Gate Insulating Film | STI Depth (from Substrate Surface) | Height of STI Upper Part from Substrate | Relation between Gate Electrode Width and Si Substrate Width | Curvature Radius of Edge | Gate Electrode |
|---|---|---|---|---|---|
| ONO | A | E | Electrode ≥ Substrate | Electrode ≤ Substrate | p+/n+ severally formable |
| SiO$_2$ (thin-film) | A | F | | | |
| SiO$_2$ (thick-film) | B | F | | | |

As it can be understood from Table 2, regarding the depths of the STI, which are the element isolation regions, the depths "A" in the cases of the gate insulating films made of ONO and thin-film silicon oxide are deeper than the depth "B" in the case of the gate insulating film made of thick-film silicon oxide.

Moreover, regarding the heights of the upper parts of the STI from the surface of the semiconductor substrate, a height "E" in the case of the gate insulating film made of ONO is greater than heights "F" in the cases of the gate insulating films made of silicon oxide. Furthermore, irrespective of the types of the gate insulating films, widths of gate electrodes sandwiched by two element isolation regions are greater than widths of semiconductor substrates sandwiched by the same two element isolation regions.

In addition, radii of curvature at edge portions of the gate electrodes contacting with the element isolation regions are smaller than radii of curvature at edge portions in the vicinity of the gate electrodes of the semiconductor substrates contacting with the element isolation regions. Moreover, the gate electrodes can be formed severally as p-plus electrodes as well as n-plus electrodes.

When the silicon oxide film is used for all the block insulating film 12 as well as the element isolation insulating films 62, 63 and 64, the hollows 67 are also formed on the upper parts of the element isolation insulating films 63 and 64 upon exfoliation of the block insulating film 12. However, when the silicon nitride film is used for the charge storing layer 11 contacting with side faces of the element isolation insulating films 63 and 64, the silicon nitride film possesses a sufficient selective ratio with respect to the silicon oxide film in the event of etching. Accordingly, there are no cases where the side faces of the element isolation insulating films 63 and 64 are side-etched to form divots or the like.

Thus, after the exfoliation of the charge storing layer 11, the tunnel insulating film 10 is exposed in the low-voltage transistor region as shown in FIG. 21B, and the gate insulating film 20 for the high-withstand-voltage transistors is exposed in the high-withstand-voltage transistor region as shown in FIG. 21C.

Figure 22A:
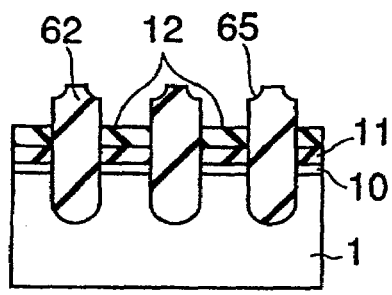
FIG. 22A is a cross-sectional view in the row direction, showing one step of the method of fabricating the memory cell transistor and the selective transistor of the first embodiment.
Figure 22B:
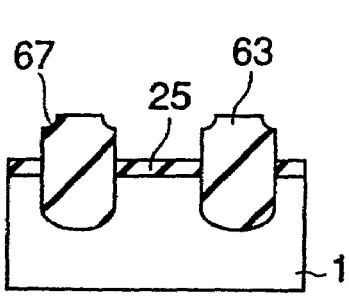
FIG. 22B is a cross-sectional view in the row direction, showing one step of the method of fabricating the low-voltage transistor of the first embodiment.
Figure 22C:
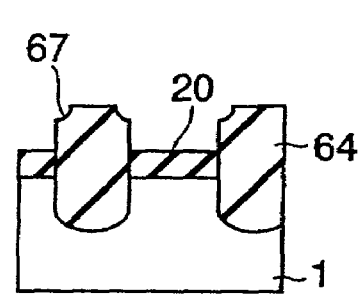
FIG. 22C is a cross-sectional view in the row direction, showing one step of the method of fabricating the high-withstand-voltage transistor of the first embodiment.

Next, after the resist 66 in the memory cell transistor region is removed as shown in FIG. 22A, a gate insulating film 25 made of a silicon oxide film or a silicon oxynitride film in a thickness from 0.5 nm to 10 nm, for example, is formed on the low-voltage transistor region as shown in FIG. 22B.

In this event, a densification effect is obtained simultaneously at the block insulating film 12 in the memory section and the gate insulating film 20 for the high-withstand-voltage transistors by forming the gate insulating film 25 using thermal oxidation. Accordingly, damage caused by exfoliation of the mask material 57 and the charge storing layer 11 can be recovered, and thus reliability of the memory cells or the peripheral circuits can be improved.

Next, as shown in FIGS. 23A, 23B and 23C, undoped polycrystalline or amorphous silicon is deposited in a film thickness from 5 nm to 500 nm, for example, as gate electrode members 68, 69 and 70.

Next, as shown in FIGS. 24A, 24B and 24C, a silicon oxide film 71 in a film thickness around 10 nm, for example, is deposited on the gate electrode materials 68, 69 and 70. This process is performed for inhibiting impurities from escaping out of the electrodes in the subsequent process of impurity implantation into the gate electrodes.

Next, as shown in FIG. 25A, the memory cell region is covered with resist 72, and $10E19$ $cm^{-3}$ or more of phosphorous or arsenic, for example, is doped into the gate electrodes for the transistors in the peripheral circuit section as shown in FIGS. 25B and 25C, thus forming first gate electrodes 27 and 22 of n-type.

Figure 26A:
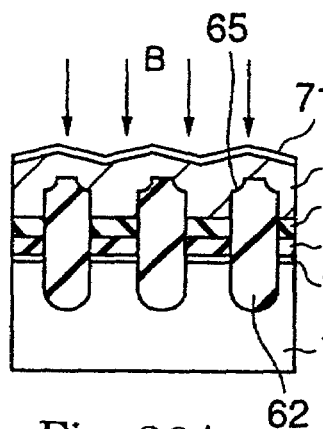
FIG. 26A is a cross-sectional view in the row direction, showing one step of the method of fabricating the memory cell transistor and the selective transistor of the first embodiment.

Next, after exfoliating the resist 72 as shown in FIG. 26A, only the peripheral circuit section is covered this time with resist 73. Then, $10E^{19}$ $cm^{-3}$ or more of boron, for example, is doped into the memory cell section, thus forming a first gate electrode 14 of p-type.

Figure 27A:
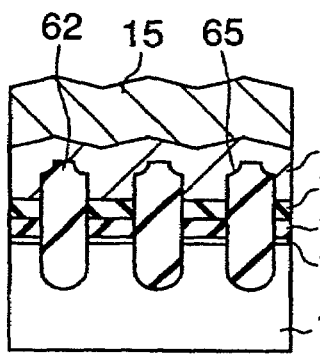
FIG. 27A is a cross-sectional view in the row direction, showing one step of the method of fabricating the memory cell transistor and the selective transistor of the first embodiment.
Figure 27B:
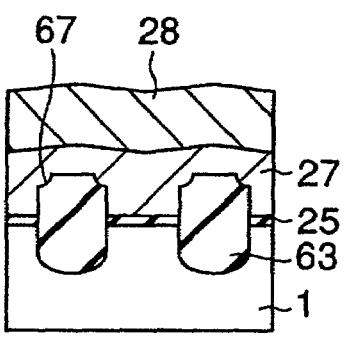
FIG. 27B is a cross-sectional view in the row direction, showing one step of the method of fabricating the low-voltage transistor of the first embodiment.
Figure 27C:
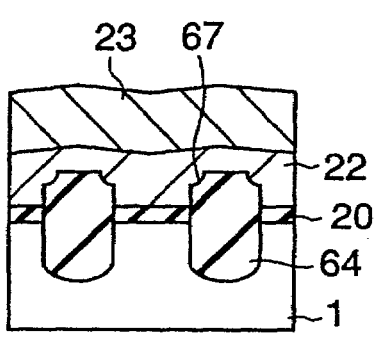
FIG. 27C is a cross-sectional view in the row direction, showing one step of the method of fabricating the high-withstand-voltage transistor of the first embodiment.

Next, as shown in FIGS. 27A, 27B and 27C, after the oxide film 71 on the respective first gate electrodes 14, 27 and 22 are exfoliated, any one of WSi, NiSi, MoSi, TiSi, CoSi and the like is deposited to form gate electrodes 15, 28 and 23. Although illustration is omitted, the barrier insulating film 31, the interlayer film 17, bit lines 18, the protective film 19 and the like are sequentially formed thereafter.

Each of the gate electrodes in this embodiment adopts a stacked structure of impurity-added polysilicon and polycide. However, without limitation to the foregoing, polymetal or metal electrodes may be also used therein. Moreover, implantations of impurities into polysilicon are severally conducted with respect to the memory cell section and the peripheral circuit section. However, without limitations to the foregoing, modes of several fabrications may be modified in order to obtain desired transistor characteristics and cell characteristics, or several fabrications are not always necessary. When several fabrications do not take place, infusion of impurities into polysilicon is not limited to implantation, but polysilicon doped with arsenic, phosphorous, boron or the like may be deposited in the process described in FIG. 23.

In the case where the amorphous silicon is deposited in the process described in FIG. 23, it should be noted that the amorphous silicon changes into polysilicon in the subsequent thermal process. Moreover, metallic materials are preferred as materials for the gate electrodes in the case where low resistance is required. However, in the case where metal is used therein, a temperature to be applied in fabrication processes after formation of the gate electrodes cannot be high in comparison with the case of using the polysilicon, whereby the fabrication processes are constrained in this regard. For this reason, materials for the gate electrodes are selected as appropriate depending on trade-off relations between the low-resistance requirements and the heating temperatures in the course of the fabrication processes.

Figure 26B:
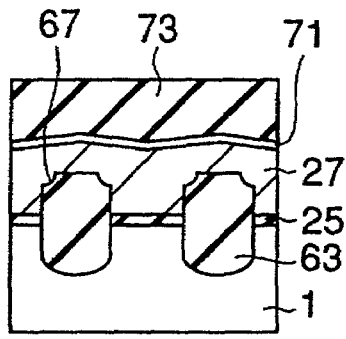
FIG. 26B is a cross-sectional view in the row direction, showing one step of the method of fabricating the low-voltage transistor of the first embodiment.
Figure 26C:
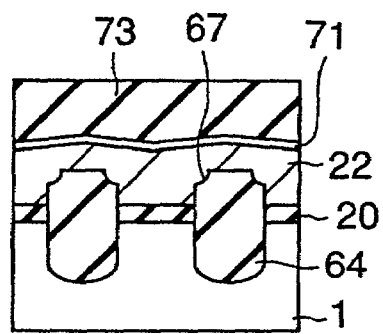
FIG. 26C is a cross-sectional view in the row direction, showing one step of the method of fabricating the high-withstand-voltage transistor of the first embodiment.

Moreover, in the processes described in FIGS. 25 and 26, impurity implantation may be performed not only to the gate electrodes but also to channels or wells. If impurity implantation is performed after passing high-temperature processes such as formation of the gate insulating films, oxidation of the surfaces of the element isolation trenches or the like, diffusion of the impurities owing to the thermal processes can be prevented. Accordingly, sharper impurity profiles can be obtained and device characteristics can be thereby improved.

Although processes after deposition of the gate electrodes are not illustrated herein, patterning is performed by lithography and a diffusion layer is formed. Thereafter, an interlayer film is deposited, and contacts and wiring are formed, whereby a MISFET is formed.

Since the gate insulating films are formed prior to the process of forming the element isolation films in this embodiment, the channel edges as well as the centers are well controlled to form a uniform thickness. In addition, since the polycrystalline silicon to be the gate electrodes is deposited after the element isolation, oxidation after formation of the trenches does not cause bird's beaks. As a result, a problem of thickening or thinning of the gate insulating films at the channel edges can be avoided, whereby the device characteristics can be improved.

Moreover, since the side walls of the gate electrodes are not oxidized, positioning of the edges of the gate insulating films and the side walls of the gate electrodes on the same plane becomes feasible, whereby uniform electric fields can be applied to the entire gate insulating films upon writing or erasing. Furthermore, according to the present invention, since the gate insulating film for MOS transistors are formed by further oxidizing the tunnel insulating film for the memory cell transistors, a wet process before gate oxidation can be unnecessary. Accordingly, formation of hollows on the side faces of the shallow trench isolation regions can be avoided.

Moreover, since such gate oxidation functions as densification with respect to the barrier insulating film and the oxide films in the peripheral circuit section, the gate oxidation also serves for burying pin holes that are likely to be created by the wet process or the like, whereby reliability of the transistors in the memory cells and in the peripheral circuit section can be enhanced.

Moreover, the width of the gate insulating film in the channel direction and the width of the gate electrode in the channel direction at the portion sandwiched by the shallow trench isolation regions can be formed equal to each other. Accordingly, the characteristics of the transistors can be enhanced.

Furthermore, the gate electrode is deposited simultaneously with respect to all the transistors and it is not necessary to deposit the polycrystalline silicon twice on the portions sandwiched by the element isolation regions and on the portions on the element isolation regions. Accordingly, the number of the processes can be reduced, whereby cost reduction can be realized.

In addition, the present invention can reduce the number of the processes for severally fabricating the gate insulating films (of the MONOS structure and the MOS structure) and the gate electrodes (of p-plus gates and n-plus gates), thus achieving cost reduction.

Moreover, it is easy to fabricate the p-plus gates and the n-plus gates severally on the memory cell transistors and the peripheral transistors, if undoped polycrystalline silicon is used for the gate electrodes.

In this case, since p-plus portions and n-plus portions of the polycrystalline silicon for the gate electrodes are formed simultaneously, the thicknesses thereof are made equal. Accordingly, subsequent processes on the gate electrodes are facilitated.

In addition, since the gate electrodes in the memory section and the gate electrodes in the peripheral circuit section can be formed simultaneously, the number of fabricating processes can be reduced.

Moreover, one of the memory section and the peripheral circuit section can be regarded as the p-plus portions and the other thereof can be regarded as the n-plus portions. Otherwise, both of the p-plus portions and the n-plus portions can be also mixedly formed in the memory section and in the peripheral circuit section, respectively. In this case, the semiconductor device may be formed in a manner that p-type impurities are doped in cell transistors of the majority in the memory section, for example, while n-type impurities are doped in selective transistors fewer than the cell transistors, and that p-type impurities are doped in low-voltage transistors of the majority in the peripheral circuit section while n-type impurities are doped in high-withstand-voltage transistors of the minority.

In the case where the above process is applied to a NAND flash memory, the number of processes is not increased if the selective transistors and the memory cell transistors adopt the same structure of gate insulating films thereof.

In the case where the p-plus portions and the n-plus portions coexist, both of the p-type impurities and the n-type impurities are doped in the semiconductor substrate, the element isolation regions or the gate electrodes at interface portions of the p-plus portions and the n-plus portions. Note that neither the p-type impurities nor the n-type impurities are doped therein, depending on sizes of the interface portions of the p-plus portions and the n-plus portions.

Moreover, each of the second gate electrodes 15, 28 and 23 formed on the shallow trench isolation regions does not include a natural oxide film in the gate film thereof, and the second gate electrodes are integrated with the first gate electrodes 14, 27 and 22 formed between the element isolation regions. Accordingly, values of resistance are maintained constant, and controllability of the gate electrodes is improved in comparison with the case in which gate electrodes are formed with natural oxide films interposed therebetween by two steps of fabrication in the conventional art.

This embodiment is particularly effective in the case where charge storing insulating films can be formed without receiving fabrication damage.

This embodiment has been described regarding a semiconductor memory device of a MONOS structure as an example. However, this embodiment is not limited only to the semiconductor memory device of the MONOS structure, but is universally applicable to semiconductor devices including miniaturized MOS transistors that require high-grade electric characteristics of gate insulating films thereof. This embodiment resolves the foregoing problems in the conventional art. Specifically, this embodiment provides a semiconductor device having electric characteristics of a gate insulating film in the vicinity of an element isolation region equal to electric characteristics of the gate insulating film at portions other than the vicinity of the element isolation region and a method of fabricating the same.

SECOND EMBODIMENT

Figure 28:
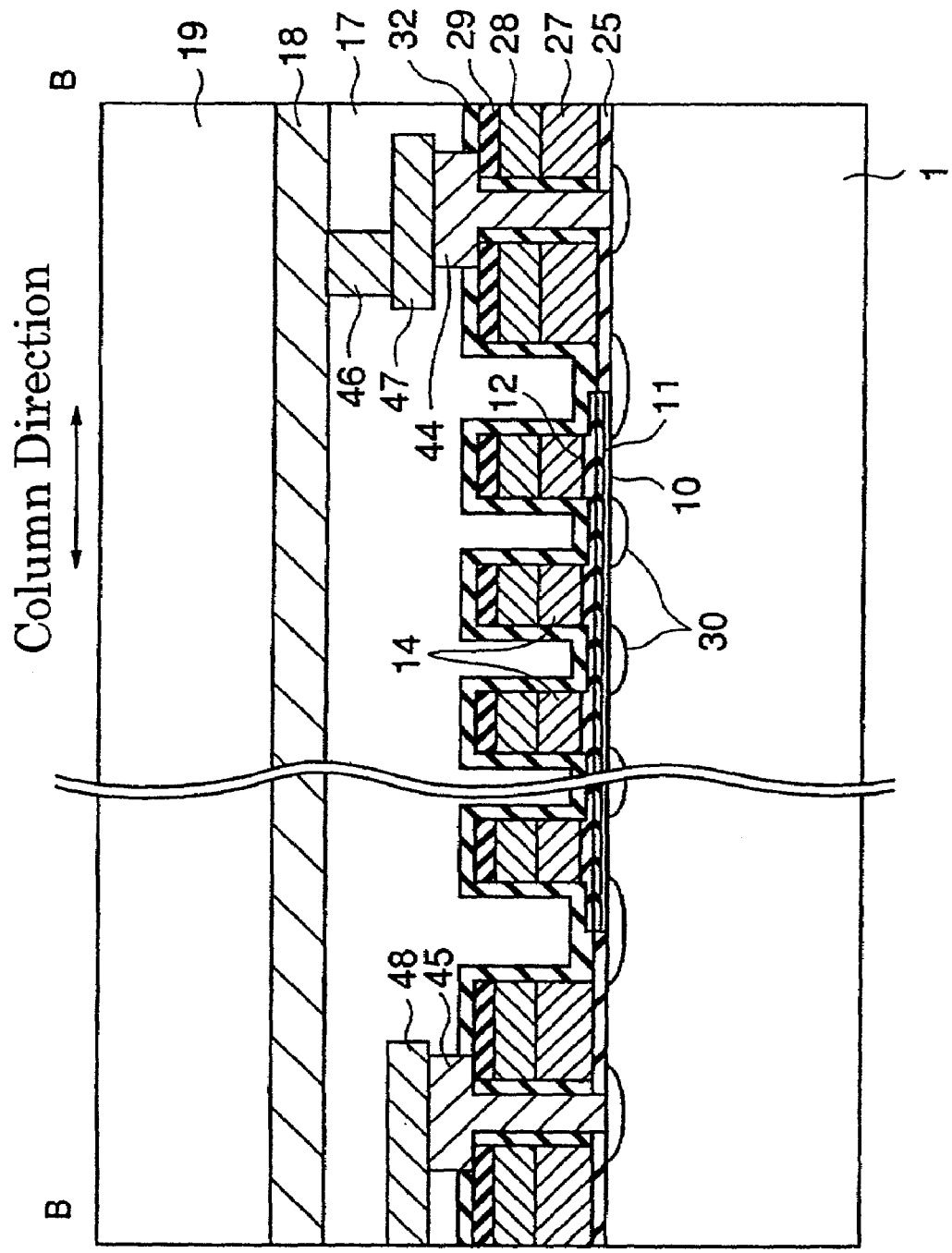
FIG. 28 is a cross-sectional view in the column direction, showing a constitution of a memory section of a second embodiment.

In this embodiment, the structure of the selective transistors in the memory section is different from that of the first embodiment, but is the same structure as the low-voltage transistor in the peripheral circuit section shown in FIG. 8. As it can be seen, the gate insulating film for the selective transistor is not the MONOS structure but is the MOS structure. A cross-sectional view of the memory section in the column direction is as shown in FIG. 28, in which shapes of the memory cell transistors are similar to those in the first embodiment. The structure of the gate insulating film of selective transistor portions is different from that in the first embodiment, which is comprised of the gate insulating film 25 of low-voltage transistors.

Figure 29:
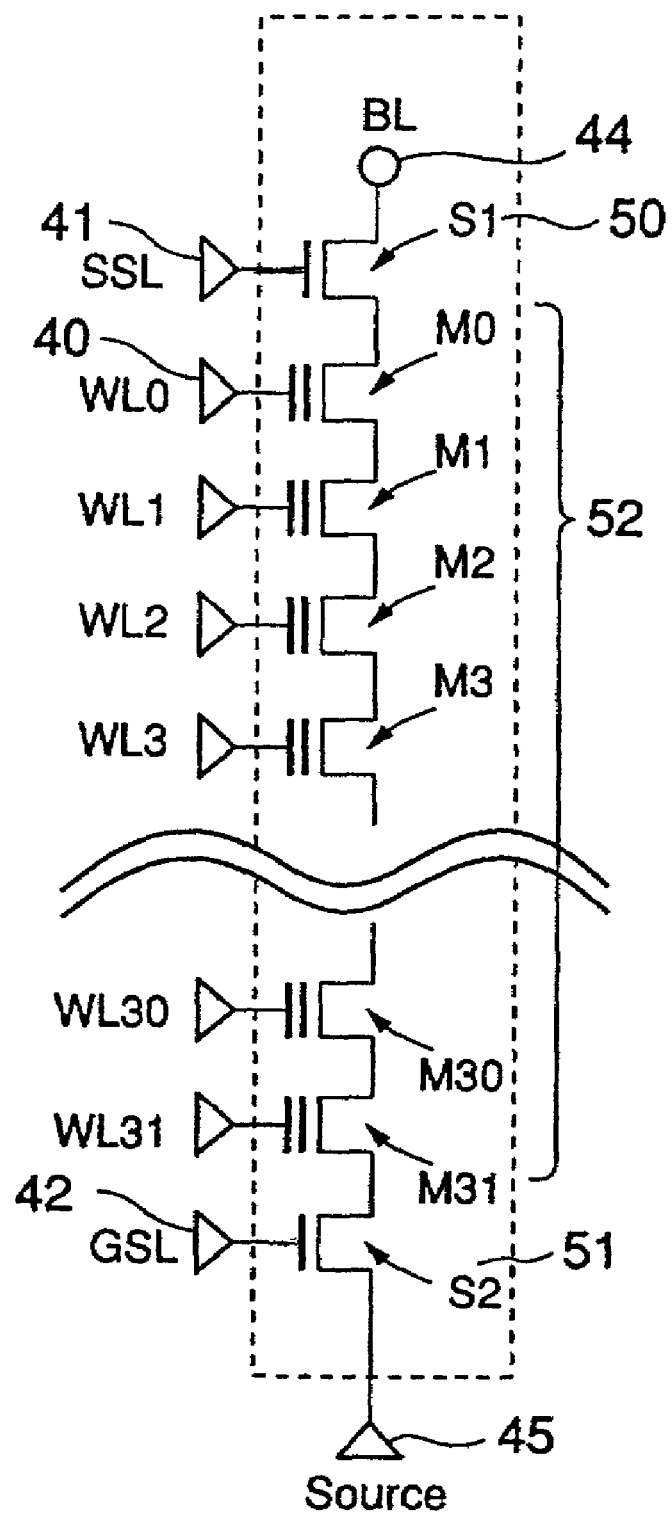
FIG. 29 is a circuit diagram showing a NAND string of the memory section of the second embodiment.

A circuit diagram of this embodiment is as illustrated in FIG. 29, in which the structures of the selective transistors (S1 and S2) 50 and 51 respectively connected with both ends of memory cell transistors (M0 to M31) 52 that are serially connected similarly to the first embodiment, are not expressed as the MONOS structure, but as the MOS structure. Other constitutions therein are the same as the circuit diagram of the first embodiment shown in FIG. 11.

Since this embodiment does not adopt a silicon nitride film as the gate insulating film for the selective transistors, thresholds of the selective transistors are prevented from variation owing to stress by gate voltage or drain voltage when a semiconductor memory device is in operation, whereby a semiconductor memory device of higher performance and higher reliability can be realized.

Whereas a silicon oxide film or a silicon oxynitride film in a thickness from 0.5 nm to 10 nm, for example, can be cited as for the gate insulating film 25 for the selective transistors, it is desirable that conditions for forming the gate insulating film 25 agree with the conditions for forming the low-voltage transistors in the peripheral circuit section in the light of reducing the steps in the process. In other words, a fabricating method of this embodiment is achieved, according to the fabricating method of the first embodiment, in a manner that, with regard to the selective transistors, the steps similar to those for fabricating the low-voltage transistors in the peripheral circuit section are adopted in stead of the same steps as those for fabricating the memory cell transistors in the memory section.

When this process is used for a NAND flash memory, the number of the fabricating steps is not increased if the selective transistors thereof adopt the structure of the gate insulating film as the same as that of the low-voltage transistors in the peripheral circuit section.

This embodiment has been described regarding a semiconductor memory device of a MONOS structure as an example. However, this embodiment is not limited only to the semiconductor memory device of the MONOS structure, but is universally applicable to semiconductor devices including downsized MOS transistors that require high-grade electric characteristics of gate insulating films thereof.

THIRD EMBODIMENT

This embodiment is used for a memory cell of a semiconductor device that applies particularly an insulating film as a charge storing layer thereof.

Figure 30A:
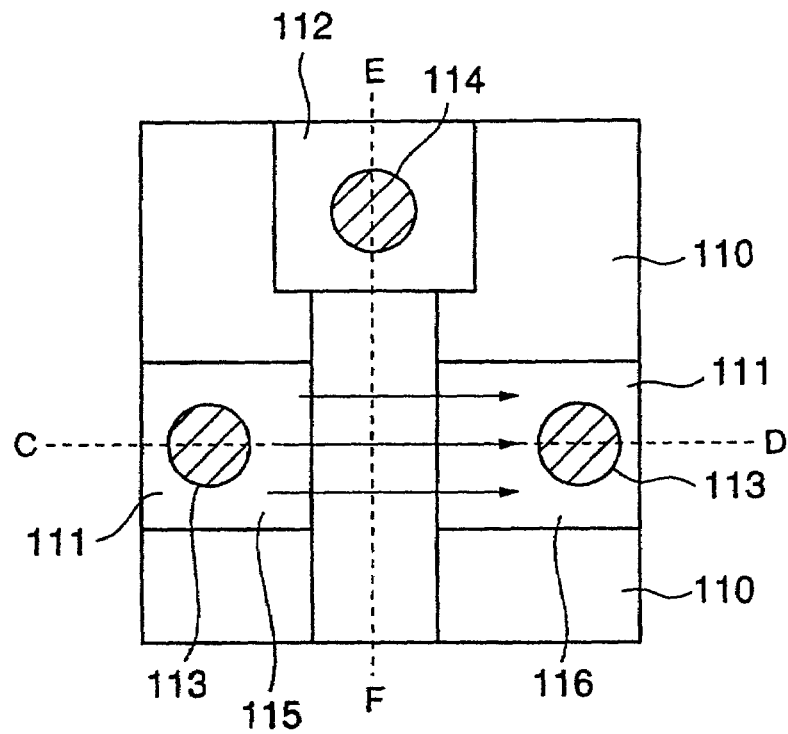
FIG. 30A is a top plan view of a semiconductor device of a prototype of a third embodiment.
Figures 30B, 30C:
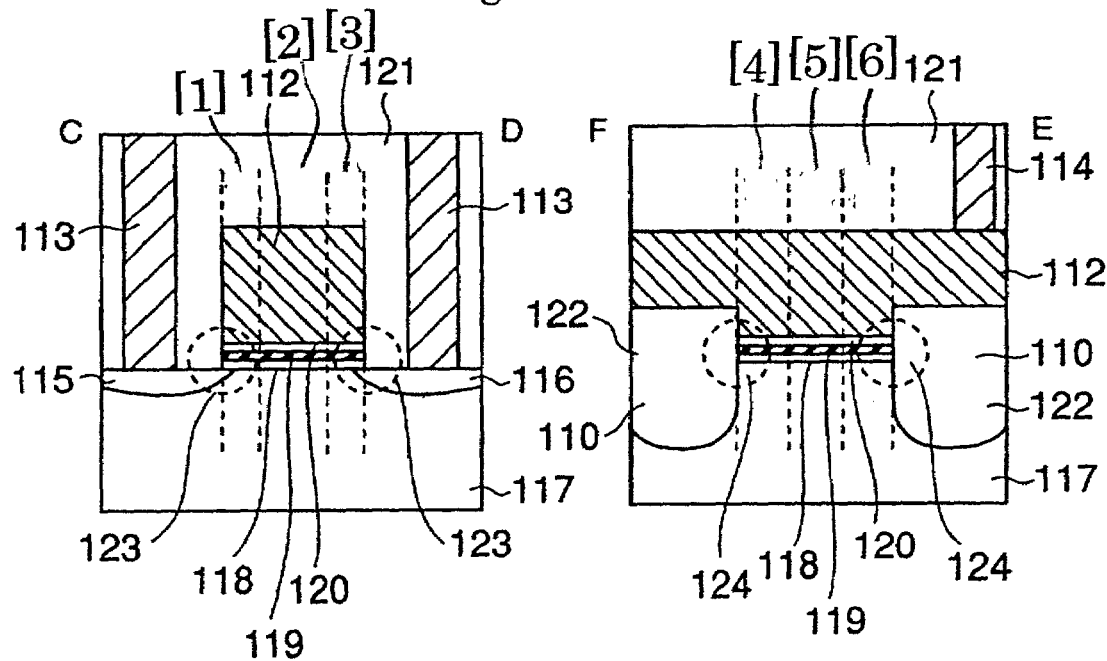
FIG. 30B is a cross-sectional view taken along the "C-D" line of FIG. 30A showing the semiconductor device of the prototype of the third embodiment.
FIG. 30C is a cross-sectional view taken along the "E-F" line of FIG. 30A showing the semiconductor device of the prototype of the third embodiment.

A MONOS memory cell using self-aligned STI, which is a prototype of this embodiment, is illustrated in FIGS. 30A to 30C. A top plan view of the prototype of this embodiment is illustrated in FIG. 30A, in which element regions 111 are formed linearly in the right-and-left direction while being surrounded by element isolation regions 110. As perpendicular to the longitudinal direction of these impurity regions, a gate electrode 112 is formed. A pair of contacts 113 are provided respectively on the right and left sides of the gate electrode 112 in the element regions 111. Moreover, a wide region is provided at an edge of the gate electrode and a contact 114 is provided therein. In this memory cell, the element regions 111 on both sides of the gate electrode 112 constitute a source diffusion layer 115 and a drain diffusion layer 116, respectively. In the event of reading data, a write operation mode and an erase operation mode are discriminated in accordance with an amount of currents flowing from the source diffusion layer 115 to the drain diffusion layer 116, i.e. in the direction from "C" to "D" as indicated with an arrow in FIG. 30A. Such a structure is utilized in NAND-type EEPROMs, NOR-type EEPROMs or the like.

A cross-sectional view of FIG. 30A taken along the "C-D" line is illustrated in FIG. 30B. The gate electrode 112 is formed on a semiconductor substrate 117, and the source diffusion layer 115 and the drain diffusion layer 116 are respectively formed inside the semiconductor substrate 117 on both sides thereof. The gate electrode 112 is stacked on a gate insulating film comprised of a tunnel insulating film 118, a data retention insulating film (a charge storing region) 119 and a block insulating film 120. An interlayer insulating film 121 is formed on surfaces of the semiconductor substrate 117 and the gate electrode 112.

Moreover, a cross-sectional view of FIG. 30A taken along the "E-F" line is illustrated in FIG. 30C. Element isolation trenches 122 are provided in the semiconductor substrate 117, and the element isolation regions 110 are formed in the element isolation trenches 122. The gate insulating film comprised of the tunnel insulating film 118, the data retention insulating film 119 and the block insulating film 120 is formed in a space between the element isolation regions 110. On this block insulating film 120, the gate electrode 112 is formed extending over the element isolation regions 110.

In a method of fabricating the memory cell shown in FIG. 30B and FIG. 30C, edges of the data retention insulating film are exposed to plasma of anisotropic etching in the events of etching fabrication for forming the element isolation trenches or etching fabrication for the gate electrode and the gate insulating film. Accordingly, there may be cases where the data retention insulating film suffers from fabrication damage at edges of the element isolation regions and at gate edges, whereby charge retention at the edges of the data retention insulating film is deteriorated and reliability of the memory cell is damaged.

When the memory cell includes the structure shown in FIGS. 30A to 30C, there may be a case where deterioration of characteristics of the data retention insulating film at the edges of the element isolation regions becomes a critical problem. Such a case will be described in the following. In the cross section shown in FIG. 30B, the memory cell transistor is divided into three regions of [1], [2] and [3]. Here, the regions [1] and [3] of the data retention insulating film are damaged regions 123. Similarly in the cross section shown in FIG. 30C, the memory cell transistor is divided into three regions of [4], [5] and [6]. Here, the regions [4] and [6] of the data retention insulating film are damaged regions 124.

Figure 31A:
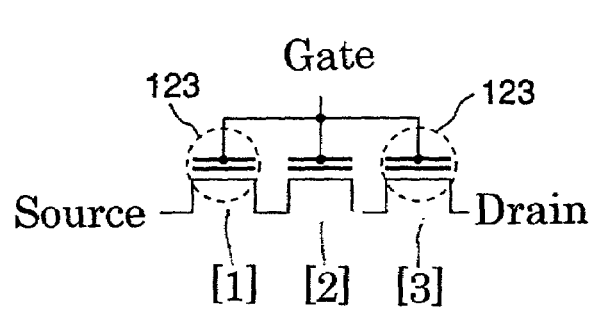
FIG. 31A is an equivalent circuit diagram corresponding to the cross section of FIG. 30B relevant to the semiconductor device of the prototype of the third embodiment.
Figure 31B:
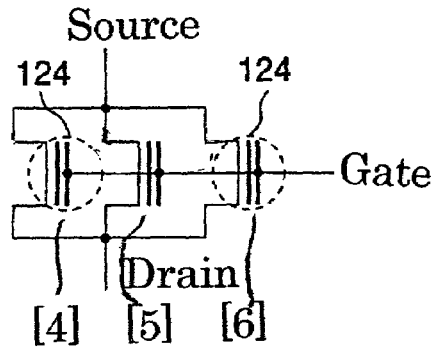
FIG. 31B is an equivalent circuit diagram corresponding to the cross section of FIG. 30C relevant to the semiconductor device of the prototype of the third embodiment.
Figure 31C:
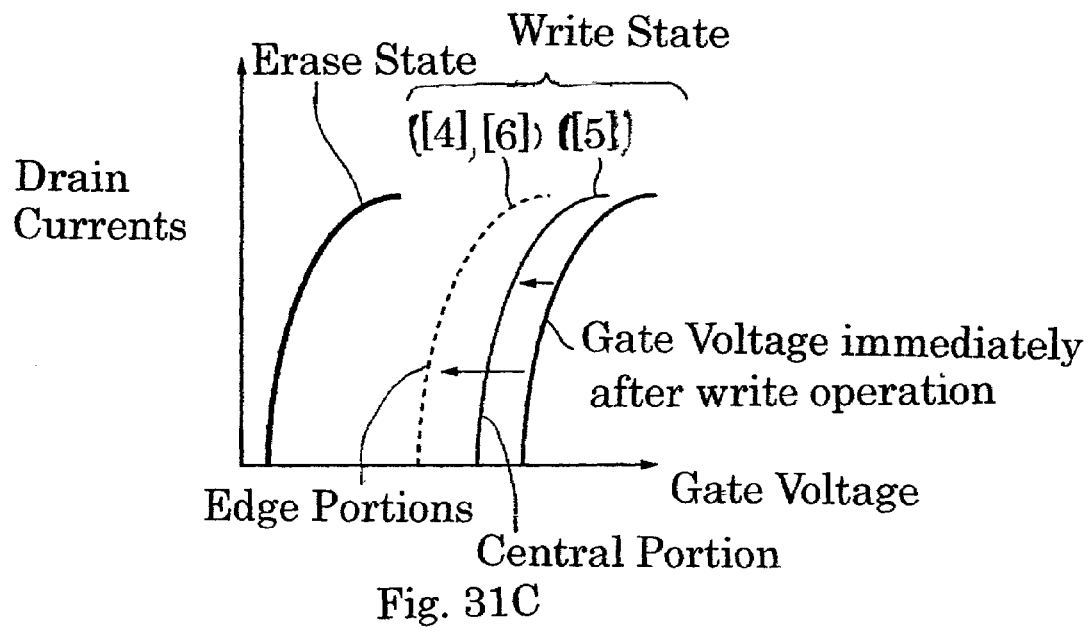
FIG. 31C is a graph showing characteristics between drain currents and gate voltage of the semiconductor device corresponding to the prototype of the third embodiment.

Here, a state where a threshold is raised (a write operation mode) by trapping electrons in the data retention insulating film is assumed. FIG. 31A shows a circuit diagram of transistors corresponding to the cross section of FIG. 30B. FIG. 31B shows a circuit diagram of transistors corresponding to the cross section of FIG. 30C. FIG. 31C is a graph showing variations of characteristics between currents and voltage in each state of the data retention insulating film, in which gate voltage is indicated by the transverse axis and drain currents are indicated by the longitudinal axis. In the circuit diagram shown in FIG. 31A, illustrated is a composition of three transistors [1], [2] and [3] connected in series between a source and a drain while gates thereof are mutually connected. The transistors [1], [2] and [3] correspond to the memory cell transistor regions [1], [2] and [3] in FIG. 30B, respectively. Moreover, in the circuit diagram shown in FIG. 31B, illustrated is a composition of three transistors [4], [5] and [6] connected in parallel between the source and the drain while gates thereof are mutually connected. The transistors [4], [5] and [6] correspond to the memory cell transistor regions [4] [5] and [6] in FIG. 30C, respectively.

Since charge retention characteristics are deteriorated in the edge portions of the data retention insulating film, electrons can easily escape therefrom. In the case of a memory cell of a structure using an insulating film as a charge storing layer as represented by a MONOS memory cell, movements of electric charges do not take place among the regions [1], [2] and [3], or among the regions [4], [5] and [6]. Accordingly, thresholds are decreased in the regions (the edge portions) that lost electric charges, in comparison with a central portion of a channel. Here, the cross section shown in FIG. 30B represents the channel in the direction of currents flowing, and in the case where the transistors are connected in series in the direction of the currents flowing, a threshold as a whole does not change even if a threshold of any of the transistors therein is decreased.

Here, since the regions [1], [2] and [3] are connected in series between the source and the drain, a current does not flow between the source and the drain when the threshold of the region [2] is high even if the thresholds are decreased in the regions [1] and [3]; therefore, decreases in the thresholds at the gate edge portion are not detected as a decrease in the threshold of the memory cell. On the contrary, since the regions [4], [5] and [6] are connected in parallel between the source and the drain, the current flows between the source and the drain when the thresholds are decreased in the regions [4] and [6], whereby decreases in the thresholds at the edge portions in the element isolation regions are detected as a decrease in the threshold of the memory cell. Such aspects are illustrated in FIG. 31C. Specifically, each of the regions shows almost the same gate voltage immediately after writing; however, the gate voltage at the edge portions [4] and [6] is decreased more than the gate voltage at the central portion [5] in a write operation mode as time passes by, and the voltage at the edge portions declines close to the voltage in an erase operation mode. In short, the charge retention characteristics of the memory cell are decided by the charge retention characteristics of the damaged portions.

As described above, in the case where the MONOS memory cell is formed with the self-aligned STI structure, deterioration of data retention characteristics of the charge storing regions at the edges of the element isolation regions or edges of the gate electrode may affect reliability of the memory cell. In particular, among four sides that define the element region, deterioration of the charge retention characteristics on edges at two sides parallel to the direction of currents flowing between the source and the drain may cause a problem. This embodiment provides a method of resolving the foregoing problem.

Figure 32A:
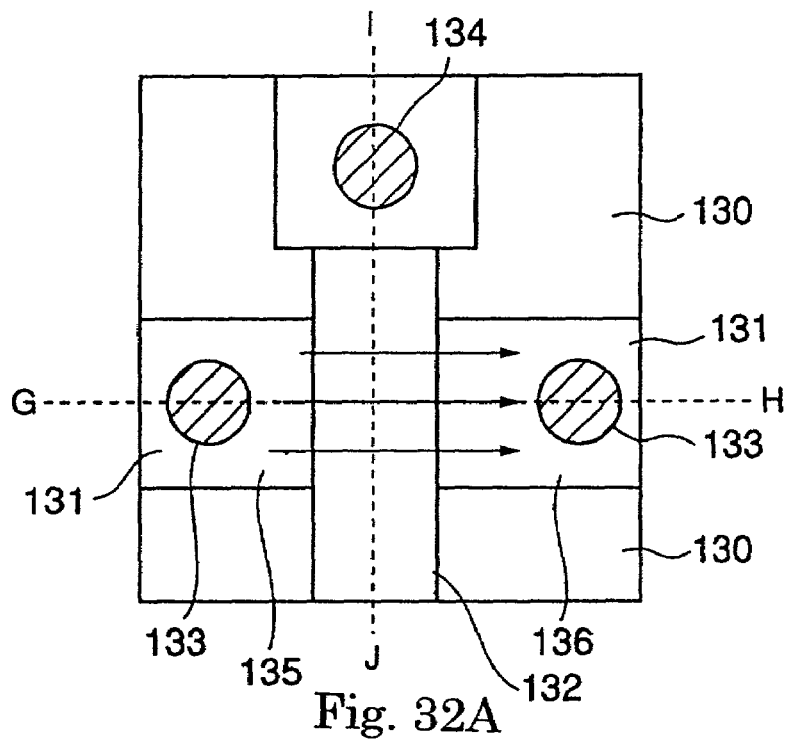
FIG. 32A is a top plan view of a semiconductor device of the third embodiment.
Figure 32B:
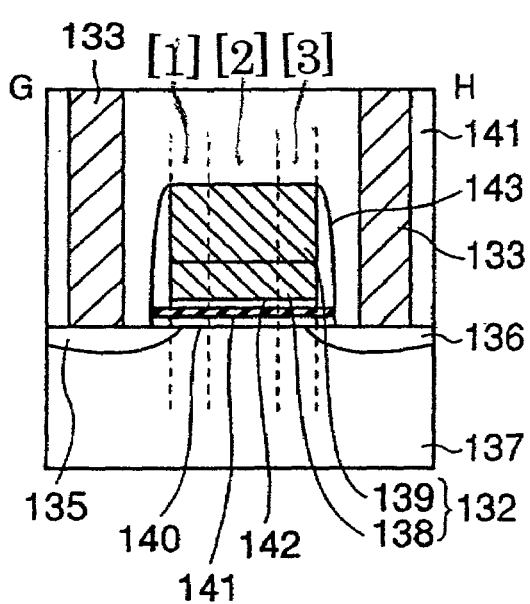
FIG. 32B is a cross-sectional view taken along the "G-H" line of FIG. 32A showing the semiconductor device of the third embodiment.
Figure 32C:
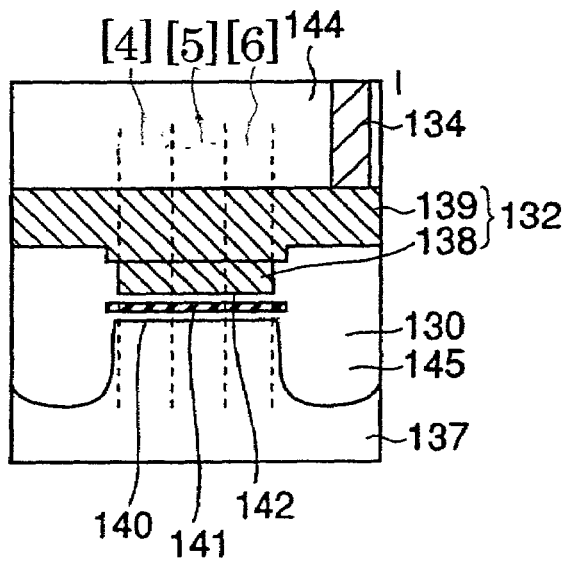
FIG. 32C is a cross-sectional view taken along the "I-J" line of FIG. 32A showing the semiconductor device of the third embodiment.

Next, a MONOS memory cell using self-aligned STI of this embodiment is illustrated in FIGS. 32A to 32C. A top plan view of a semiconductor device of this embodiment is illustrated in FIG. 32A, in which element regions 131 are formed linearly in the right-and-left direction while being surrounded by element isolation regions 130. As perpendicular to the longitudinal direction of these element regions 131, a gate electrode 132 is formed. A pair of contacts 133 are provided respectively on the right and left sides of the gate electrode 132 in the element regions 131. Moreover, a wide region is provided at an edge of the gate electrode 132 and a gate contact 134 is provided therein. In this memory cell, the element regions 131 on both sides of the gate electrode 132 constitute a source impurity region 135 and a drain impurity region 136, respectively. In the event of reading data, a write operation mode and an erase operation mode are discriminated in accordance with an amount of currents flowing from the source impurity region 135 to the drain impurity region 136, i.e. in the direction from "G" to "H" as indicated with an arrow in FIG. 32A. Such a structure is utilized in NAND-type EEPROMs, NOR-type EEPROMs or the like.

A cross-sectional view of FIG. 32A taken along the "G-H" line is illustrated in FIG. 32B. The gate electrode 132 is formed on a semiconductor substrate 137, and the source diffusion layer 135 and the drain diffusion layer 136 are respectively formed inside the semiconductor substrate 137 on both sides thereof. This gate electrode 132 comprised of a lower first gate 138 and a second gate 139 disposed thereon. The gate electrode 132 is stacked on a gate insulating film comprised of a tunnel insulating film 140, a data retention insulating film (a charge storing region) 141 and a block insulating film 142. Gate sidewall insulating films 143 are provided on side faces of the gate electrode 132. Here, a width of the data retention insulating film 141 is formed greater than a width of the gate electrode 132, as equivalent to thicknesses of the gate sidewall insulating films 143.

Moreover, a cross-sectional view of FIG. 32A taken along the "I-J" line is illustrated in FIG. 32C. Element isolation trenches 145 are provided in the semiconductor substrate 137, and the element isolation regions 130 are formed in the element isolation trenches 145. The gate insulating film comprised of the tunnel insulating film 140, the data retention insulating film 141 and the block insulating film 142, and the first gate 138 are formed in a space between the element isolation regions 130. On this block insulating film 142, the second gate 139 is formed extending over the element isolation regions 130. Here, the width of the data retention insulating film 141 is formed greater than a width of the first gate 138 such that the data retention insulating film 141 protrudes into the element isolation regions 130.

In this memory cell, an unillustrated well of a low-density impurity region is formed at an upper part of the semiconductor substrate 137. The tunnel insulating film 140 of a silicon oxide film, a silicon oxynitride film or the like is formed in a film thickness from about 1 to 15 nm, for example, on the semiconductor substrate 137. In addition, the data retention insulating film 141 of an insulating film such as a silicon nitride film, a silicon oxynitride film, a $Ta_2O_5$ film, a $TiO_2$ film or an $Al_2O_3$ film is formed in a film thickness from about 3 to 30 nm, for example, on the tunnel insulating film 140. Furthermore, the block insulating film 142 of a silicon oxide film, a silicon oxynitride film or the like is formed in a thickness from about 1 to 15 nm, for example, on the data retention insulating film 141. On the block insulating film 142, formed is the gate electrode 132 in a thickness from 10 nm to 500 nm, which is comprised of any of, for example: a stacked structure of polysilicon or tungsten silicide (WSi) with polysilicon; a stacked structure of NiSi, MoSi, TiSi or CoSi with polysilicon; a stacked structure of metal with polysilicon; and a single layer structure of a metal compound of silicon or metal.

Next, description will be made regarding operations of the semiconductor device of this embodiment. The transistors shown in FIGS. 32A to 32C constitute a memory cell. An erasing operation is conducted in a manner that high voltage (from 10 to 25 V, for example) is applied to the semiconductor substrate in a state where the gate electrode is set to 0 V, for example, thereby injecting holes from the semiconductor substrate into the charge storing region. Otherwise, the erasing operation is conducted in a manner that drain electric potential is negatively biased with respect to source electric potential, thereby generating hot holes accelerated by a channel, and further, that the gate electrode is negatively biased with respect to the source electric potential, thereby injecting the hot holes into the charge storing region. Yet otherwise, the erasing operation is conducted in a manner that the source electric potential and the drain electric potential are positively biased with respect to well electric potential, thereby generating hot holes at a junction between the impurity region and the well, and further, that the gate electrode is negatively biased with respect to the well electric potential, thereby injecting the hot holes into the charge storing region.

A writing operation is conducted in a manner that high voltage (from 10 to 25 V, for example) is applied to the gate electrode in a state where the semiconductor substrate is set to 0 V, for example, thereby injecting electrons from the semiconductor substrate into the charge storing region. Otherwise, the writing operation is conducted in a manner that the drain electric potential is positively biased with respect to the source electric potential, thereby generating hot electrons accelerated by a channel, and further, that the gate electrode is positively biased with respect to the source electric potential, thereby injecting the hot electrons into the charge storing region.

In a reading operation, a bit line connected with a drain contact is pre-charged and then made to be in a floating mode, and then the voltage of the gate electrode is set to read voltage Vref and a source line is set to 0 V. Thereafter, the bit line detects as whether or not a current flows in the memory cell. In other words, in the writing mode where a threshold Vth of the memory cell is greater than Vref, the memory cell is turned off and the bit line retains the pre-charged electric potential. To the contrary, in the erasing mode where the threshold Vth of a selected memory cell is smaller than Vref, the memory cell is turned on and the electric potential of the bit line is decreased from the pre-charged electric potential by ΔV. Data in the memory cell is read out by detecting such changes in electric potential with a sense amplifier.

As shown in FIG. 32A, the element regions 131 are formed on the semiconductor substrate on both sides of the gate electrode 132, and stored data is discriminated in the event of data reading, in accordance with an amount of currents flowing in a direction perpendicular to gate edges (the direction of the "G-H" line). Here, as shown in FIG. 32B, the data retention insulating film 141 has a shape of protrusion with respect to the gate electrode 132. Here, a degree of protrusion is from about 0.5 nm to 10 nm. Here, an effect cannot be obtained if the degree of protrusion is small. Problems occur during the fabricating processes if the degree of protrusion is too large; therefore, excessive protrusion is unsuitable for downsizing.

Moreover, as shown in the cross section in FIG. 32C, the element isolation trenches 145 are formed by self-alignment with respect to the gate electrode 132, and to the tunnel insulating film 140 as well as the block insulating film 142 in the gate insulating film. Here, the data retention insulating film 141 protrudes with respect to the first gate 138 in the gate electrode and to the semiconductor substrate 137, whereby both edges thereof constitute a shape of intruding into the element isolation trenches 145.

As described above, in the semiconductor device of this embodiment, the data retention insulating film protrudes with respect to the gate electrode, the semiconductor substrate or the both. Accordingly, protruding portions of the data retention insulating film are used as neither the charge storing region nor the gate insulating film of the memory cell transistor.

The edge portions of the data retention insulating film possess inferior charge retention owing to fabrication damage in comparison with the central portion thereof. However, as the charge retention characteristics in these regions do not affect the charge retention characteristic of the memory cell, a highly reliable non-volatile semiconductor memory device can be achieved. Here in the cross section shown in FIG. 32B, the memory cell is divided into three regions of edge portions [1] and [3] and a central portion [2]. Furthermore, in the cross section shown in FIG. 32C, the memory cell is divided into three regions of edge portions [4] and [6] and a central portion [5]. Here, since the characteristics of the charge storing insulating film at the edge portions [1], [3], [4] and [6] are the same as those in the central portions [2] and [5], deterioration of reliability attributable to the edge portions does not occur therein. As described above, lengths of protrusions are designed to have values greater than the depths of invasion of the fabrication damage, so that the characteristics at the edge portions [1], [3], [4] and [6] become equal to the characteristics at the central portions [2] and [5].

Here, particularly, the above-described effect is largely attributable to the fact that the data retention insulating film has a shape of protrusion at two sides (the two sides in contact with edges of the element isolation regions) parallel to the direction of currents flowing between the source and the drain (the "G-H" direction in FIG. 32A). It is ascribed to the fact that the regions [4] and [6] in FIG. 32C are disposed parallel to the central portion [5] between the source and the drain; therefore, escape of electric charges from the portions [4] and [6] should be avoided in particular because decreases in thresholds at those portions owing to the escape of electric charges are detected as a decrease in a threshold of the memory cell as a whole.

Whereas the respective regions shown in the cross section of FIG. 32B can be expressed as a circuit diagram using transistors as shown in FIG. 33A, such a diagram is also expressed with one transistor as shown in FIG. 33B because the characteristics in the respective regions [1], [2] and [3] are equal. Moreover, whereas the respective regions shown in the cross section of FIG. 32C can be expressed as a circuit diagram using transistors as shown in FIG. 33C, such a diagram is also expressed with one transistor as shown in FIG. 33D because the characteristics in the respective regions [4], [5] and [6] are equal.

Here, FIG. 34 shows an example of an enlarged view of the cross section shown in FIG. 32C. An element isolation sidewall insulating film 146 is formed between the semiconductor substrate 137 under the first gate electrode 143 and the element isolation region 130. Moreover, a polysilicon sidewall oxide film 147 is formed between a side face of the first gate electrode 138 and the element isolation region 130. Furthermore, at an edge 148 where the second gate electrode 139 contacts with the polysilicon sidewall oxide film 147 and the element isolation region 130, the second gate electrode 139 intrudes toward the direction of the semiconductor substrate 137. As in the drawing, the data retention insulating film 142 protrudes from the first gate electrode 138 toward the direction of the element isolation region 130 as equivalent to the thickness of the polysilicon sidewall oxide film 147. Moreover, the data retention insulating film 142 protrudes from the semiconductor substrate 137 toward the direction of the element isolation region 130 as equivalent to the thickness of the element isolation sidewall oxide film 146.

The both edges of the data retention insulating film protrude with respect to both of the gate electrode and the semiconductor substrate in this embodiment. However, the edges of the data retention insulating film may protrude with respect only to any one of the gate electrode or the semiconductor substrate. In other words, any one of the "I-J" cross section in FIG. 32B and the "G-H" cross section in FIG. 32C may be adopted, while the other may remain as the prototype of this embodiment. Moreover, the data retention insulating film of this embodiment protrudes with respect to all the four sides that define the element region of the memory cell transistor. However, it is satisfactory if the data retention insulating film possess the shape of protrusion at one side at least out of the four sides or preferably at two sides parallel to the direction of currents flowing between the source and the drain.

As described above, data retention characteristics of a MONOS non-volatile memory cell can be enhanced by forming a data retention insulating film thereof so as to protrude from a gate electrode thereof.

In addition, as the data retention insulating film has the shape of protrusion with respect to the gate electrode, the edges of the data retention insulating film suffered from fabrication damage do not have to be used as the charge storing region or as the gate insulating film of the transistor. Accordingly, reliability of the memory cell is enhanced. Above all, when the data retention insulating film has a shape of protrusion at two sides (the two sides in contact with edges of the element isolation regions) parallel to the direction of currents flowing between the source and the drain (the "I-J" direction in FIG. 32C), decline in thresholds can be prevented and the effects of improving the data retention characteristics become significant.

According to the semiconductor device of this embodiment, the channel portion can be protected from damage caused during the fabricating processes, if the both edges of the charge storing region protrude with respect to the gate electrode under the gate sidewall insulating films and protrude with respect to the semiconductor substrate at the channel edges.

As described above, since the charge storing region protrudes with respect to the gate electrode or the semiconductor substrate, the edges of the insulating film damaged by fabrication and deteriorated in the charge retention characteristics are not used as either the charge storing region or the gate insulating film. Accordingly, reliability of the memory cell is enhanced.

As the semiconductor device of this embodiment includes the data retention insulating films disposed in parallel to the direction of the flow of reading currents with the edges thereof shaped so as to protrude with respect to the gate electrode or to the semiconductor substrate, detection of the decrease in the threshold of the memory cell is prevented, the decrease being attributable to the decreases in the thresholds at the edges of the data retention insulating film.

It should be noted that the effect of the semiconductor device of this embodiment can be also obtained in the case where the semiconductor device is designed in the shape as illustrated in FIG. 2 and FIG. 3 of the first embodiment.

Next, description will be made regarding one example of a method of fabricating the semiconductor device of this embodiment with reference to FIG. 35 to FIG. 43. Throughout FIG. 35 to FIG. 43, drawings suffixed with "A" correspond to the cross section taken along the "I-J" line in FIG. 32A, and drawings suffixed with "B" correspond to the cross section taken along the "G-H" line in FIG. 32A, respectively.

First, a sacrificial oxide film (not shown) is formed on the semiconductor substrate 137, then implantation of channel impurities or well impurities is performed and the sacrificial oxide film is exfoliated thereafter.

Next, as shown in FIG. 35A and FIG. 35B, formed serially on the semiconductor substrate 137 are the tunnel insulating film 140 of a silicon oxide film, a silicon oxynitride film or the like in a thickness from about 1 to 15 nm, for example, and the data retention insulating film 141 of a silicon nitride film, a silicon oxynitride film, or an insulating film such as $Ta_2O_5$, $TiO_2$ or $Al_2O_3$ in a thickness from about 3 to 30 nm, for example. Moreover, formed is the block insulating film 142 of a silicon oxide film, a silicon oxynitride film or the like in a thickness from about 1 to 15 nm, for example. Furthermore, the first gate electrode of polysilicon or the like, for example, is deposited thereon in a thickness from about 10 to 100 nm. In addition, an insulating film of a silicon nitride film or the like is deposited in a thickness from about 10 to 200 nm, thus forming a mask material 150.

Next, in the step shown in FIG. 36A and FIG. 36B, patterning for the element isolation regions is performed with photolithography, and then the mask material 150, the first gate electrode 138, the block insulating film 142, the data retention insulating film 141, the tunnel insulating film 140 and the semiconductor substrate 137 are processed with anisotropic etching to form element isolation trenches 151. Here, depths of the element isolation trenches to be formed are set in a range from about 50 nm to 300 nm, for example. Note that the element isolation trenches are not formed in the cross section shown in FIG. 36B.

Next, as shown in FIG. 37A, sidewalls of the first gate electrode 138 are oxidized, thus forming gate sidewall insulating films 152. The thickness of the first gate electrode 138 to be oxidized in this step is set from about 0.5 nm to 15 nm. Such a value is selected from a range of values at which damage caused by fabrication does not invade the data retention insulating film 141. Note that such oxidation is not performed in the cross section shown in FIG. 37B.

In this event, conditions for oxidation are adjusted such that sidewall portions of the element isolation trenches 151 of the semiconductor substrate 137 are also oxidized to form element isolation sidewall insulating films 153, but the data retention insulating film 141 is not oxidized. In the case where polysilicon is used for the first gate electrode 138, for example, and single crystal silicon is used for the semiconductor substrate 137 that constitutes the sidewalls of the element isolation trenches 151, then the conditions for oxidation can be set up by use of a difference in oxidation rates therebetween. Degrees of protrusions of the data retention insulating film 141 are decided by an amount of oxidation at the sidewalls of the first gate electrode 138 and an amount of oxidation at the sidewalls of the element isolation trenches 151. In other words, the degree of protrusion of the data retention insulating film 141 with respect to the first gate electrode 138 is decided by a receding amount on the side face of the first gate electrode 138 attributable to formation of the gate sidewall insulating films 152 on the side faces of the first gate electrode 138. In the meantime, the degree of protrusion of the data retention insulating film 141 with respect to the semiconductor substrate 137 is decided by a receding amount on the side of the semiconductor substrate 137 attributable to formation of the element isolation sidewall insulating film 153 on the side of the element isolation trenches 151.

The oxide film on the sidewalls of the element isolation trenches formed herein is an oxide film of the single crystal silicon constituting the semiconductor substrate. Therefore, the oxide film has a feature of relatively high hardness. It should be noted that the conditions for oxidation may be also applied so as to oxidize only the sidewalls of the first gate electrode 138 or only the sidewall portions of the element isolation trenches 151 of the semiconductor substrate 137. As a result of the receding of the first gate electrode 138 and/or the semiconductor substrate 137 by oxidation as described above, both edges of the data retention insulating film 141 are formed to have shapes protruding with respect to any one of the first gate electrode 138 and the semiconductor substrate 137, or with respect to both of the first gate electrode 138 and the semiconductor substrate 137.

Here, burying of silicon oxide films into the element isolation trenches 151 in a subsequent step can be facilitated by using a condition for etching to allow the data retention insulating film 141 to form a forward taper. As for an angle of the forward taper, the angle is preferably set in a range from 60° to 89° regarding an upper plane of the semiconductor substrate 137 as a standard.

Next, as shown in FIG. 37A, the structure in which the first gate electrode sidewall insulating film 152 protrudes more than the data retention insulating film 141 owing to the oxidation of the first gate electrode made of polysilicon is desirable for reducing damage on the data retention insulating film 141 upon burying of the element isolation insulating films by HDP-SiO$_2$ to be described later, for example, and for forming a device structure of higher reliability. Moreover, the structure in which the element isolation sidewall insulating film 153 protrudes toward the element isolation trenches 151 more than the data retention insulating film 141 owing to the oxidation of the semiconductor substrate 137 can facilitate burying of silicon oxide films into the element isolation trenches 151 in the subsequent step.

Here, it is desirable in terms of reliability that the both edges of the data retention insulating film 141 protrude from the semiconductor substrate 137 within a range from 0.5 nm to 15 nm inclusive, and the thickness of the oxide film formed on inner walls of the element isolation regions 151 is desirably formed in a range from 1 nm to 16 nm inclusive.

The mode for allowing the first gate electrode 138 and the semiconductor substrate 137 to recede with respect to the data retention insulating film 141 is not limited to oxidation, but etching back by means of wet etching or the like may be also adopted. Furthermore, damage on the data retention insulating film upon burying of the element isolation insulating films by high-density plasma (HDP)-SiO$_2$ to be described later may be reduced by depositing tetraethoxysilane (TEOS) or high-temperature oxide (HTO), for example, thicker than the degree of protrusion of the data retention insulating film 141. In this case, it is essential that the data retention insulating film is not etched. A combination of oxidation and wet etching or the like is also applicable. Moreover, the element isolation trenches may be also formed by etching the first gate insulating film and the semiconductor substrate with a sidewall insulating film as a mask, which is formed by depositing an insulating film such as a silicon oxide film in a thickness from 5 to 50 nm, for example, and then by etching back the insulating film by anisotropic etching.

Figures 38A, 38B:
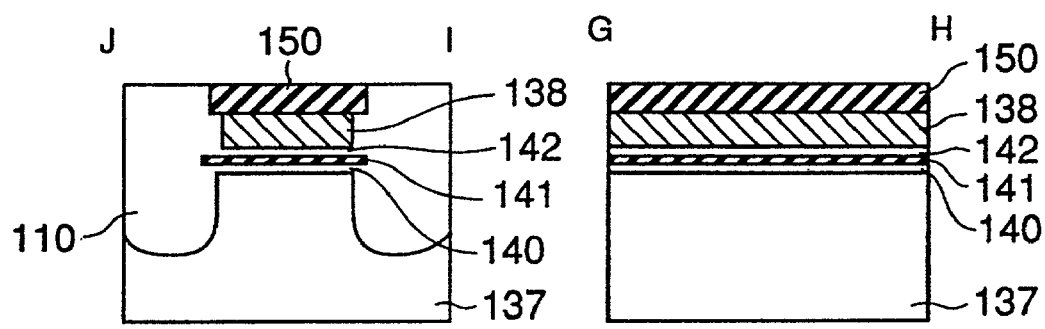
FIG. 38A is a cross-sectional view showing one step of the method of fabricating the semiconductor device according to the third embodiment, corresponding to the cross section taken along the "I-J" line of FIG. 32A.
FIG. 38B is a cross-sectional view showing one step of the method of fabricating the semiconductor device according to the third embodiment, corresponding to the cross section taken along the "G-H" line of FIG. 32A.

Next, as shown in FIG. 38A, the element isolation trenches 151 are buried according to a method of depositing a silicon oxide film and the like such as HDP-SiO$_2$ or TEOS, and then planarization is conducted by the CMP method, whereby the element isolation regions 110 are formed. Here, the silicon oxide film to be buried therein has a feature of relatively low hardness in comparison with the single crystal silicon oxide film.

Figures 39A, 39B:
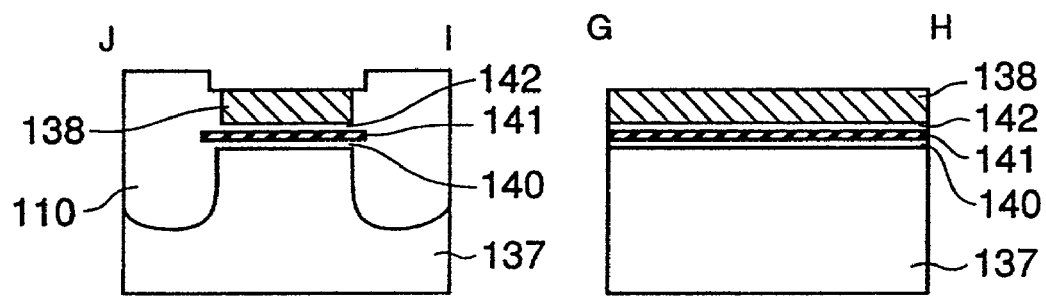
FIG. 39A is a cross-sectional view showing one step of the method of fabricating the semiconductor device according to the third embodiment, corresponding to the cross section taken along the "I-J" line of FIG. 32A.
FIG. 39B is a cross-sectional view showing one step of the method of fabricating the semiconductor device according to the third embodiment, corresponding to the cross section taken along the "G-H" line of FIG. 32A.

Next, as shown in FIGS. 39A and 39B, the mask material 150 which is a CMP stopper is removed by wet etching.

Figures 40A, 40B:
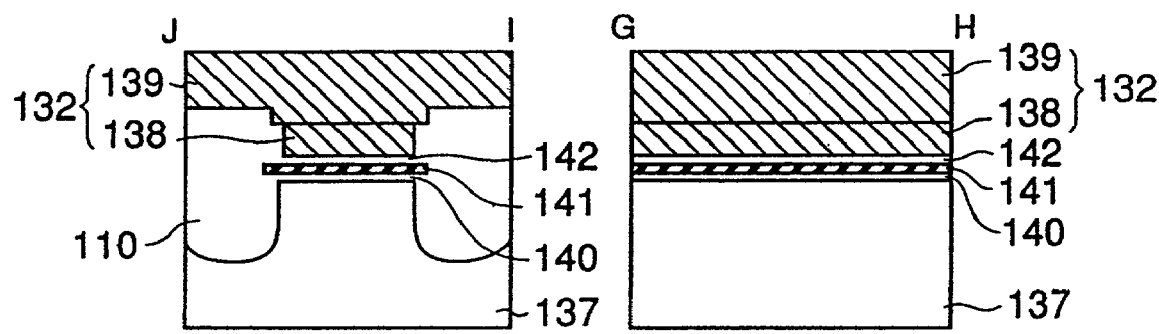
FIG. 40A is a cross-sectional view showing one step of the method of fabricating the semiconductor device according to the third embodiment, corresponding to the cross section taken along the "I-J" line of FIG. 32A.
FIG. 40B is a cross-sectional view showing one step of the method of fabricating the semiconductor device according to the third embodiment, corresponding to the cross section taken along the "G-H" line of FIG. 32A.

Next, as shown in FIGS. 40A and 40B, deposited is the second gate electrode 139 comprised of any of, for example: a stacked structure of polysilicon or tungsten silicide (WSi) with polysilicon; a stacked structure of a metal compound of silicon such as NiSi, MoSi, TiSi or CoSi with polysilicon; a stacked structure of metal with polysilicon; a single layer structure of a metal compound of silicon or metal such as W, Al and Cu; and a single layer structure of polysilicon. In combination of the first gate electrode 138 and the second gate electrode 139, the gate electrode 132 of the memory cell is completed.

Next, as shown in FIGS. 41A and 41B, a pattern for the gate is formed by photolithography, and the gate electrode is etched by anisotropic etching. In accordance with FIG. 41B, the block insulating film 142 is exposed and the gate electrode 132 is partially formed. In accordance with the cross section shown in FIG. 41A, the gate electrode 132 is not etched. In this step, the data retention insulating film 141 is not etched. Here, the block insulating film 142 on the data retention insulating film 141 is acceptable regardless of whether it is etched or not.

Next, after a thermal treatment is performed as necessary for recovery from etching damage, as shown in FIG. 42B, an insulating film of a silicon oxide film or the like is deposited in a thickness from about 5 to 50 nm, for example, and is etched back by anisotropic etching, thus forming the sidewall insulating film 143. In this event, the data retention insulating film 141 is also etched while using the sidewall insulating film 143 as a mask. As a result, the data retention insulating film 141 is formed into a shape of protrusion, as equivalent to the thickness of the sidewall insulating film 143, with respect to the gate electrode 132. Here, since the thickness of the sidewall insulating film 143 corresponds to the thickness of deposition. Accordingly, the thickness of the sidewall insulating film 143 is controlled by adjustment of the thickness of deposition. Otherwise, the sidewall insulating film 143 may be formed by oxidation of the gate polycrystalline silicon instead of deposition. In this case, the thickness of the sidewall insulating film 143 is adjusted by an amount of oxidation.

Next, as shown in FIG. 43B, impurities for diffusion layers are doped, whereby the source impurity region 135 and the drain impurity region 136 are formed. In addition, as shown in FIGS. 43A and 43B, an interlayer insulating film 144 is deposited. Furthermore, contact plugs 133 and 134 are formed inside the interlayer insulating film 144, and after the step of forming metal wiring (not shown), the nonvolatile memory cell is completed.

According to the method of fabricating a semiconductor device of this embodiment, a channel width is defined by the first gate electrode 138, and a channel length is defined by the second gate electrode 139, whereby an area of the data retention insulating film 141 forming the memory cell can be decided by two steps of lithography. In addition, linear patterns are usable in the two steps of lithography. Therefore, affecting factors attributed to variation of dimensions with respect to characteristics of a memory can be reduced according to this embodiment, in comparison with a floating-gate non-volatile semiconductor memory device that depends largely on dimensions of lithography for a floating gate as well as a control gate besides the channel width and the channel length. Accordingly, this embodiment is capable of further stabilizing writing voltage or erasing voltage per memory cell, thus enhancing reliability.

In the meantime, the data retention insulating film 141 is not formed in the portions where the first gate electrode 138 is not formed. Therefore, injection of electric charges from the second gate electrode 139 into the data retention insulating film 141 formed thereunder during fabrication of the electrode or during operation is not caused as in the case where the data retention insulating film 141 is formed under the second gate electrode 139, for example. Accordingly, problems attributable to the foregoing do not occur in this embodiment, such as uneven voltage-withstanding characteristics among channels between adjacent memory cells or current leakages.

This embodiment provides a highly reliable semiconductor device, in which deterioration of charge retention characteristics is suppressed at two edges on two sides parallel to a direction of a flow of a source-drain current out of four sides that define an element region.

MODIFIED EXAMPLE OF THIRD EMBODIMENT

Figure 44:
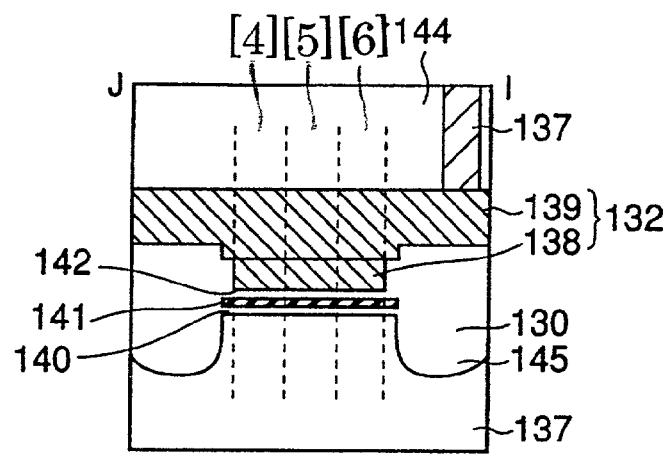
FIG. 44 is a cross-sectional view showing a semiconductor device according to a modified example of the third embodiment, corresponding to a part of a cross section taken along the "I-J" line of FIG. 32A.

This modified example has a constitution of the semiconductor device according to the third embodiment, including a structure shown in FIG. 44 instead of the structure of the cross section shown in FIG. 32C. Here, disclosed is a structure in which lower parts of the element isolation regions are not formed on lower sides of the data retention insulating film 141.

Figure 45:
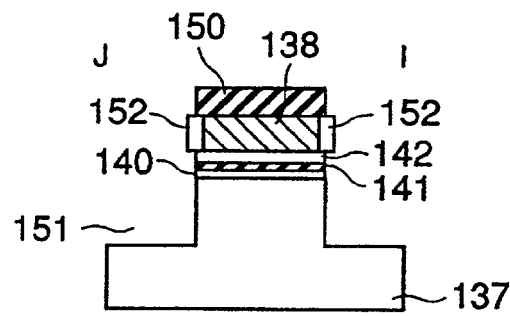
FIG. 45 is a cross-sectional view showing one step of a method of fabricating the semiconductor device according to the modified example of the third embodiment, corresponding to the cross section taken along the "I-J" line of FIG. 32A.

A method of fabricating a semiconductor device of this modified example is different from the third embodiment in the steps described in FIG. 37 and thereafter, only in accordance with the cross section taken along the "I-J" line. As the steps seem similar to those of the third embodiment in accordance with the cross section taken along the "G-H" line, illustration and description thereof will be omitted. Specifically, subsequent to the step shown in FIG. 36A, in the step of forming the gate sidewall insulating films after forming the element isolation trenches 151, the gate sidewall insulating films 152 are formed without performing oxidation on the sidewalls of the element isolation regions 151 as shown in FIG. 45.

Figure 46:
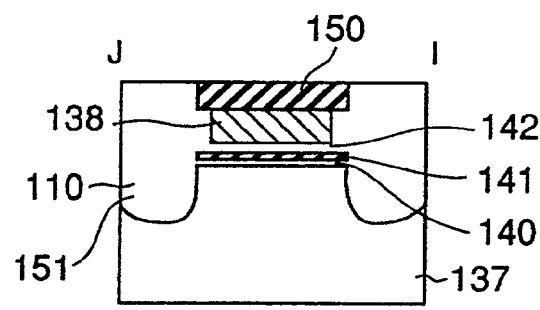
FIG. 46 is a cross-sectional view showing one step of the method of fabricating the semiconductor device according to the modified example of the third embodiment, corresponding to the cross section taken along the "I-J" line of FIG. 32A.

Next, as shown in FIG. 46, the element isolation trenches 151 are, for example, buried by a method of depositing a silicon oxide film and the like such as HDP-$SiO_2$ or TEOS, and then planarization is conducted by the CMP method, whereby the element isolation regions 110 are formed. Here, the silicon oxide film to be buried therein has a feature of relatively low hardness in comparison with the single crystal silicon oxide film.

Figure 47:
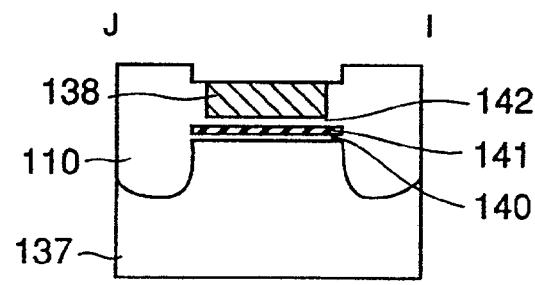
FIG. 47 is a cross-sectional view showing one step of the method of fabricating the semiconductor device according to the modified example of the third embodiment, corresponding to the cross section taken along the "I-J" line of FIG. 32A.

Next, as shown in FIG. 47, the mask member 150 which is a CMP stopper is removed by wet etching.

Figure 48:
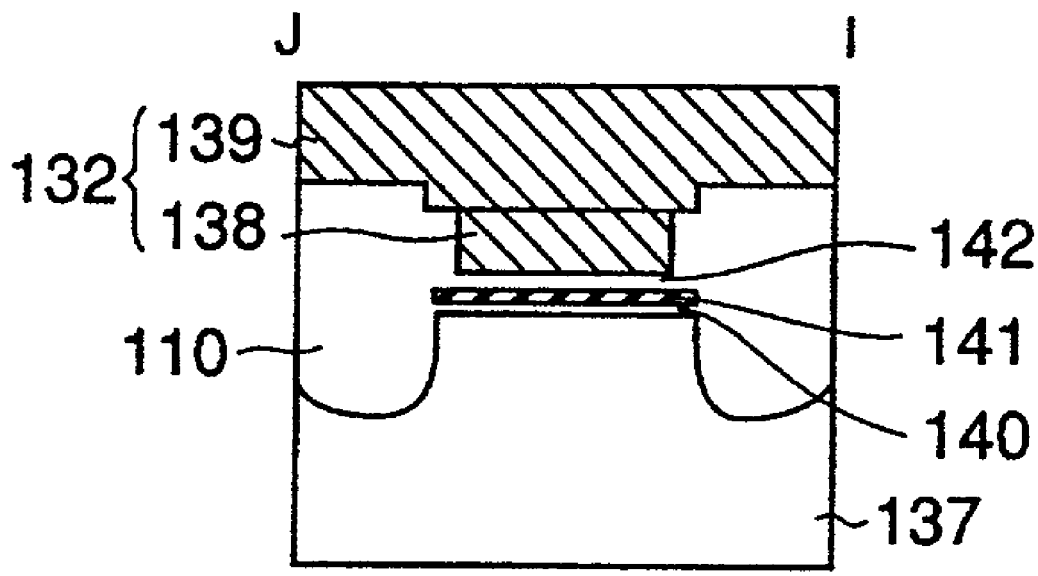
FIG. 48 is a cross-sectional view showing one step of the method of fabricating the semiconductor device according to the modified example of the third embodiment, corresponding to the cross section taken along the "I-J" line of FIG. 32A.

Next, as shown in FIG. 48, deposited is the second gate electrode 139 comprised of any of, for example: a stacked structure of polysilicon or tungsten silicide (WSi) with polysilicon; a stacked structure of a metal compound of silicon such as NiSi, MoSi, TiSi or CoSi with polysilicon; a stacked structure of metal with polysilicon; a single layer structure of a metal compound of silicon or metal such as w, Al and Cu; and a single layer structure of polysilicon. In combination of the first gate electrode 138 and the second gate electrode 139, the gate electrode 132 of the memory cell is completed.

Figure 49:
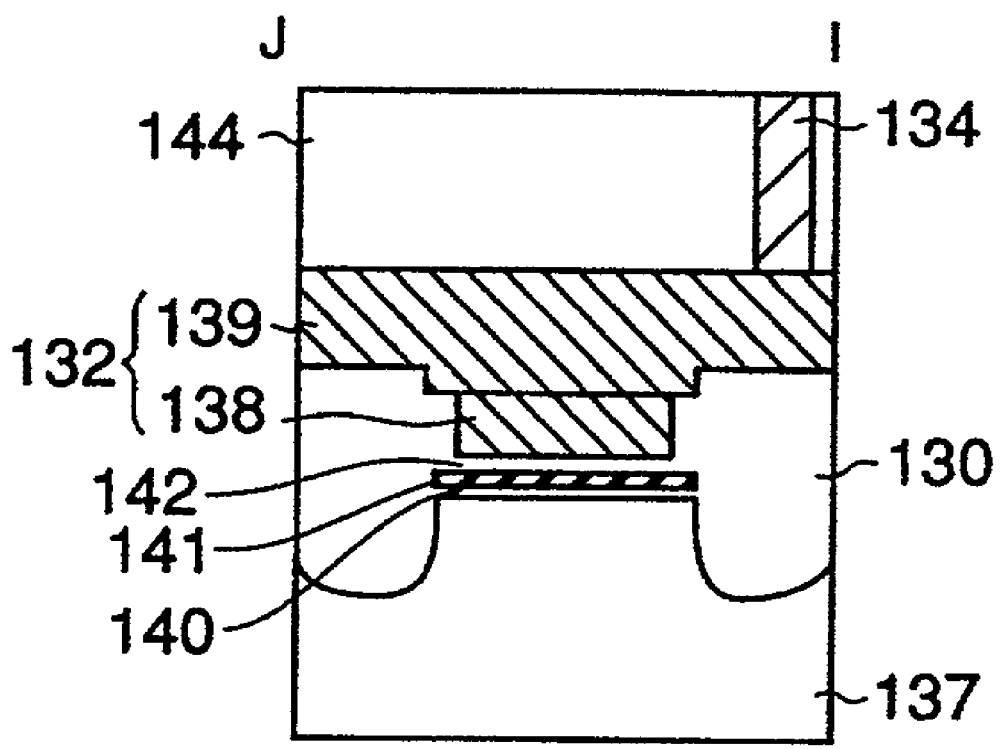
FIG. 49 is a cross-sectional view showing one step of the method of fabricating the semiconductor device according to the modified example of the third embodiment, corresponding to the cross section taken along the "I-J" line of FIG. 32A.

Next, as shown in FIG. 49, the interlayer insulating film 144 is deposited. Furthermore, the contact plug 134 is formed inside the interlayer insulating film 144, and after the step of forming metal wiring (not shown), the non-volatile memory cell is completed.

As described above, by omitting provision of the element isolation sidewall insulating film, the data retention insulating film 141 can be formed into a shape protruding only with respect to the first gate electrode 138 but not protruding with respect to the semiconductor substrate 137. The effect similar to the third embodiment can be also obtained in this modified example.

FOURTH EMBODIMENT

Figure 50A:
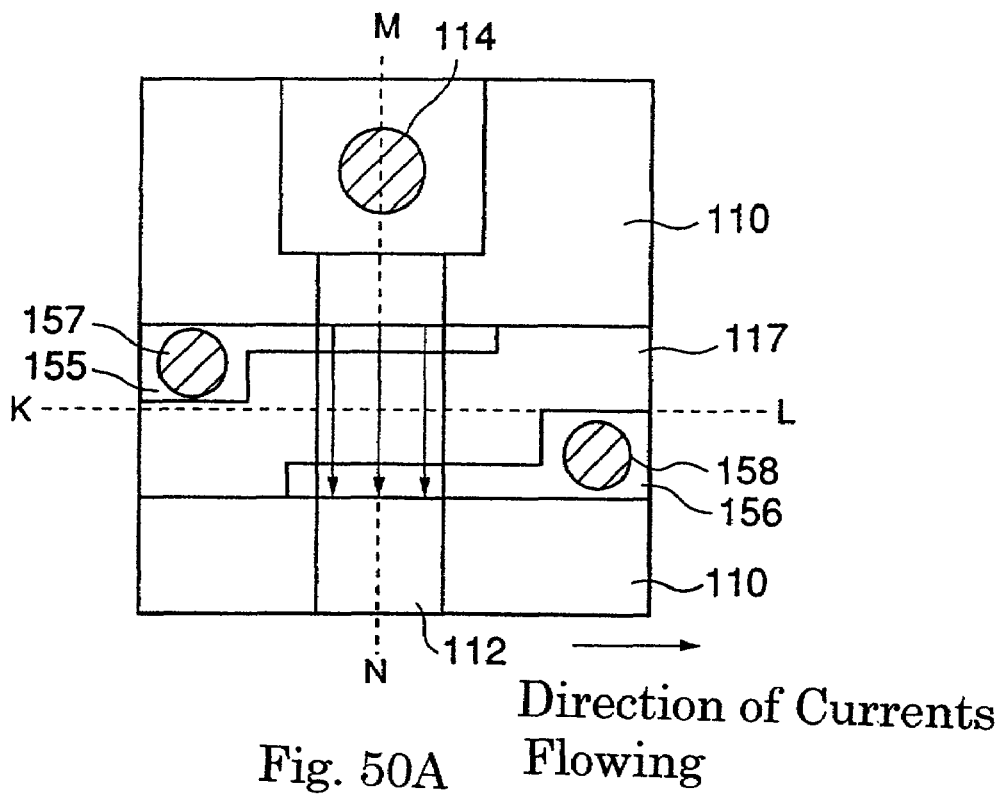
FIG. 50A is a top plan view of a semiconductor device of a prototype of a fourth embodiment.
Figures 50B, 50C:
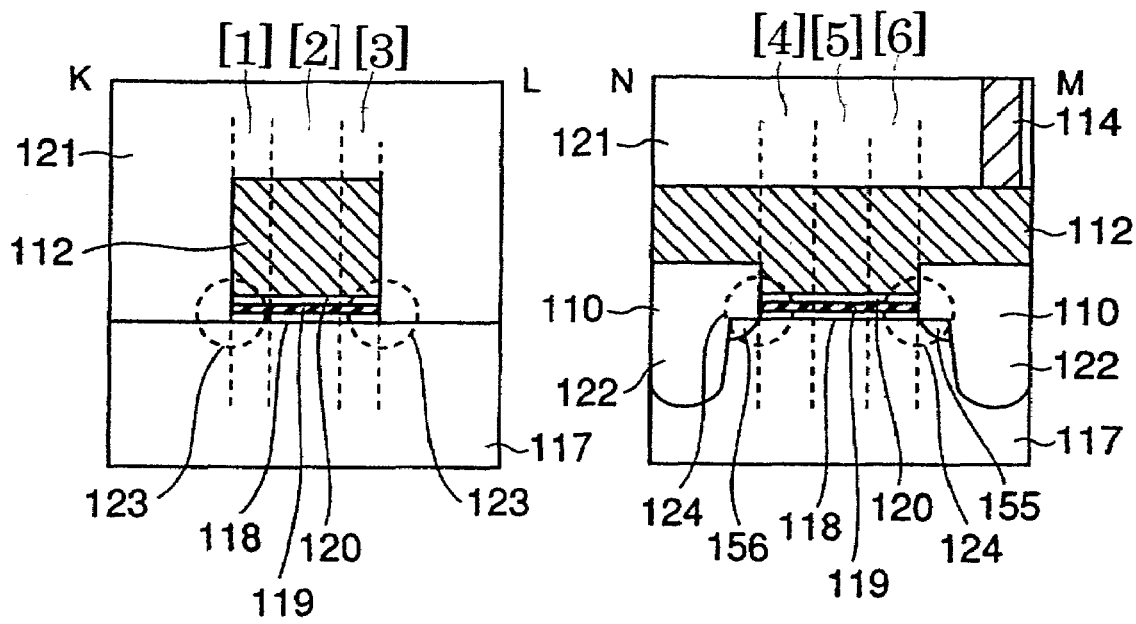
FIG. 50B is a cross-sectional view taken along the "K-L" line of FIG. 50A showing the semiconductor device of the prototype of the fourth embodiment.
FIG. 50C is a cross-sectional view taken along the "M-N" line of FIG. 50A showing the semiconductor device of the prototype of the fourth embodiment.

A MONOS memory cell using self-aligned STI, which is a prototype of this embodiment, is illustrated in FIGS. 50A to 50C. A top plan view of the prototype of this embodiment is illustrated in FIG. 50A, in which a source impurity region 155 is formed linearly in the right-and-left direction in a part of the semiconductor substrate 117 while contacting with one of the element isolation regions 110. A part of the source impurity region 155 has a greater width and a source contact 157 is formed therein. Opposite to the source impurity region 155, a drain impurity region 156 is formed linearly in the right-and-left direction in a part of the semiconductor substrate 117 while contacting with the other element isolation region 110. A part of the drain impurity region 156 has a greater width and a drain contact 158 is formed therein.

As perpendicular to the longitudinal direction of the source impurity region 155 and the drain impurity region 156, a gate electrode 112 is formed. A wide region is provided at an edge of the gate electrode 112 and a gate contact 114 is provided therein. In this memory cell, the source impurity region 155 and the drain impurity region 156 are provided right under the gate electrode 112. In the event of reading data, a writing mode and an erasing mode are discriminated in accordance with an amount of currents flowing from the source impurity region 155 to the drain impurity region 156, i.e. in the direction from "M" to "N" as indicated with an arrow in FIG. 50A. Such a structure is utilized in AND-type EEPROMS, DINOR-type EEPROMs or the like.

A cross-sectional view of FIG. 50A taken along the "K-L" line is illustrated in FIG. 50B. The gate electrode 112 is formed on the semiconductor substrate 117. The gate electrode 112 is stacked on a gate insulating film comprised of a tunnel insulating film 118, a data retention insulating film (a charge storing region) 119 and a block insulating film 120. An interlayer insulating film 121 is formed on surfaces of the semiconductor substrate 117 and the gate electrode 112.

Moreover, a cross-sectional view of FIG. 50A taken along the "M-N" line is illustrated in FIG. 50C. Element isolation trenches 122 are provided in the semiconductor substrate 117, and the element isolation regions 110 are formed in the element isolation trenches 122. The gate insulating film comprised of the tunnel insulating film 118, the data retention insulating film 119 and the block insulating film 120 is formed in a space between the element isolation regions 110. On this block insulating film 120, the gate electrode 112 is formed extending over the element isolation regions 110. The element isolation trenches 122 are not provided in the semiconductor substrate 117 at edges of the tunnel insulating film 118, but the source impurity region 155 and the drain impurity region 156 are provided instead while contacting with the element isolation regions 110.

In the method of fabricating a memory cell shown in FIG. 50B and FIG. 50C, edges of the data retention insulating film are exposed to plasma of anisotropic etching in the events of etching fabrication for forming the element isolation trenches or etching fabrication for the gate electrode and the gate insulating film. Accordingly, there may be cases where the data retention insulating film suffers from fabrication damage at edges of the element isolation regions and gate edges, whereby charge retention at the edges of the data retention insulating film is deteriorated and reliability of the memory cell is damaged.

When the memory cell includes the structure shown in FIGS. 50A to 50C, there may be a case where deterioration of characteristics of the data retention insulating film particularly at the edges of the element isolation regions becomes a critical problem. Such a case will be described in the following. In the cross section shown in FIG. 50B, the memory cell transistor is divided into three regions of [1], [2] and [3]. Here, the regions [1] and [3] of the data retention insulating film are damaged edge regions 123. Similarly in the cross section shown in FIG. 50C, the memory cell transistor is divided into three regions of [4], [5] and [6]. Here, the regions [4] and [6] of the data retention insulating film are damaged edge regions 124.

Figure 51A:
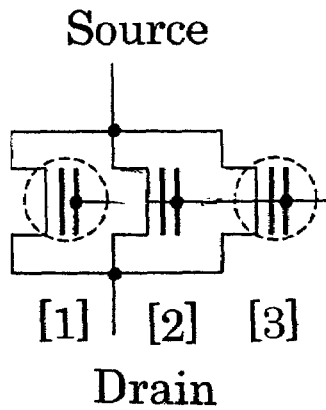
FIG. 51A is an equivalent circuit diagram corresponding to the cross section of FIG. 50B relevant to the semiconductor device of the prototype of the fourth embodiment.
Figure 51B:
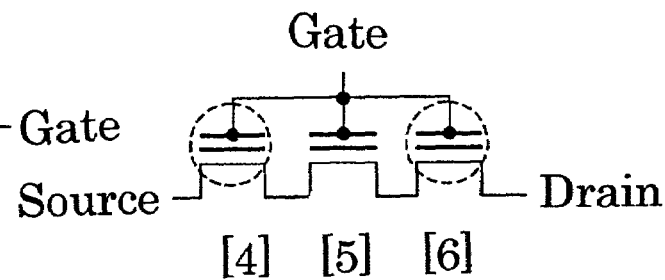
FIG. 51B is an equivalent circuit diagram corresponding to the cross section of FIG. 50C relevant to the semiconductor device of the prototype of the fourth embodiment.
Figure 51C:
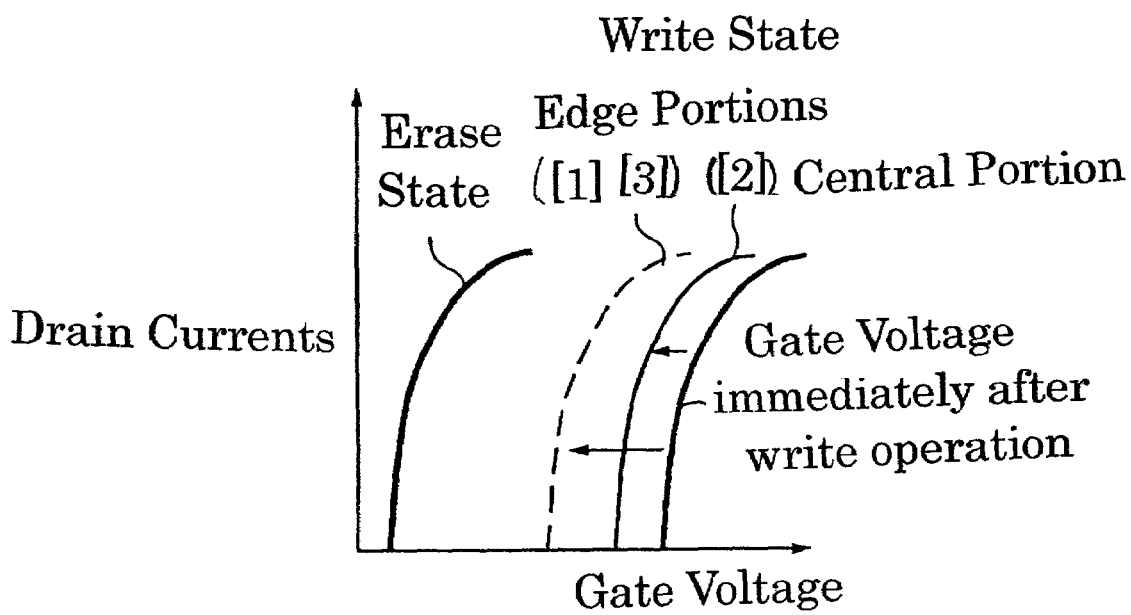
FIG. 51C is a graph showing characteristics between drain currents and gate voltage of the semiconductor device corresponding to the prototype of the fourth embodiment.

Here, a state of a raised threshold (a state of writing) by trapping electrons in the data retention insulating film is assumed. FIG. 51A shows a circuit diagram of transistors corresponding to the cross section of FIG. 50B. FIG. 51B shows a circuit diagram of transistors corresponding to the cross section of FIG. 50C. FIG. 51C is a graph showing variations of characteristics between currents and voltage in each state of the data retention insulating film, in which gate voltage is indicated by the transverse axis and drain currents are indicated by the longitudinal axis. In the circuit diagram shown in FIG. 51A, illustrated is a composition of three transistors [1], [2] and [3] connected in parallel between a source and a drain while gates thereof are mutually connected. The transistors [1], [2] and [3] correspond to the memory cell transistor regions [1], [2] and [3] in FIG. 50B, respectively. Moreover, in the circuit diagram shown in FIG. 51B, illustrated is a composition of three transistors [4], [5] and [6] connected in series between the source and the drain while gates thereof are mutually connected. The transistors [4], [5] and [6] correspond to the memory cell transistor regions [4], [5] and [6] in FIG. 50C, respectively.

Since charge retention characteristics are deteriorated in the edge portions of the data retention insulating film, electrons can easily escape therefrom. In the case of a memory cell of a structure using an insulating film as a charge storing region as represented by a MONOS memory cell, movements of electric charges do not take place among the regions [1], [2] and [3], or among the regions [4], [5] and [6]. Accordingly, thresholds are decreased in the regions (the edge portions) that lost electric charges, in comparison with a central portion of a channel. Here, the cross section shown in FIG. 50B represents the channel in the direction of currents flowing, and in the case where the transistors are connected in series in the direction of the currents flowing, a threshold as a whole does not change even if a threshold of any of the transistors therein is decreased.

Here, since the regions [4], [5] and [6] are connected in series between the source and the drain, currents do not flow between the source and the drain when the threshold of the region [5] is high even if the thresholds are decreased in the regions [4] and [6]. Therefore, decreases in the thresholds at the gate edge portions are not detected as a decrease in the threshold of the memory cell. On the contrary, since the regions [1], [2] and [3] are connected in parallel between the source and the drain, the currents flow between the source and the drain when the thresholds are decreased in the regions [1] and [3], whereby decreases in the thresholds at the edge portions in the element isolation regions are detected as a decrease in the threshold of the memory cell. Such aspects are illustrated in FIG. 51C. Specifically, each of the regions shows almost the same gate voltage immediately after writing; however, the gate voltage at the edge portions [1] and [3] are decreased more than the gate voltage at the central portion [2] in the write operation mode as time passes by, and the voltage at the edge portions declines close to the voltage in an erase operation mode. In short, the charge retention characteristics of the memory cell are decided by the charge retention characteristics of the damaged portions.

As described above, in the case where the MONOS memory cell is formed with the self-aligned STI structure, deterioration of data retention characteristics of the charge storing regions at the edges of the element isolation regions or edges of the gate electrode may affect reliability of the memory cell. In particular, among four sides that define the element isolation region, deterioration of the charge retention characteristics on edges at two sides parallel to the direction of currents flowing between the source and the drain may cause a problem. This embodiment provides a method of resolving the foregoing problem.

Figure 52A:
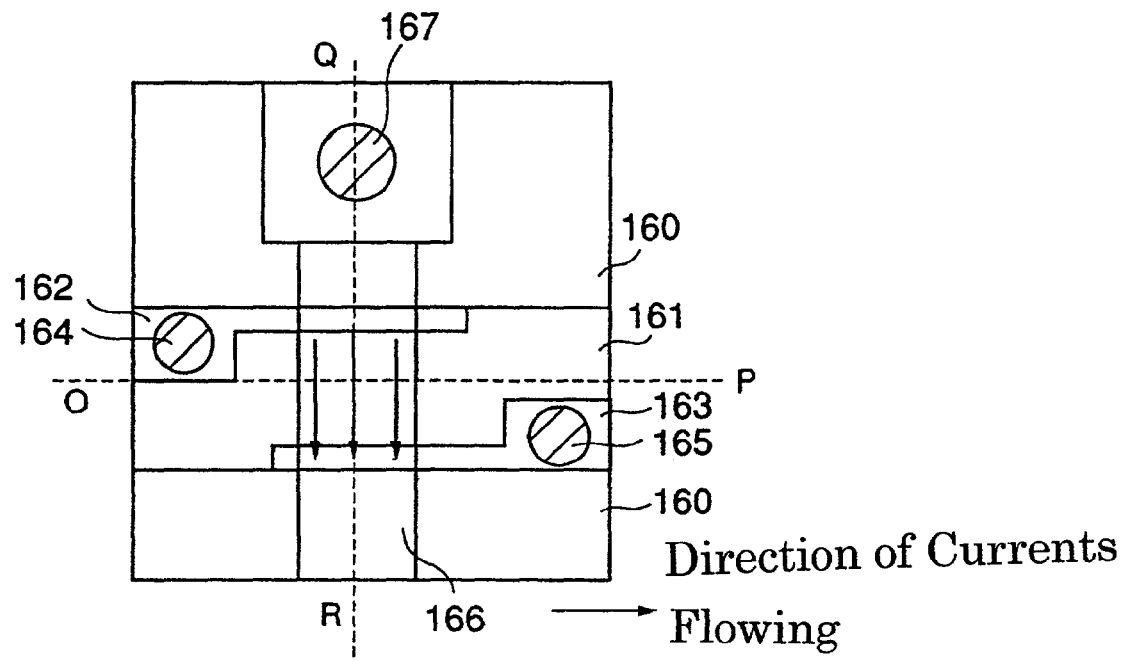
FIG. 52A is a top plan view of a semiconductor device of the fourth embodiment.
Figures 52B, 52C:
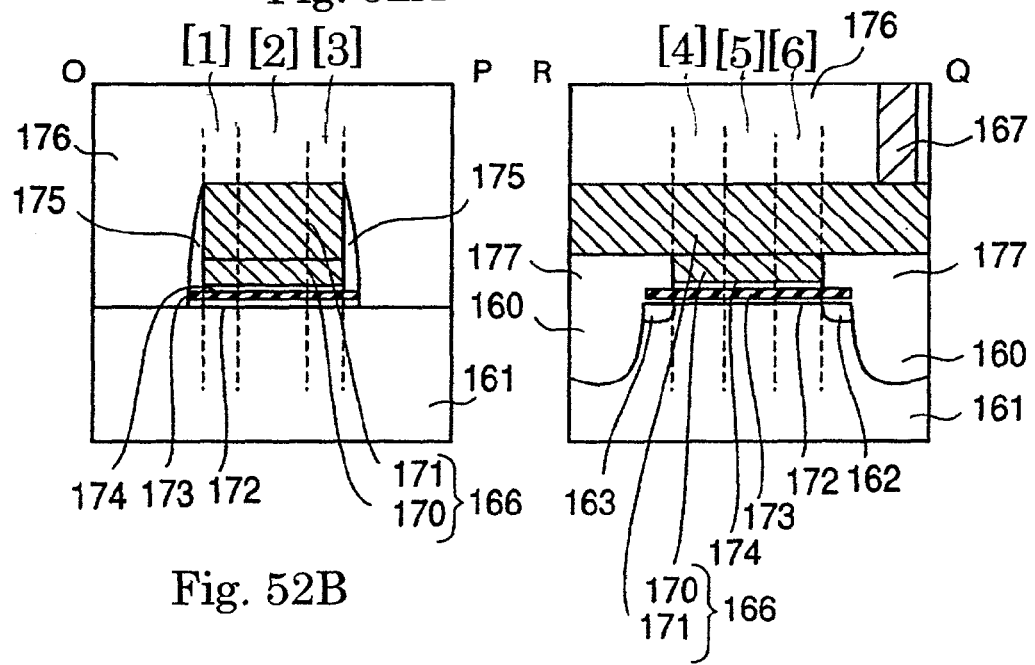
FIG. 52B is a cross-sectional view taken along the "O-P" line of FIG. 52A showing the semiconductor device of the fourth embodiment.
FIG. 52C is a cross-sectional view taken along the "Q-R" line of FIG. 52A showing the semiconductor device of the fourth embodiment.

Next, the MONOS memory cell using the self-aligned STI of this embodiment is illustrated in FIGS. 52A to 52C. A top plan view of a semiconductor device of this embodiment is illustrated in FIG. 52A, in which a source impurity region 162 is formed linearly in the right-and-left direction in one side of a semiconductor substrate 161 while contacting with one of element isolation regions 160. Opposite to the source impurity region 162, a drain impurity region 163 is formed linearly in the right-and-left direction in the other side of the semiconductor substrate 117 while contacting with the other element isolation region 160. A part of the source impurity region 162 is formed to have a greater width, and a source contact 164 is formed therein. Moreover, a part of the drain impurity region 163 is formed to have a greater width, and a drain contact 165 is formed therein. As perpendicular to the longitudinal direction of the source impurity region 162 and the drain impurity region 163, a gate electrode 166 is formed.

Moreover, a wide region is provided at an edge of the gate electrode 166, and a contact 167 is provided therein. In this memory cell, parts of the semiconductor substrate 161 below the gate electrode 166 constitute the source impurity region 162 and the drain impurity region 163. In the event of reading data, a write operation mode and an erase operation mode are discriminated in accordance with an amount of currents flowing from the source impurity region 162 to the drain impurity region 163, i.e. in the direction from Q to R indicated with an arrow in FIG. 52A. Such a structure is utilized in AND-type EEPROMs, DINOR-type EEPROMs or the like.

A cross-sectional view of FIG. 52A taken along the "O-P" line is illustrated in FIG. 52B. The gate electrode 166 is formed on the semiconductor substrate 161. This gate electrode 166 comprises a lower first gate 170 and a second gate 171 disposed thereon. The gate electrode 166 is stacked on a gate insulating film comprised of a tunnel insulating film 172, a data retention insulating film (a charge storing region) 173 and a block insulating film 174. Gate sidewall insulating films 175 are provided on side faces of the gate electrode 166. An interlayer insulating film 176 is formed on surfaces of the semiconductor substrate 161, the gate electrode 166, and the gate sidewall insulating films 175. Here, a width of the data retention insulating film 173 is formed greater than a width of the gate electrode 166, as equivalent to thicknesses of the gate sidewall insulating films 175.

Moreover, a cross-sectional view of FIG. 52A taken along the "Q-R" line is illustrated in FIG. 52C. Element isolation trenches 177 are provided in the semiconductor substrate 161, and the element isolation regions 160 are formed in the element isolation trenches 177. The gate insulating film comprised of the tunnel insulating film 172, the data retention insulating film 173 and the block insulating film 174, and the first gate 170 are formed in a space between the element isolation regions 160. On this block insulating film 174, the second gate electrode 171 is formed extending over the element isolation regions 160. Here, the widths of the data retention insulating film 173 and the tunnel insulating film 172 placed thereunder are formed greater than the width of the first gate 170 such that the data retention insulating film 173 and the tunnel insulating film 172 protrude into the element isolation regions 160.

In this memory cell, an unillustrated well of a low-density impurity region is formed in an upper part of the semiconductor substrate 161. The tunnel insulating film 172 of a silicon oxide film, a silicon oxynitride film or the like is formed in a film thickness from about 1 to 15 nm, for example, on the semiconductor substrate 161. In addition, the data retention insulating film 173 of an insulating film such as a silicon nitride film, a silicon oxynitride film, a $Ta_2O_5$ film, a $TiO_2$ film or an $Al_2O_3$ film is formed in a film thickness from about 3 to 30 nm, for example, on the tunnel insulating film 172.

Furthermore, the block insulating film 174 of a silicon oxide film, a silicon oxynitride film or the like is formed in a thickness from about 1 to 15 nm, for example, on the data retention insulating film 173. On the block insulating film 174, formed is the gate electrode 166 in a thickness from 10 nm to 500 nm, which is comprised of any of, for example: a stacked structure of polysilicon or tungsten silicide (WSi) with polysilicon; a stacked structure of NiSi, MoSi, TiSi or CoSi with polysilicon; a stacked structure of metal with polysilicon; and a single layer structure of a metal compound of silicon or metal. Here, the source impurity region 162 and the drain impurity region 163 are formed inside the semiconductor substrate 161 at the portions contacting with edges of the element isolation regions 160. Although the source impurity region 162 and the drain impurity region 163 are formed under portions of the data retention insulating film 173 protruding from the first gate electrode 170, they are not formed below the first gate electrode 170.

Next, description will be made regarding operations of the semiconductor device of this embodiment. The transistors shown in FIGS. 52A to 52C constitute a memory cell. An erasing operation is conducted in a manner that high voltage (from 10 to 25 V, for example) is applied to the semiconductor substrate in a state where the gate electrode is set to 0 V, for example, thereby injecting holes from the semiconductor substrate into the charge storing region. Otherwise, the erasing operation is conducted in a manner that drain electric potential is negatively biased with respect to source electric potential, thereby generating hot holes accelerated by a channel, and further, that the gate electrode is negatively biased with respect to the source electric potential, thereby injecting the hot holes into the charge storing region. Yet otherwise, the erasing operation is conducted in a manner that the source electric potential and the drain electric potential are positively biased with respect to well electric potential, thereby generating hot holes at a junction between the impurity region and the well, and further, that the gate electrode is negatively biased with respect to the well electric potential, thereby injecting the hot holes into the charge storing region.

A writing operation is conducted in a manner that high voltage (from 10 to 25 V, for example) is applied to the gate electrode in a state where the semiconductor substrate is set to 0 V, for example, thereby injecting electrons from the semiconductor substrate into the charge storing region. Otherwise, the writing operation is conducted in a manner that the drain electric potential is positively biased with respect to source electric potential, thereby generating hot electrons accelerated by a channel, and further, that the gate electrode is positively biased with respect to the source electric potential, thereby injecting the hot electrons into the charge storing region.

In a reading operation, a bit line connected with a drain contact is pre-charged and then made to be in a floating mode, and then the voltage of the gate electrode is set to read voltage Vref and a source line is set to 0 V. Thereafter, the bit line detects as whether or not a current flows in the memory cell. In other words, in the writing operation mode where a threshold Vth of the memory cell is greater than Vref, the memory cell is turned off and the bit line retains the pre-charged electric potential. To the contrary, in the erasing mode where the threshold Vth of a selected memory cell is smaller than Vref, the memory cell is turned on and the electric potential of the bit line is decreased from the pre-charged electric potential by $\Delta V$. Data in the memory cell is read out by detecting such changes in electric potential with a sense amplifier.

Here, as shown in FIG. 52B, the data retention insulating film 173 has a shape of protrusion with respect to the first gate electrode 170. As for a degree of protrusion, the data retention insulating film 173 protrudes into the element isolation regions 160 by about 0.5 nm to 10 nm. Here, an effect cannot be obtained if the degree of protrusion is small. Problems occur during the fabrication processes if the degree of protrusion is too large; therefore, excessive protrusion is unsuitable for miniaturizing.

Moreover, as shown in FIG. 52C, the element isolation regions 160 are formed by self-alignment with respect to the tunnel insulating film 172 and to the data retention insulating film 173 in the gate insulating film. The tunnel insulating film 172 and the data retention insulating film 173 protrude from the block insulating film 174 and from the first gate electrode 170 in the right-and-left direction. In this way, the charge storing insulating film protrudes with respect to the gate electrode, whereby both edges thereof constitute a shape of intruding into the element isolation insulating films. Here, a rectangular region on the semiconductor substrate under a control gate surrounded by two sides of the control gate in the direction parallel to the "Q-R" line and two sides of diffusion layers in the direction parallel to the "O-P" line constitutes an insular region.

The source impurity region 162 and the drain impurity region 163 are formed on the semiconductor substrate 161 at both sides under the edges of the first gate electrode 170, whereby stored data is discriminated upon data reading in accordance with an amount of currents flowing in the longitudinal direction of the gate (in the direction of the "Q-R" line). As described above, in the semiconductor device of this embodiment, the data retention insulating film protrudes with respect to the gate electrode, the semiconductor substrate or the both. Accordingly, protruding portions of the data retention insulating film are not used as the charge storing region or as the gate insulating film of the memory cell transistor.

The edge portions of the data retention insulating film possess inferior charge retention owing to fabrication damage in comparison with the central portion thereof. However, as the charge retention characteristics in these regions do not affect the charge retention characteristics of the memory cell, a highly reliable non-volatile semiconductor memory device can be achieved.

Here, in the cross section shown in FIG. 52B, the memory cell is divided into three regions of edge portions [1] and [3] and a central portion [2]. Furthermore, in the cross section shown in FIG. 52C, the memory cell is divided into three regions of edge portions [4] and [6] and a central portion [5]. Here, since the characteristics of the charge storing insulating film at the edge portions [1], [3], [4] and [6] are the same as those in the central portions [2] and [5], deterioration of reliability attributable to the edge portions does not occur therein. As described above, lengths of protrusions are designed to have values greater than the depths of invasion of the fabrication damage, so that the characteristics at the edge portions [1], [3], [4] and [6] become equal to the characteristics at the central portions [2] and [5].

Here, particularly, the above-described effect is largely attributable to the fact that the data retention insulating film has a shape of protrusion at two sides (the two sides that define the gate edges) parallel to the direction of currents flowing between the source and the drain (the "Q-R" direction in FIG. 52A). It is ascribed to the fact that the regions [1] and [3] in FIG. 52B are disposed parallel to the central portion [2] between the source and the drain; therefore, escape of electric charges from the portions [1] and [3] should be avoided in particular because decreases in thresholds at those portions owing to the escape of electric charges are detected as a decrease in a threshold of the memory cell as a whole.

Whereas the respective regions shown in the cross section of FIG. 52B can be expressed as a circuit diagram using transistors as shown in FIG. 53A, such a diagram is also expressed with one transistor as shown in FIG. 53B because the characteristics in the respective regions [1], [2] and [3] are equal. Moreover, whereas the respective regions shown in the cross section of FIG. 52C can be expressed as a circuit diagram using transistors as shown in FIG. 53C, such a diagram is also expressed with one transistor as shown in FIG. 53D because the characteristics in the respective regions [4], [5] and [6] are equal.

The both edges of the data retention insulating film protrude with respect to both of the gate electrode and the semiconductor substrate in this embodiment. However, the edges of the data retention insulating film may protrude with respect only to any one of the gate electrode and the semiconductor substrate. In other words, any one of the "O-P" cross section in FIG. 52B and the "Q-R" cross section in FIG. 52C may be adopted, while the other thereof may remain as the prototype of this embodiment. Moreover, the data retention insulating film of this embodiment protrudes with respect to all the four sides that define the element region of the memory cell transistor. However, it is satisfactory if the data retention insulating film possess the shape of protrusion at one side at least out of the four sides or preferably at two sides parallel to the direction of currents flowing between the source and the drain.

The semiconductor device of this embodiment can obtain the effect similar to the effect of the semiconductor device of the third embodiment. Specifically, since the data retention insulating film protrudes with respect to the gate electrode, the semiconductor substrate or the both, the edge portions of the data retention insulating film are not used as the charge storing region or the gate insulating film of the memory cell transistor. The edge portions of the data retention insulating film possess inferior charge retention owing to fabrication damage in comparison with the central portion thereof. However, as the charge retention characteristics in the edge portions of the data retention insulating film do not affect the charge retention characteristics of the memory cell, a highly reliable non-volatile semiconductor memory device can be achieved.

Next, description will be made regarding one example of a method of fabricating the semiconductor device of this embodiment with reference to FIG. 54 to FIG. 62.

Throughout FIG. 54 to FIG. 62, drawings suffixed with A correspond to the cross section taken along the "Q-R" line in FIG. 52A, and drawings suffixed with B correspond to the cross section taken along the "O-P" line in FIG. 52A, respectively.

First, a sacrificial oxide film (not shown) is formed on the semiconductor substrate 161, then implantation of channel impurities or well impurities is performed and the sacrificial oxide film is exfoliated thereafter.

Next, as shown in FIG. 54A and FIG. 54B, formed serially on the semiconductor substrate 161 are the tunnel insulating film 172 of a silicon oxide film, a silicon oxynitride film or the like in a thickness from about 1 to 15 nm, for example, and the data retention insulating film 173 of a silicon nitride film, a silicon oxynitride film, or an insulating film such as $Ta_2O_5$, $TiO_2$ or $Al_2O_3$ in a thickness from about 3 to 30 nm, for example. Moreover, formed is the block insulating film 174 of a silicon oxide film, a silicon oxynitride film or the like in a thickness from about 1 to 15 nm, for example. Furthermore, the first gate electrode 170 of polysilicon or the like, for example, is deposited thereon in a thickness from about 10 to 100 nm. In addition, an insulating film of a silicon nitride film or the like is deposited in a thickness from about 10 to 200 nm, thus forming a mask material 180.

Next, in the step shown in FIG. 55A, patterning for the element isolation regions is performed with photolithography, and then the mask material 180 and the first gate electrode 170 are processed with anisotropic etching. Note that etching is not performed in the cross section shown in FIG. 55B.

Next, as shown in FIG. 56A, impurities for diffusion layers are doped into the semiconductor substrate 161 while using the mask material 180 as a mask, thus forming the source impurity region 162 and the drain impurity region 163.

Next, as shown in FIG. 57A, an insulating film such as a silicon oxide film is deposited in a thickness from about 5 to 50 nm, for example, and then is etched beck by anisotropic etching, thus forming gate sidewall insulating films 181. Thereafter, the block insulating film 174, the data retention insulating film 173, the tunnel insulating film 172 and the semiconductor substrate 161 are processed by anisotropic etching while using the gate sidewall insulating films 181 as a mask, thus forming the element isolation trenches 177. Here, depths of the element isolation trenches 177 to be formed therein are set in a range from about 50 nm to 300 nm, for example. Note that the element isolation trenches are not formed in the cross section shown in FIG. 57B. By forming the gate sidewall insulating films 181 as described above, the source impurity region 162 and the drain impurity region 163 can be remained at edges of a channel. Widths of the remaining source impurity region 162 and drain impurity region 163 are controllable corresponding to widths of the gate sidewall insulating films 181 remained. As a result, the data retention insulating film 175 is formed into a shape of protrusion, as equivalent to the film thicknesses of the gate sidewall insulating films 181, with respect to the first gate electrode 170.

Figures 58A, 58B:
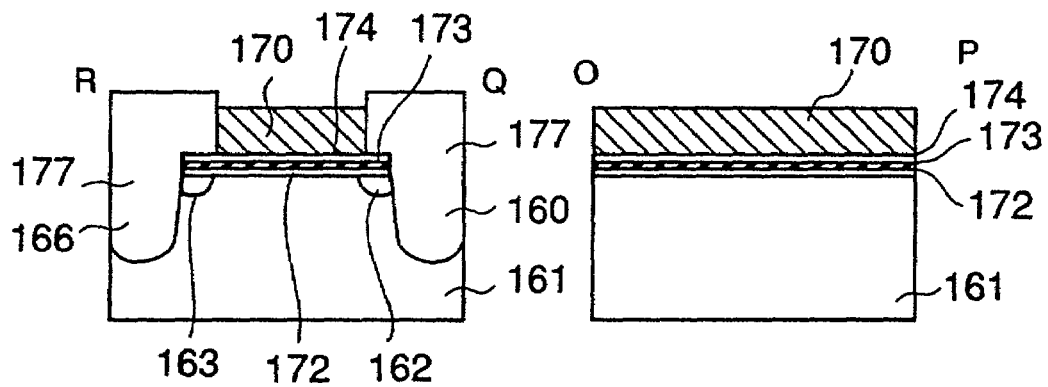
FIG. 58A is a cross-sectional view showing one step of the method of fabricating the semiconductor device according to the fourth embodiment, corresponding to the cross section taken along the "Q-R" line of FIG. 52A.
FIG. 58B is a cross-sectional view showing one step of the method of fabricating the semiconductor device according to the fourth embodiment, corresponding to the cross section taken along the "O-P" line of FIG. 52A.

Next, after a thermal treatment is performed as necessary for recovery from etching damage, as shown in FIG. 58A, the element isolation trenches 177 are filled with an insulating film such as a silicon oxide film. Thereafter, planarization is conducted by the CMP method, and the mask material 180 which is a CMP stopper is removed by wet etching. Moreover, in accordance with the cross section shown in FIG. 58B, the mask material 180 is removed so that an upper surface of the first gate electrode 170 is exposed.

Figures 59A, 59B:
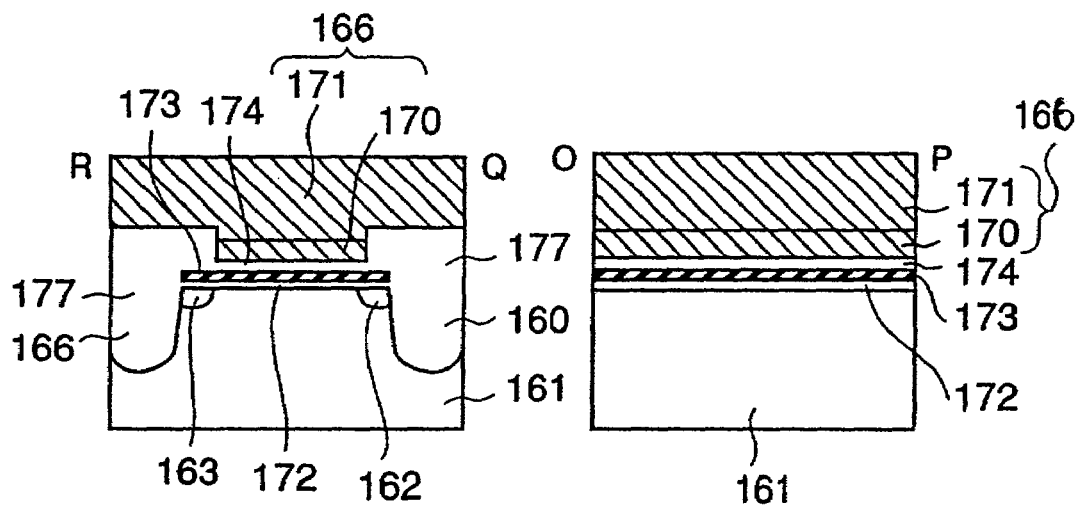
FIG. 59A is a cross-sectional view showing one step of the method of fabricating the semiconductor device according to the fourth embodiment, corresponding to the cross section taken along the "Q-R" line of FIG. 52A.
FIG. 59B is a cross-sectional view showing one step of the method of fabricating the semiconductor device according to the fourth embodiment, corresponding to the cross section taken along the "O-P" line of FIG. 52A.

Next, as shown in FIGS. 59A and 59B, deposited is the second gate electrode 171 comprised of any of, for example: a stacked structure of polysilicon or WSi with polysilicon; a stacked structure of NiSi, MoSi, TiSi or CoSi with polysilicon; a stacked structure of metal with polysilicon; and a single layer structure of a metal compound of silicon or metal. In combination of the first gate electrode 170 and the second gate electrode 171, the gate electrode 166 of the memory cell is completed.

Figures 60A, 60B:
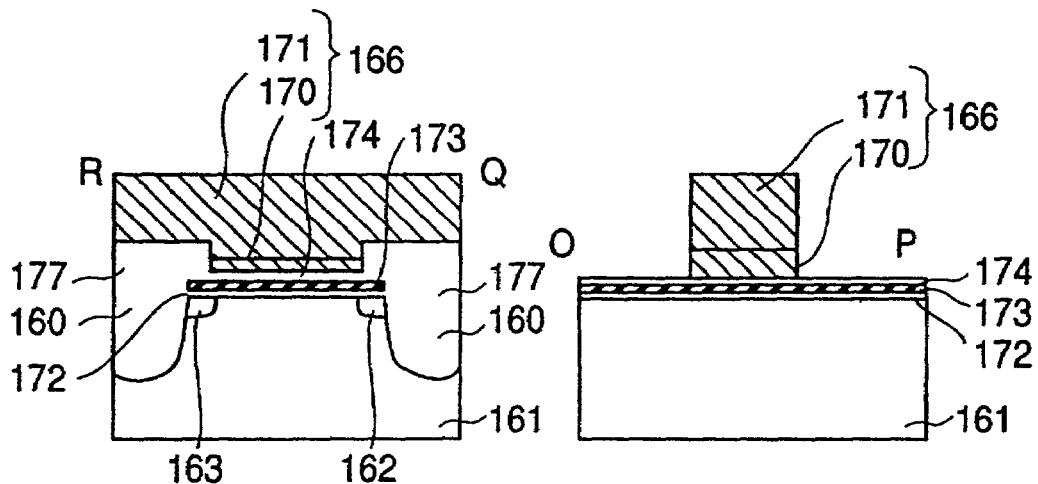
FIG. 60A is a cross-sectional view showing one step of the method of fabricating the semiconductor device according to the fourth embodiment, corresponding to the cross section taken along the "Q-R" line of FIG. 52A.
FIG. 60B is a cross-sectional view showing one step of the method of fabricating the semiconductor device according to the fourth embodiment, corresponding to the cross section taken along the "O-P" line of FIG. 52A.

Next, as shown in FIG. 60B, a pattern for the gate is formed by photolithography, and the gate electrode 166 is etched by anisotropic etching. In this case, normally, whereas the block insulating film 174 is slightly etched, the data retention insulating film 173 should be avoided from etching.

A thermal treatment may take place for recovery from etching damage, if necessary. Moreover, recovery from damage may be also conducted thereafter by oxidation of the first gate electrode to the extent in a range from 2 nm to 20 nm, for example. Note that the gate electrode 166 is not etched in the cross section shown in FIG. 61A.

Figures 61A, 61B:
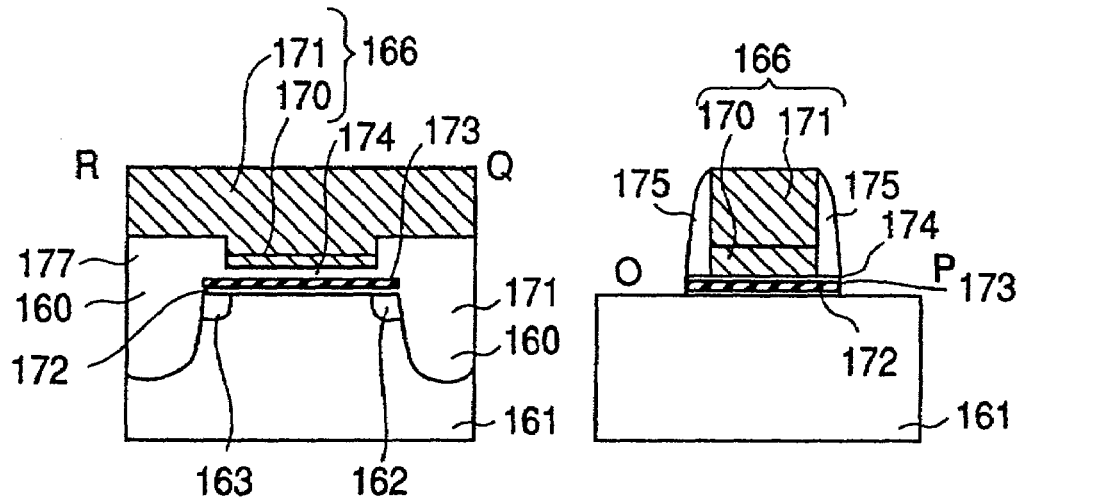
FIG. 61A is a cross-sectional view showing one step of the method of fabricating the semiconductor device according to the fourth embodiment, corresponding to the cross section taken along the "Q-R" line of FIG. 52A.
FIG. 61B is a cross-sectional view showing one step of the method of fabricating the semiconductor device according to the fourth embodiment, corresponding to the cross section taken along the "O-P" line of FIG. 52A.

Next, as shown in FIG. 61B, an insulating film of a silicon oxide film made by TEOS or HTO or a silicon oxynitride film is deposited in a thickness from about 5 to 50 nm, for example, and is etched back by anisotropic etching, thus forming the gate sidewall insulating film 175. In this event, the data retention insulating film 173 and the tunnel insulating film 172 are also etched while using the gate sidewall insulating film 175 as a mask. As a result, the data retention insulating film 173 is formed into a shape of protrusion with respect to the gate electrode 166 as equivalent to the thickness of the gate sidewall insulating film 175. Note that the gate sidewall insulating film 175 is not formed in accordance with the cross section shown in FIG. 61A.

Here, the sidewall insulating film 175 may be formed by oxidation of the gate polycrystalline silicon instead of deposition. In this case, the thickness of the sidewall insulating film 175 is adjusted by an amount of oxidation.

Figures 62A, 62B:
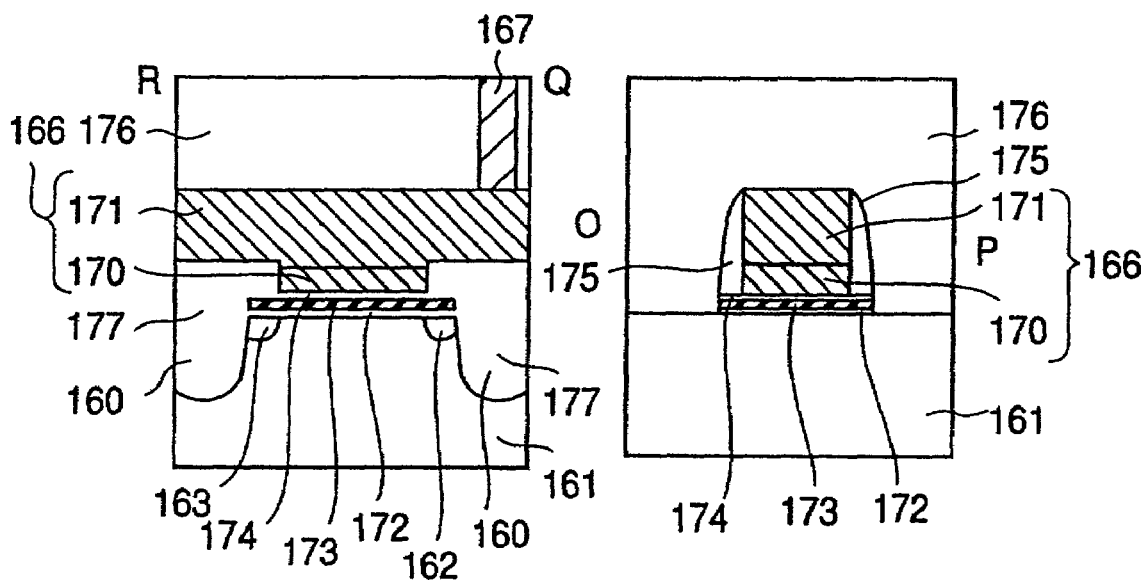
FIG. 62A is a cross-sectional view showing one step of the method of fabricating the semiconductor device according to the fourth embodiment, corresponding to the cross section taken along the "Q-R" line of FIG. 52A.
FIG. 62B is a cross-sectional view showing one step of the method of fabricating the semiconductor device according to the fourth embodiment, corresponding to the cross section taken along the "O-P" line of FIG. 52A.

Next, as shown in FIGS. 62A and 62B, an interlayer insulating film 176 is deposited on a surface. Then, a contact plug 167 is formed inside the interlayer insulating film 176, and after the step of forming metal wiring (not shown), the non-volatile memory cell is completed.

In this way, according to the method of fabricating the semiconductor device of this embodiment, as the data retention insulating film has a shape of protrusion with respect to the gate electrode, the edges of the data retention insulating film, which suffer from fabrication damage in the steps of etching the block insulating film, the data retention insulating film and the tunnel insulating film do not have to be used as the data retention insulating film or as the gate insulating film of the transistor. Accordingly, reliability of the memory cell is enhanced. Above all, the foregoing effect is largely attributable to the fact that the data retention insulating film has a shape of protrusion at two sides (the two sides that define the gate edges) parallel to the direction of currents flowing between the source and the drain (the direction of the "Q-R" line) as shown in FIG. 52A.

The method of fabricating the semiconductor device of this embodiment can obtain the effect similar to that of the third embodiment. Specifically, a channel width is defined by the first gate electrode, and a channel length is defined by the second gate electrode, whereby an area of the data retention insulating film forming the memory cell can be decided according to two steps of lithography. In addition, linear patterns are usable in the two steps of lithography. Therefore, affecting factors attributed to variation of dimensions with respect to the characteristics of a memory can be reduced in terms of portions other than the channel width and the channel length, in comparison with a floating-gate non-volatile semiconductor memory device that depends largely on dimensions of lithography for a floating gate as well as a control gate. Accordingly, this embodiment is capable of stabilizing writing voltage or erasing voltage per memory cell, thus enhancing reliability.

In the meantime, the data retention insulating film is not formed in the portions where the first gate electrode is not formed. Therefore, injection of electric charges from the second gate electrode into the data retention insulating film formed thereunder during fabrication of the electrode or during operation is not caused as in the case where the data retention insulating film is formed under the second gate electrode, for example. Accordingly, problems attributable to such injection of electric charges do not occur in this embodiment, such as uneven voltage-withstanding characteristics among adjacent memory cells or current leakages.

MODIFIED EXAMPLE OF FOURTH EMBODIMENT

Figure 63:
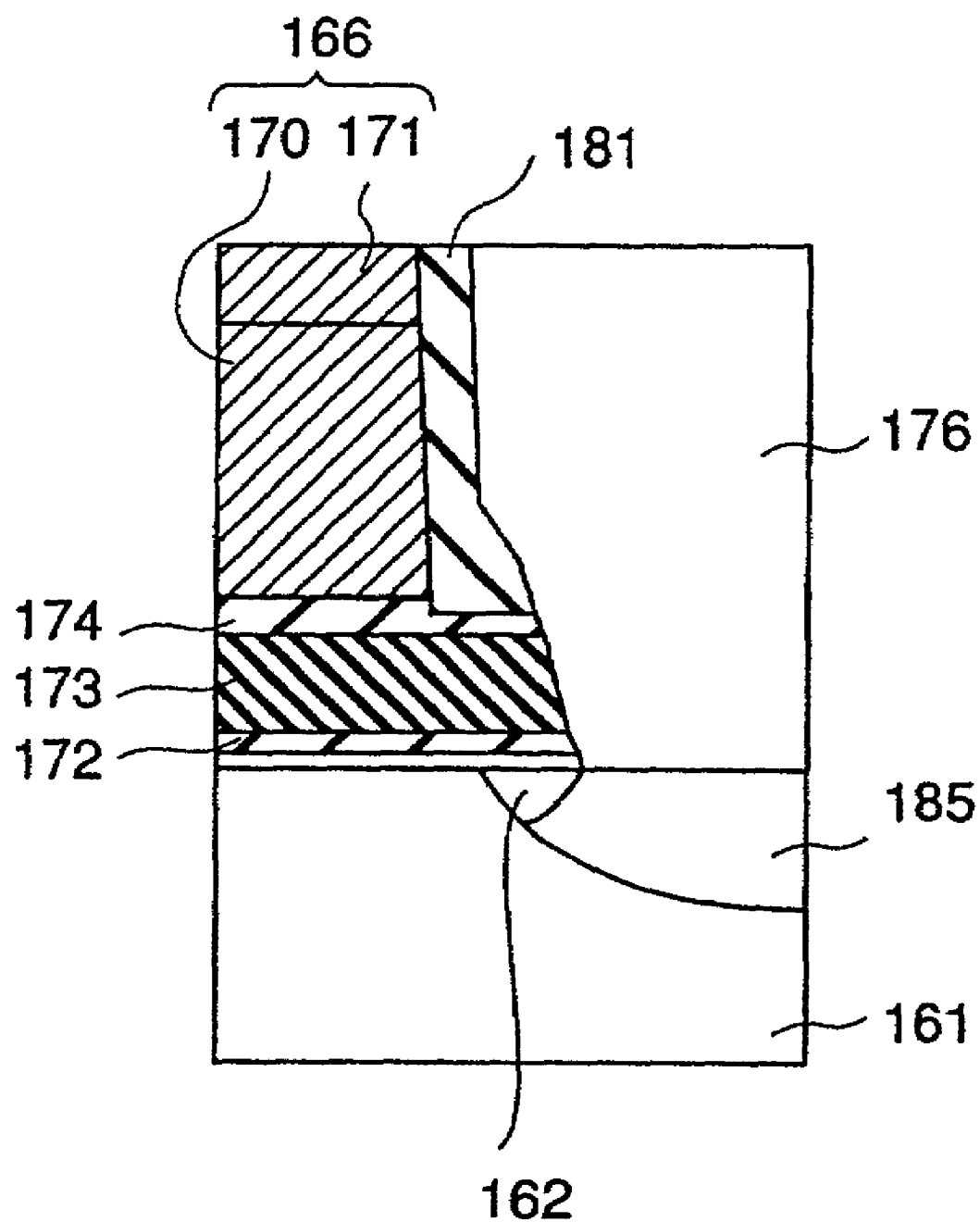
FIG. 63 is a cross-sectional view showing a semiconductor device according to a modified example of the fourth embodiment, corresponding to a part of the cross section taken along the "Q-R" line of FIG. 52A.

In this modified example, a virtual ground array cell structure is realized as shown in FIG. 63. FIG. 63 shows an enlarged view of the structure corresponding to the cross section shown in FIG. 52C. Here, unlike the fourth embodiment, the element insulation regions 160 are not provided therein, but high-density impurity regions 185 are provided in the semiconductor substrate 161 instead.

In a method of fabricating this semiconductor device, instead of the step of etching the semiconductor substrate 161 shown in FIGS. 57A and 57B in the method of fabricating the semiconductor device of the fourth embodiment, an insulating film is buried from the surface of the semiconductor substrate 161 up to a height of the mask member 180.

In addition, instead of the step shown in FIGS. 61A and 61B, formed is the high-density impurity region 185 as shown in FIG. 63 by implanting p-type impurities composed of boron, indium or the like in a range from $10^{11}$ cm$^{-2}$ to $10^{14}$ cm$^{-2}$, for example, in order to improve element isolation between adjacent gate electrodes. In this event, since the sidewall insulating film is also formed in upper parts of the source and the drain impurity regions in advance, it is possible to inhibit interfusion of the p-type impurities into the n-type source and drain impurity regions by confining p-type impurity ions to stop in front of places under the sidewall insulating film. Energy for implanting ions of the p-type impurities is set in a range from 1 eV to 100 eV. Moreover, in this event, damage caused by ions to the data retention insulating film, the ions being introduced upon the p-type impurity implantation, can be separated by the gate electrode sidewall insulating film. Accordingly, a memory cell of higher reliability can be achieved. In the virtual ground array cell of the figuration as described above, a p-plus diffusion layer or an n-plus diffusion layer is formed instead of element isolation regions formed by burying an insulating material therein, and each of the diffusion layers serves for element isolation. Here, the n-plus diffusion layer is not fixed to a particular function, but the n-plus diffusion layer serves as a bit line or a source line.

This modified example has an effect similar to that of the fourth embodiment. Moreover, in the case where the p-type impurities composed of boron or indium, for example, are added in order to improve element isolation between adjacent gate electrodes, formation of an inversion layer at edge portions is suppressed, and furthermore, occurrence of problems such as uneven voltage-withstanding characteristics among channels between adjacent memory cells or current leakages can be reduced.

FIFTH EMBODIMENT

Figure 64A:
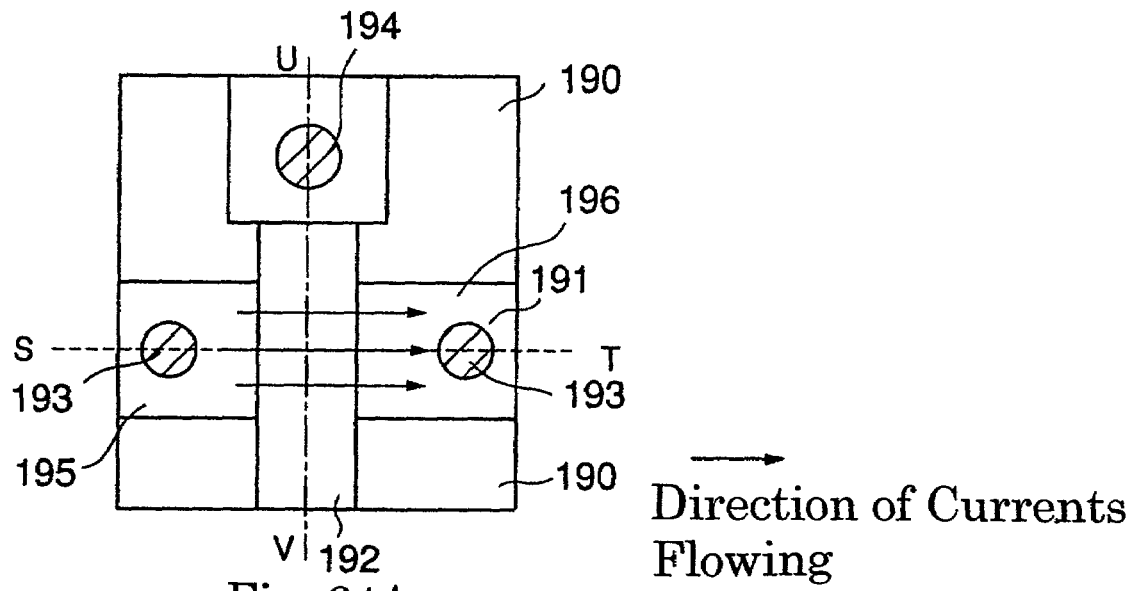
FIG. 64A is a top plan view of a semiconductor device of a fifth embodiment.
Figures 64B, 64C:
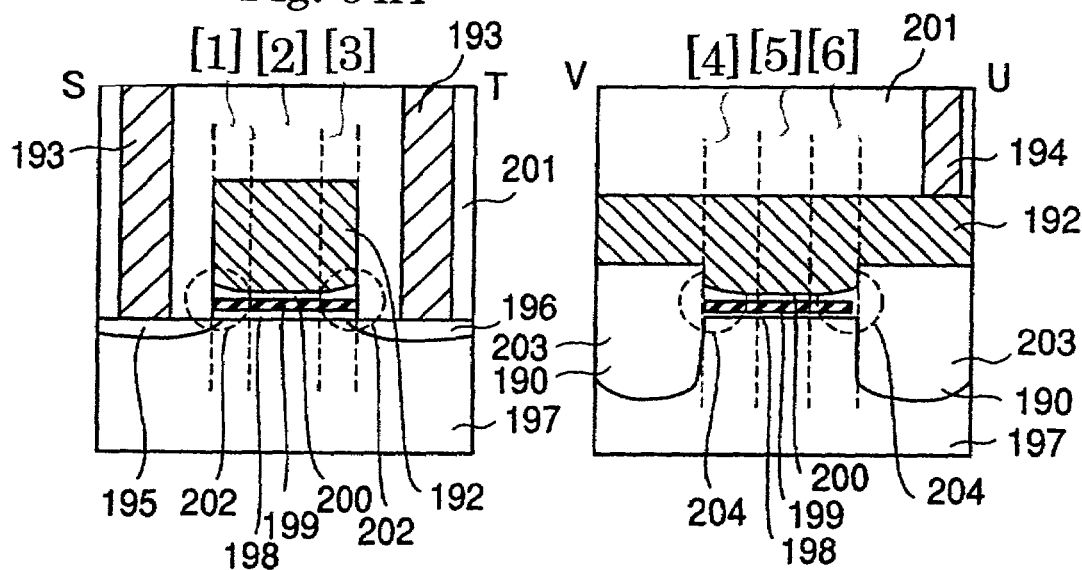
FIG. 64B is a cross-sectional view taken along the "S-T" line of FIG. 64A showing the semiconductor device of the fifth embodiment.
FIG. 64C is a cross-sectional view taken along the "U-V" line of FIG. 64A showing the semiconductor device of the fifth embodiment.

A structure of a semiconductor device according to a fifth embodiment of the present invention is illustrated in FIGS. 64A to 64C. A top plan view of the semiconductor device of this embodiment is illustrated in FIG. 64A, in which element regions 191 are formed linearly in the right-and-left direction while being surrounded by element isolation regions 190. As perpendicular to the longitudinal direction of these element regions 191, a gate electrode 192 is formed. A pair of contacts 193 are provided respectively on the right and left sides of the gate electrode 192 in the element regions 191. Moreover, a wide region is provided at an edge of the gate electrode 192 and a gate contact 194 is provided therein. In this memory cell, the element regions 191 on both sides of the gate electrode 192 constitute a source diffusion layer 195 and a drain diffusion layer 196, respectively. In the event of reading data, a writing operation mode and an erasing operation mode are discriminated in accordance with an amount of currents flowing from the source diffusion layer 195 to the drain diffusion layer 196, i.e. in the direction from "S" to "T" indicated with an arrow in FIG. 64A. Such a structure is utilized in NAND-type EEPROMs, NOR-type EEPROMs or the like.

A cross-sectional view of FIG. 64A taken along the "S-T" line is illustrated in FIG. 64B. The gate electrode 192 is formed on a semiconductor substrate 197, and the source diffusion layer 195 and the drain diffusion layer 196 are respectively formed in the semiconductor substrate 197 on both sides of the gate electrode. The gate electrode 192 is stacked on a gate insulating film comprised of a tunnel insulating film 198, a data retention insulating film (a charge storing region) 199 and a block insulating film 200. An interlayer insulating film 201 is formed on surfaces of the semiconductor substrate 197 and the gate electrode 192. Here, edge portions 202 of the block insulating film 200 are formed thicker than a central portion thereof, so that the edge portions on the gate electrode 202.

Moreover, a cross-sectional view of FIG. 64A taken along the "U-V" line is illustrated in FIG. 64C. Element isolation trenches 203 are provided in the semiconductor substrate 197, and the element isolation regions 190 are formed in the element isolation trenches 203. The gate insulating film comprised of the tunnel insulating film 198, the data retention insulating film 199 and the block insulating film 200, and the gate electrode 192 are formed in a space between the element isolation regions 190. On this block insulating film 200, the gate electrode 192 is formed extending over the element isolation regions 190. Here, the block insulating film 200 is formed thicker in edge portions 204 of the gate electrode 192 than in a central portion thereof.

The semiconductor device of this embodiment is characterized in that the film thickness of the gate insulating film is thickened at the edge portions of the gate electrode. For this reason, read-disturb characteristics are improved therein. In particular, the semiconductor device of this embodiment is characterized in that either the tunnel insulating film 198 or the block insulating film 200 is thickened. Here, it is preferable that the edge portions of the block insulating film 200 are thickened. Such preference is attributed to the following. Specifically, unevenness in the film thickness of the tunnel insulating film 198 or the data retention insulating fill 199 where electric charges are transmitted may cause variations in erasing characteristics or data retention characteristics; however, thickening of the block insulating film 200 at the edge portions thereof does not cause variations in those characteristics because of no electric charges transmitted therethrough.

Here, reading voltage Vref is applied to the gate electrode in the event of a reading operation of a non-volatile memory. However, thresholds of cells in erasing modes are raised by electric fields created by Vref accompanied with iteration of reading operations, thus causing a problem that threshold margins with respect to cells in writing modes are reduced. Such a problem is referred to as the read-disturb effect.

In this embodiment, since the gate insulating film is thickened at the edge portions thereof, the electric fields created by Vref are weakened at the edge portions. For this reason, variation of thresholds owing to the read-disturb effect is suppressed at the edge portions in comparison with a central portion of a channel. When the memory cell is divided into [1], [2] and [3] as shown in FIG. 64B, or into [4], [5] and [6] as shown in FIG. 64C, the foregoing aspect refers to decreases in variation of thresholds at [1] and [3], or [4] and [6]. Such regions [1], [2], [3], [4], [5] and [6] are defined in accordance with depths of invasion of bird's beaks.

In particular, the foregoing effect is largely attributable to a decrease in variation of thresholds at two sides (element isolation edges) parallel to the direction of the "S-T" line in FIG. 64A, which is the direction of currents flowing between the source and the drain.

Such an aspect will be described by use of FIGS. 65A to 65C. FIG. 65A shows a circuit diagram of transistors corresponding to the cross section of FIG. 64B. FIG. 65B shows a circuit diagram of transistors corresponding to the cross section of FIG. 64C. FIG. 65C is a graph showing variations of characteristics between currents and voltage in each state of the data retention insulating film, in which gate voltage is indicated by the transverse axis and drain currents are indicated by the longitudinal axis. In the circuit diagram shown in FIG. 65A, illustrated is a composition of three transistors [1], [2] and [3] connected in series between a source and a drain while gates thereof are mutually connected. The transistors [1], [2] and [3] correspond to the memory cell transistor regions [1], [2] and [3] in FIG. 64B, respectively. The transistors [1] and [3] correspond to the edge portions 202 where the block insulating film is thickened. Moreover, in the circuit diagram shown in FIG. 65B, illustrated is a composition of three transistors [4], [5] and [6] connected in parallel between the source and the drain while gates thereof are mutually connected. The transistors [4], [5] and [6] correspond to the memory cell transistor regions [4], [5] and [6] in FIG. 64C, respectively. The transistors [4] and [6] correspond to the edge portions 204 where the block insulating film is thickened.

FIG. 65C shows characteristics between drain currents (Id) and gate voltage (Vg) of the memory cell. Although thresholds of the memory cell in the erase operation mode rise because of Vref stress upon reading, variation of the thresholds are small as electric fields are weakened at the edge portions [4] and [6]. In a memory using an insulating film as a charge storing layer such as a MONOS memory, since trapped electric charges hardly move within the insulating film, the thresholds at the edge portions [4] and [6] are maintained low in comparison with the threshold at the central portion [5]. Since the regions [4], [5] and [6] are disposed in parallel between the source and the drain as shown in FIG. 65C, the thresholds of the memory cell are decided by the memory cell transistor regions [4] and [6] that possess lower thresholds. For this reason, suppression of variation of the thresholds of the memory cell becomes feasible by suppressing variation of the thresholds in the regions [4] and [6] by weakening the electric fields at the edge portions.

In the memory cell of this embodiment, an unillustrated well of a low-density impurity region is formed in an upper part of the semiconductor substrate 197. The tunnel insulating film 198 of a silicon oxide film, a silicon oxynitride film or the like is formed in a film thickness from about 1 nm to 15 nm, for example, on the semiconductor substrate 197. In addition, the data retention insulating film 199 of an insulating film such as a silicon nitride film, a silicon oxynitride film, a $Ta_2O_5$ film, a $TiO_2$ film or an $Al_2O_3$ film is formed in a film thickness from about 3 nm to 30 nm, for example, on the tunnel insulating film 198.

Furthermore, the block insulating film 200 of a silicon oxide film, a silicon oxynitride film or the like is formed in a thickness from about 1 nm to 15 nm, for example, on the data retention insulating film 199. On the block insulating film 200, formed is the gate electrode 202 in a thickness from 10 nm to 500 nm, which is comprised of any of, for example: a stacked structure of polysilicon or tungsten silicide (WSi) with polysilicon; a stacked structure of NiSi, MoSi, TiSi or CoSi with polysilicon; a stacked structure of metal with polysilicon; and a single layer structure of a metal compound of silicon or metal. Here, the source impurity region 195 and the drain impurity region 196 are formed in the semiconductor substrate 197 in the portions contacting with the edges of the tunnel insulating film 198.

The transistors shown in FIGS. 64A to 64C constitute a memory cell. An erasing operation, a write operation and a read operation thereof are similar to those described in accordance with the third embodiment or the fourth embodiment.

In this embodiment, variation of the thresholds at the edges is suppressed by means of thickening the gate insulating film at the edge portions in order to weaken the electric fields at the edge portions upon the stress attributable to the read-disturb effect.

Specifically, by reducing the rise of the thresholds at the edge portions of the insulating film disposed parallel to the direction of reading currents flowing, the thresholds at the edge portions are detected as the thresholds of the memory cell even if the threshold at the central portion rises. Variation of the thresholds of the memory cell attributable to the read-disturb effect can be thereby reduced.

Moreover, by varying the film thickness of the block insulating film with no electric charges transmitted therethrough, it is feasible to weaken the electric fields at the edge portions without causing unevenness in writing/erasing operation characteristics or data retention characteristics.

Figure 66:
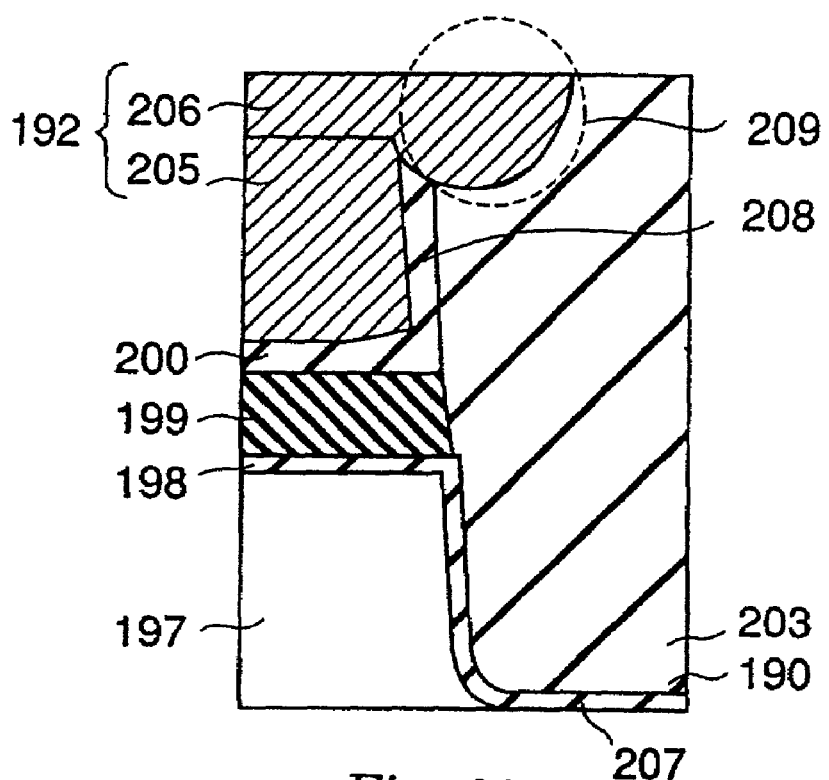
FIG. 66 is an enlarged cross-sectional view of a part of FIG. 64C which is the cross-sectional view of the semiconductor device according to the fifth embodiment.

Now, FIG. 66 shows an example of an enlarged view of a cross section of a structure of a semiconductor device composed of a combination of the cross section shown in FIG. 64C and the structure of the semiconductor device of the third embodiment. This gate electrode 192 comprised of a first gate 205 and a second gate 206 disposed thereon. An element isolation sidewall insulating film 207 is formed between the semiconductor substrate 197 below the first gate electrode 205 and the element isolation region 190. Moreover, a gate electrode sidewall insulating film (a polysilicon sidewall insulating film) 208 is formed between a side face of the first gate electrode 205 and the element isolation region 190. A portion of the block insulating film 200 under an edge of the first gate electrode 205 is formed thicker than other portions thereof. Furthermore, at an edge 209 where the second gate electrode 206 contacts with the gate electrode sidewall insulating film 208 and the element isolation region 190, the second gate electrode 206 intrudes toward the direction of the semiconductor substrate 197. As in the drawing, the data retention insulating film 199 protrudes from the first gate electrode 205 toward the direction of the element isolation region 203 as equivalent to the thickness of the gate electrode sidewall insulating film 208.

Figure 67:
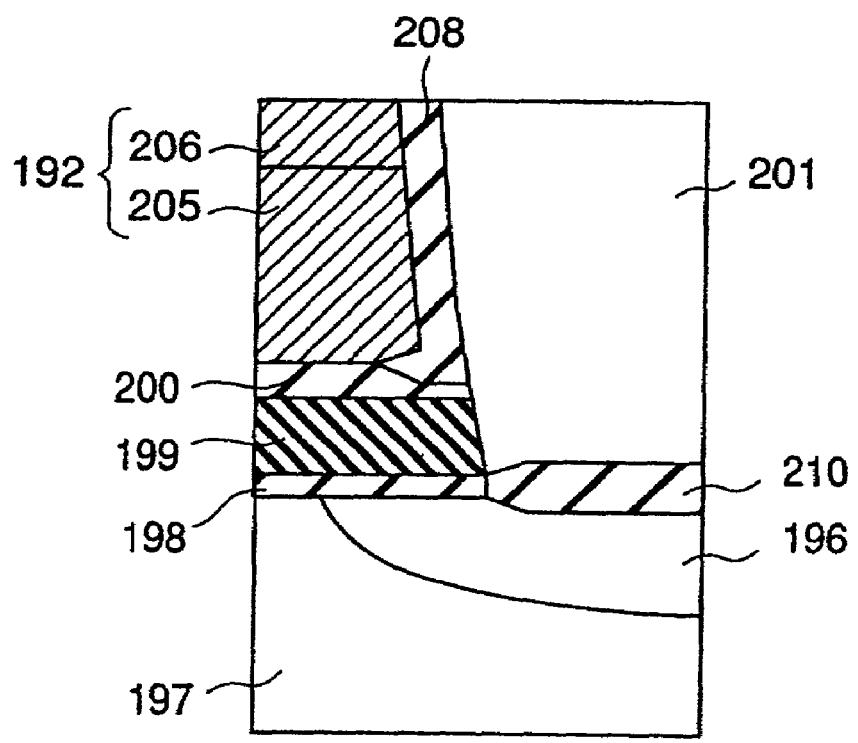
FIG. 67 is an enlarged cross-sectional view of a part of FIG. 64B which is the cross-sectional view of the semiconductor device according to the fifth embodiment.
Figure 68A:
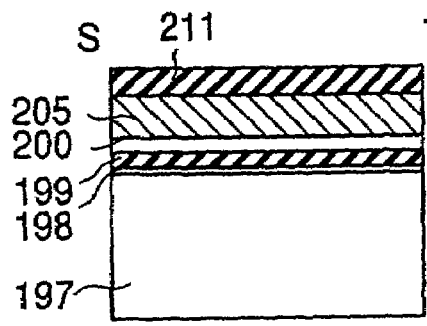
FIG. 68A is a cross-sectional view showing one step of a method of fabricating the semiconductor device according to the fifth embodiment, corresponding to a cross section taken along the "S-T" line of FIG. 64A.
Figure 68B:
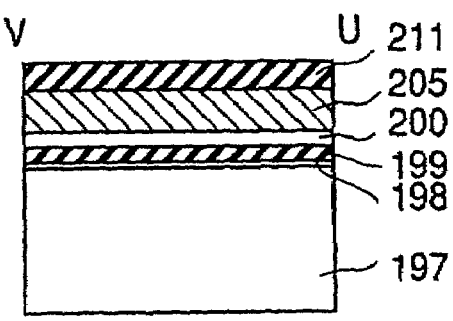
FIG. 68B is a cross-sectional view showing one step of a method of fabricating the semiconductor device according to the fifth embodiment, corresponding to a cross section taken along the "U-V" line of FIG. 64A.

Next, FIG. 67 shows an example of an enlarged view of a cross section of a structure of a semiconductor device comprised of a combination of the cross section shown in FIG. 64B and the structure of the semiconductor device of the third embodiment. The tunnel insulating film 198 is formed on the semiconductor substrate 197, and the data retention insulating film 199 is formed thereon. The block insulating film 200 is formed on the data retention insulating film 199, and the first gate electrode 205 is formed thereon. The second gate electrode 206 is formed on the first gate electrode 205, and the gate electrode sidewall insulating film (the polysilicon sidewall insulating film) 208 is formed on the side faces of the first gate electrode 205 and the second gate electrode 206.

Here, the thickness in combination of the block insulating film 200 under the edge of the first gate electrode 205 and the gate electrode sidewall insulating film 208 formed on that edge is formed thicker than thicknesses of other portions of the block insulating film 200. The drain impurity region 196 is formed within the semiconductor substrate 197 under an edge of the tunnel insulating film 198. A surface oxide film 210 is formed on the drain impurity region 196 in a region where the data retention insulating film 199 is not formed. The interlayer insulating film 201 is formed on the surface oxide film 210. Here, the tunnel insulating film 198, the data retention insulating film 199 and the block insulating film 200 protrude from the first gate electrode 205 toward the direction of the interlayer insulating film 201 as equivalent to the thickness of the gate electrode sidewall insulating film 208.

In this embodiment, the both edges of the block insulating film 200 (the insulating film that also includes a region of the polysilicon sidewall oxide film 208 near a bottom portion thereof) are formed thicker both in the vicinity of the source impurity region 195 and the drain impurity region 196 as well as in the vicinity of the element isolation regions 203. However, the edges of the block insulating film may be formed thicker either in the vicinity of the source impurity region 195 and the drain impurity region 196 or in the vicinity of the element isolation regions 203. In other words, any one of the cross section along the "S-T" line and the cross section along the "U-V" line in FIG. 64A may be adopted, and the other thereof may remain as the prototype of the third embodiment.

It should be noted that a similar effect to the effect of the semiconductor device of this embodiment can be also obtained in a semiconductor device having a figuration as shown in FIG. 2 or FIG. 3 in accordance with the first embodiment.

Next, description will be made regarding one example of a fabricating method for realizing the semiconductor device of this embodiment by use of FIG. 68 to FIG. 76.

Throughout FIG. 68 to FIG. 76, drawings suffixed with "A" correspond to the cross section taken along the "S-T" line in FIG. 64A, and drawings suffixed with "B" correspond to the cross section taken along the "U-V" line in FIG. 64A, respectively.

First, a sacrificial oxide film (not shown) is formed on the semiconductor substrate 197, then implantation of channel impurities or well impurities is performed and the sacrificial oxide film is exfoliated thereafter. Then, as shown in FIGS.

68A and 68B, the tunnel insulating film 198 of a silicon oxide film, a silicon oxynitride film or the like is formed in a thickness from about 1 to 15 nm, for example, on the semiconductor substrate 197. Next, via an insulating film, which is a charge storing insulating film, made of a silicon nitride film, a silicon oxynitride film, a $Ta_2O_5$ film, a $TiO_2$ film, an $Al_2O_3$ film or the like in a thickness from about 3 to 30 nm, for example, as well as the block insulating film 200 made of a silicon oxide film, a silicon oxynitride film or the like in a thickness from about 1 to 15 nm, for example, deposited is the first gate electrode 205 of polysilicon or the like, for example, in a thickness from about 10 to 100 nm. In addition, an insulating film of a silicon nitride film or the like is deposited in a thickness from about 10 to 200 nm, thus forming a mask material 211.

Figure 69A:
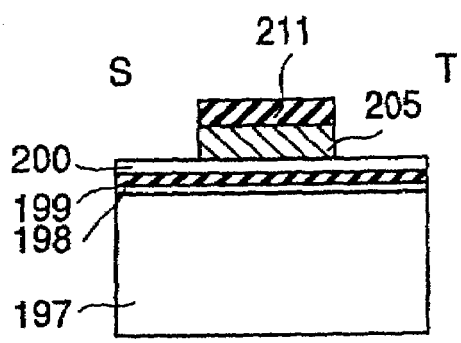
FIG. 69A is a cross-sectional view showing one step of the method of fabricating the semiconductor device according to the fifth embodiment, corresponding to the cross section taken along the "S-T" line of FIG. 64A.
Figure 69B:
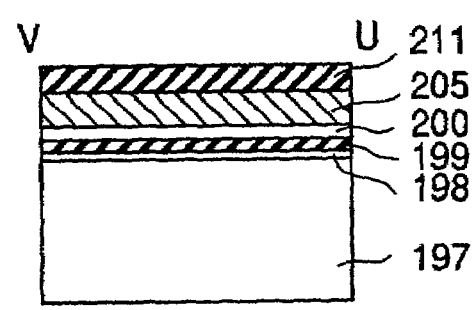
FIG. 69B is a cross-sectional view showing one step of the method of fabricating the semiconductor device according to the fifth embodiment, corresponding to the cross section taken along the "U-V" line of FIG. 64A.

Next, as shown in FIG. 69A, patterning for the element isolation regions is performed with photolithography, and then the mask material 211 and the first gate electrode 205 are processed with anisotropic etching. Note that patterning is not performed for the element isolation regions in the cross section shown in FIG. 69B.

Figure 70A:
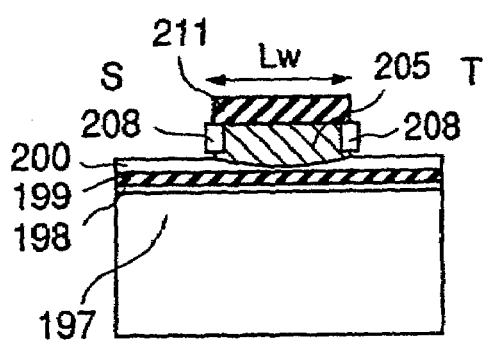
FIG. 70A is a cross-sectional view showing one step of the method of fabricating the semiconductor device according to the fifth embodiment, corresponding to the cross section taken along the "S-T" line of FIG. 64A.
Figure 70B:
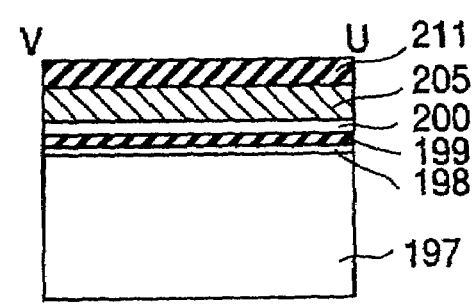
FIG. 70B is a cross-sectional view showing one step of the method of fabricating the semiconductor device according to the fifth embodiment, corresponding to the cross section taken along the "U-V" line of FIG. 64A.

Next, as shown in FIG. 70A, the polysilicon sidewall oxide film 208 is formed by oxidizing the first polysilicon electrode 205. In this event, oxidation conditions are adjusted so as to allow an oxidizing agent to enter the gate electrode edges, so that the block insulating film 200 is thickened at the edge portions thereof. Note that the polysilicon sidewall oxide film 208 is not formed in the cross section shown in FIG. 70B.

Here, when a gate width of the memory cell is $L_w$, it is necessary to leave the block insulating film not to be thickened by bird's beaks in order to realize uniform writing/erasing operation modes. For this reason, a length of invasion by bird's beaks needs to be ½ of $L_w$ or less. A thickness of the oxide film for obtaining such a length of invasion needs to be set such that an increase in the film thickness of the oxide film at the gate electrode sidewall portion does not exceed ¼ of $L_w$.

Therefore, in the case where $L_w$ is downsized to 0.2 μm or less, the increase in the film thickness of the oxide film needs to be 50 nm or less. Meanwhile, in the case where an amount of oxidation of the sidewall is 20 nm or less, an increase in the film thickness of the oxide film is about ¼ of the amount of oxidation of the sidewall. Here, oxidation of the sidewall is required for 2 nm or more in order to avoid damaged regions upon formation of the element isolation films, and an increase in the film thickness of the oxide film thickened at its edge portion is desirably set in a range from 0.6 nm to 50 nm inclusive.

Next, as shown in FIG. 71A, the gate insulating films 198, 199 and 200 and the semiconductor substrate 197 are subjected to anisotropic etching, thus forming element isolation trenches 203. Next, side faces of the element isolation trenches 203 are oxidized, thus forming an element isolation sidewall oxide film 207. Since the polysilicon sidewall oxide film 208 is formed by oxidation of the first gate electrode shown in FIG. 70A, and the data retention insulating film 199 is etched while using this polysilicon sidewall oxide film 208 as a mask, the polysilicon sidewall oxide film 208 and the data retention insulating film 199 can be aligned by self-alignment. Accordingly, it is feasible to form very small protrusions at edges of the data retention insulating film that are damaged upon burying of the element isolation insulating films by $HDP-SiO_2$ to be described later, whereby reliability is enhanced.

Moreover, a thickness of the sidewall oxide film in a semiconductor region can be made significantly thinner than that of the polysilicon sidewall oxide film. The thickness of the sidewall oxide film can be set within a range from 0 to 10 nm, for example, whereby concentration of electric fields to a thin film at convex portions of the semiconductor region can be prevented.

Here, burying of silicon oxide films into the element isolation trenches in a subsequent step can be facilitated by using conditions for etching to allow the data retention insulating film to form a forward taper. As for an angle of the forward taper, the angle is preferably set in a range from 60° to 89° regarding a surface of the semiconductor substrate as a standard. Upon burying the element isolation insulating films in the fabricating method, since all the gate electrode sidewall oxide film, the data retention insulating film and the semiconductor substrate can be formed as forward tapers, burying property of the element isolation insulating films are enhanced and reliability is thereby enhanced. Moreover, the read-disturb characteristic is enhanced by providing bird's beaks in the block insulating film.

In this embodiment, it is desirable in terms of reliability that the both edges of the data retention insulating film protrude from the semiconductor substrate in a range from 0.5 nm to 15 nm inclusive, and the thickness of the oxide film formed on inner walls of the trenches is preferably formed in a range from 1 nm to 16 nm inclusive.

Next, a thermal treatment for recovery from etching damage may take place as necessary.

Next, the element isolation trenches are filled with an insulating film such as a silicon oxide film and the like according to a method of depositing a silicon oxide film and the like such as $HDP-SiO_2$ or TEOS, and then planarization is conducted by the CMP method. Note that the element isolation trenches are not formed in the step shown in FIG. 71B.

Next, as shown in FIGS. 72A and 72B, the mask material 211, which is a stopper for the CMP method, is removed by wet etching.

Next, as shown in FIGS. 73A and 73B, deposited is the second gate electrode 206 comprised of any of: a stacked structure of polysilicon or tungsten silicide (WSi) with polysilicon; a stacked structure of NiSi, MoSi, TiSi or CoSi with polysilicon; a stacked structure of metal with polysilicon; and a single layer structure of a metal compound of silicon or metal. In combination of the first gate electrode 205 and the second gate electrode 206, the gate electrode 192 of the memory cell is completed.

Next, as shown in FIG. 74B, a pattern for the gate is formed by photolithography, and the gate electrode 192 is etched by anisotropic etching. In this event, the block insulating film 200, the data retention insulating film 199 and the tunnel insulating film 198 are not etched. Note that the gate electrode is not etched in the cross section shown in FIG. 74A.

Next, as shown in FIG. 75B, the gate electrode 192 is oxidized. In this event, oxidation conditions are adjusted so as to allow an oxidizing agent to enter the gate electrode edges, so that the block insulating film 200 is thickened at its edge portions. Note that the gate electrode is not oxidized in the cross section shown in FIG. 75A.

Here, when a gate width of the memory cell is $L_w$, it is necessary to leave the block insulating film not to be thickened by bird's beaks in order to realize uniform writing/erasing operation modes. For this reason, a length of invasion by bird's beaks needs to be ½ of $L_w$ or less. A thickness of the oxide film for obtaining such a length of invasion needs to be set such that an increase in the film thickness of the oxide film at the gate electrode sidewall portion does not exceed ¼ of $L_w$.

Therefore, in the case where $L_w$ is downsized to 0.2 μm or less, the increase in the film thickness of the oxide film needs to be 50 nm or less. Meanwhile, in the case where an amount of oxidation of the sidewall is 20 nm or less, an increase in the film thickness of the oxide film is about ¼ of the amount of oxidation of the sidewall. Here, oxidation of the sidewall is required for 2 nm or more in order to avoid damaged regions upon formation of the element isolation films, and an increase in the film thickness of the oxide film thickened at its edge portion is desirably set in a range from 0.6 nm to 50 nm inclusive.

Next, as shown in FIG. 76B, the block insulating film 200, the data retention insulating film 199 and the tunnel insulating film 198 are etched while using the gate sidewall insulating film 212 as a mask.

Thereafter, after the steps of impurity implantation for diffusion layers, deposition of the interlayer insulating film 201, formation of the contact plugs 193 and 194 and formation of metal wiring (not shown), the non-volatile memory cell is completed.

In this way, according to this embodiment, as the gate insulating film, particularly the block insulating film thereof, is thickened at the edge portions of the gate electrode, it is feasible to reduce the electric fields applied to the gate insulating film upon data reading. Accordingly, the read-disturb characteristics are enhanced. Above all, the foregoing effect is largely attributable to the fact that the gate insulating film is thickened at two sides (the two sides contacting with the element isolation edges) parallel to the direction of currents flowing between the source and the drain (the "S-T" direction) as shown in FIG. 64A.

In this embodiment, the gate insulating film is thickened at all the edge portions on the four sides that define the element region of the memory cell transistor. However, it is satisfactory if the gate insulating film, preferably the block insulating film thereof, is thickened at the edge portion on one side at least out of the four sides or preferably at the edge portions on two sides parallel to the direction of currents flowing between the source and the drain.

Moreover, according to the method of fabricating the semiconductor memory device of this embodiment, an effect similar to that of the method of fabricating the semiconductor device of the third embodiment can be obtained. Furthermore, it is possible to provide a method of fabricating a semiconductor device in which variation in thresholds of the memory cell owing to the read-disturb effect is reduced.

This embodiment provides a semiconductor device that suppresses unevenness of writing/erasing characteristics and data retention characteristics as well as variation of thresholds at edges of a gate electrode.

SIXTH EMBODIMENT

Figure 77B:
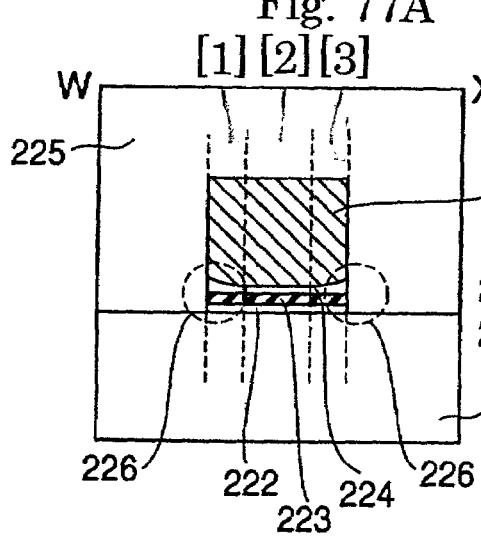
FIG. 77B is a cross-sectional view taken along the "W-X" line of FIG. 77A showing the semiconductor device of the sixth embodiment.
Figure 77C:
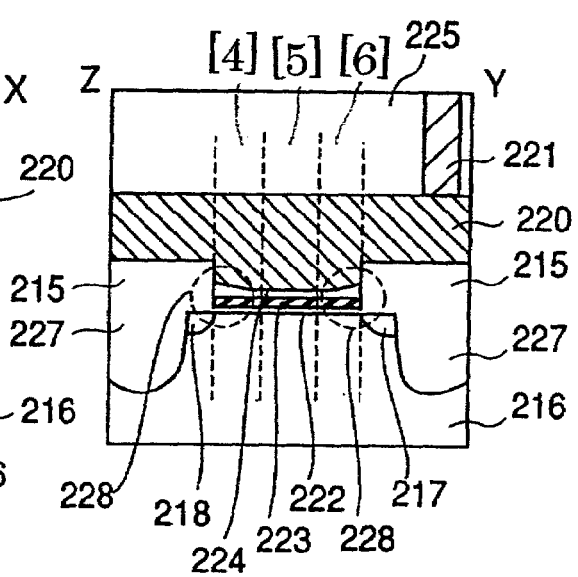
FIG. 77C is a cross-sectional view taken along the "Y-Z" line of FIG. 77A showing the semiconductor device of the sixth embodiment.

A MONOS memory cell using self-aligned STI of this embodiment is illustrated in FIGS. 77A to 77C. A top plan view of a semiconductor device of this embodiment is illustrated in FIG. 77A, in which a source impurity region 217 is formed linearly in the right-and-left direction in one side of a semiconductor substrate 216 while contacting with one of element isolation regions 215. Opposite to the source impurity region 217, a drain impurity region 218 is formed in the other side of the semiconductor substrate 216 while contacting with the other element isolation region 215. A part of the source impurity region 217 is formed to have a greater width and a source contact 219 is formed therein.

Moreover, a part of the drain impurity region 218 is formed to have a greater width and a drain contact 219 is formed therein. As perpendicular to the longitudinal direction of the source impurity region 217 and the drain impurity region 218, a gate electrode 220 is formed.

Moreover, a wide region is provided at an edge of the gate electrode 220 and a contact 221 is provided therein. In this memory cell, parts of the semiconductor substrate 216 below the gate electrode 220 constitute the source impurity region 217 and the drain impurity region 218. In the event of reading data, a writing operation mode and an erasing operation mode are discriminated in accordance with an amount of currents flowing from the source impurity region 217 to the drain impurity region 218, i.e. in the direction from "Y" to "Z" indicated with an arrow in FIG. 77A. Such a structure is utilized in AND-type EEPROMs, DINOR-type EEPROMs or the like.

A cross-sectional view of FIG. 77A taken along the "W-X" line is illustrated in FIG. 77B. The gate electrode 220 is formed on the semiconductor substrate 216. The gate electrode 220 is stacked on a gate insulating film comprised of a tunnel insulating film 222, a data retention insulating film (a charge storing region) 223 and a block insulating film 224. An interlayer insulating film 225 is formed on surfaces of the semiconductor substrate 216 and the gate electrode 220. Here, the semiconductor device of this embodiment is characterized in that the film thickness of the gate insulating film is thickened at edge portions 226 of the gate electrode. For this reason, read-disturb characteristics are improved therein. In particular, the semiconductor device of this embodiment is characterized in that either the tunnel insulating film 222 or the block insulating film 224 is thickened. It is preferable that the edge portions of the block insulating film 224 are thickened. Such preference is attributed to the following. Specifically, unevenness in the film thickness of the tunnel insulating film 222 or the data retention insulating film 223 where electric charges are transmitted may cause variations in erasing characteristics or data retention characteristics; however, thickening of the block insulating film 224 at its edge portions does not cause variations in those characteristics because of no electric charges transmitted therethrough.

Moreover, a cross-sectional view of FIG. 77A taken along the "Y-Z" line is illustrated in FIG. 77C. Element isolation trenches 227 are provided in the semiconductor substrate 216, and the element isolation regions 215 are formed in the element isolation trenches 277. The gate insulating film comprised of the tunnel insulating film 222, the data retention insulating film 223 and the block insulating film 224, and the gate electrode 220 are formed in a space between the element isolation regions 215. Here, the semiconductor device of this embodiment is characterized in that the film thickness of the gate insulating film is thickened at the edge portions 226 of the gate electrode. For this reason, read-disturb characteristics are improved therein. In particular, the semiconductor device of this embodiment is characterized in that either the tunnel insulating film 222 or the block insulating film 224 is thickened. It is preferable that the edge portions of the block insulating film 224 are thickened.

In this memory cell, an unillustrated well of a low-density impurity region is formed in an upper part of the semiconductor substrate 216. The tunnel insulating film 222 of a silicon oxide film, a silicon oxynitride film or the like is formed in a film thickness from about 1 to 15 nm, for example, on the semiconductor substrate 216. In addition, the data retention insulating film 223 of an insulating film such as a silicon nitride film, a silicon oxynitride film, a Ta$_2$O$_5$ film, a TiO$_2$ film or an Al$_2$O$_3$ film is formed in a film thickness from about 3 to 30 nm, for example, on the tunnel insulating film 222.

Furthermore, the block insulating film 224 of a silicon oxide film, a silicon oxynitride film or the like is formed in a thickness from about 1 to 15 nm, for example, on the data retention insulating film 223. On the block insulating film 224, formed is the gate electrode 220 in a thickness from 10 nm to 500 nm, which is comprised of any of, for example: a stacked structure of polysilicon or tungsten silicide (WSi) with polysilicon; a stacked structure of NiSi, MoSi, TiSi or CoSi with polysilicon; a stacked structure of metal with polysilicon; and a single layer structure of a metal compound of silicon or metal. Here, the source impurity region 217 and the drain impurity region 218 are formed inside the semiconductor substrate 216 at portions contacting with edges of the element isolation regions 227. The source impurity region 217 and the drain impurity region 218 are formed under the element isolation regions 227 below edges of the tunnel insulating film 222.

Reading voltage Vref is applied to the gate electrode in the event of a reading operation of a non-volatile memory. However, thresholds of cells in erasing operation modes are raised by electric fields created by Vref accompanied with iteration of reading operations, thus causing a problem called a read-disturb effect in which threshold margins with respect to cells in writing modes are reduced.

In this embodiment, since the gate insulating films 222 and 224 are thickened at the edge portions 226 and 228 of the gate electrode 220, the electric fields created by Vref are weakened at the edge portions 226 and 228. For this reason, variation of thresholds owing to the read-disturb effect is suppressed at the edge portions 226 and 228 in comparison with a central portion of a channel. When the memory cell is divided into regions [1], [2] and [3] as shown in FIG. 77B, or into regions [4], [5] and [6] as shown in FIG. 77C, the foregoing aspect refers to decreases in variation of thresholds at the regions [1] and [3], or the regions [4] and [6]. In particular, the foregoing effect is largely attributable to a decrease in variation of thresholds at two sides (element isolation edges) parallel to the direction of the "Y-Z" line in FIG. 77A, which is the direction of currents flowing between the source and the drain.

Such an aspect will be described by use of FIGS. 78A, 78B and 78C. FIG. 78A shows a circuit diagram of transistors corresponding to the cross section of FIG. 77B. FIG. 78B shows a circuit diagram of transistors corresponding to the cross section of FIG. 77C. FIG. 78C is a graph showing variations of characteristics between currents and voltage in each state of the data retention insulating film, in which gate voltage is indicated by the transverse axis and drain currents are indicated by the longitudinal axis. In the circuit diagram shown in FIG. 78A, illustrated is a composition of three transistors [1], [2] and [3] connected in parallel between a source and a drain while gates thereof are mutually connected. The transistors [1], [2] and [3] correspond to the memory cell transistor regions [1], [2] and [3] in FIG. 77B, respectively. Moreover, in the circuit diagram shown in FIG. 78B, illustrated is a composition of three transistors [4], [5] and [6] connected in series between the source and the drain while gates thereof are mutually connected. The transistors [4], [5] and [6] correspond to the memory cell transistor regions [4], [5] and [6] in FIG. 77C, respectively.

FIG. 78C shows characteristics between drain currents Id and gate voltage Vg of the memory cell. Although thresholds of the memory cell in the erasing mode rise because of Vref stress upon reading, variation of the thresholds are small at the edge portions [1] and [3] in comparison with the central portion [2] because electric fields are weakened at the edge portions. In a memory using an insulating film as a charge storing layer, such as a MONOS memory, since trapped electric charges do not move within the insulating film, the thresholds at the edge portions [1] and [3] are maintained low in comparison with the threshold at the central portion [2]. Since the regions [1], [2] and [3] are disposed in parallel between the source and the drain as shown in FIG. 78A, the thresholds of the memory cell are decided by the regions [1] and [3] that possess lower thresholds. For this reason, suppression of variation in the thresholds of the memory cell becomes feasible by suppressing variation of the thresholds at [1] and [3] by weakening the electric fields at the edge portions.

An erasing operation, a write operation and a read operation of the semiconductor device of this embodiment are similar to those of the semiconductor device of the fourth embodiment.

Figure 79:
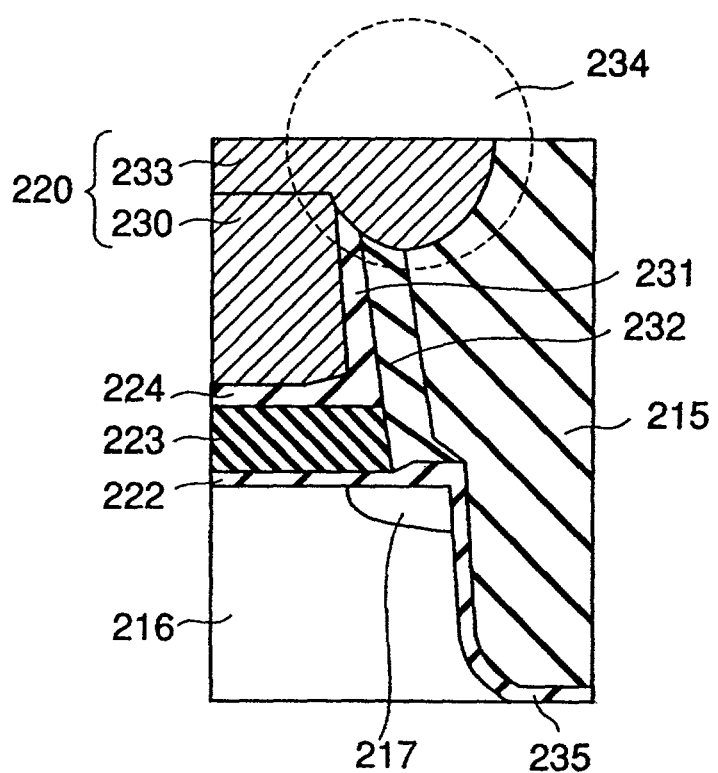
FIG. 79 is an enlarged cross-sectional view of a part of FIG. 78C which is the cross-sectional view of the semiconductor device according to the sixth embodiment.

Next, an enlarged view of the cross section shown in FIG. 77C is illustrated in FIG. 79.

A polysilicon sidewall insulating film 231 is formed between the first gate electrode 230 and the element isolation region 215. Moreover, a gate sidewall insulating film 232 is formed between the polysilicon sidewall insulating film 231 and the element isolation region 215. The gate sidewall insulating film 232 is formed extending to a side face of the data retention insulating film 223. Moreover, a second gate electrode 233 is formed on the first gate electrode 230. Furthermore, at an edge 234 where the second gate electrode 233 contacts with the polysilicon sidewall insulating film 231, the gate sidewall insulating film 232 and the element isolation region 215, the second gate electrode 233 penetrates toward the direction of the semiconductor substrate 216. As in the drawing, the data retention insulating film 223 protrudes from the first gate electrode 230 toward the direction of the element isolation region 215 as equivalent to the thickness of the polysilicon sidewall insulating film 231. Moreover, a portion of the block insulating film 224 under an edge of the first gate electrode 230 is formed thicker than other portions thereof.

Moreover, while connecting with the tunnel insulating film 222, an element isolation sidewall insulating film 235 is formed between the element isolation region 215 and the semiconductor substrate 216. Furthermore, the drain impurity region 217 is formed below an edge of the data retention insulating film 223.

Although the edge of the data retention insulating film 223 protrudes with respect to the first gate electrode 230 in the structure shown in FIG. 79, the edge does not necessarily have to protrude with respect to the first gate electrode 230. In other words, it is possible to adopt the structure as shown in FIGS. 77B and 77C, in which the sidewall insulating film is not formed on the gate electrode so that the edge of the data retention insulating film 223 does not protrude with respect to the gate electrode 220. Moreover, the block insulating film of this embodiment is formed thicker at all four sides below the edges of the gate electrode of the memory cell transistor. However, it is satisfactory if the gate insulating film, preferably the block insulating film, is formed thicker at one side at least out of the four sides, or preferably at two sides parallel to the direction of currents flowing between the source and the drain.

In this way, according to the semiconductor device of this embodiment, as the gate insulating film, particularly the block insulating film thereof, is thickened at the portions below the edge portions of the gate electrode, it is feasible to reduce the electric fields applied to the gate insulating film upon data read operation. Accordingly, the read-disturb characteristic is enhanced. Above all, the foregoing effect is largely attributable to the fact that the edges of the gate insulating film are thickened at two sides (the two sides defining the gate edges) parallel to the direction of currents flowing between the source and the drain (the "Y-Z" line direction in FIG. 77A), that is, in accordance with the cross section shown in FIG. 77B.

Next, description will be made regarding one example of a method of fabricating the semiconductor device of this embodiment by use of FIG. 80 to FIG. 88.

Throughout FIG. 80 to FIG. 88, drawings suffixed with A correspond to the cross section taken along the "Y-Z" line in FIG. 77A, and drawings suffixed with B correspond to the cross section taken along the "W-X" line in FIG. 77A, respectively.

First, after a sacrificial oxide film (not shown) is formed on the semiconductor substrate 216, implantation of channel impurities or well impurities is performed and the sacrificial oxide film is exfoliated thereafter.

Figures 80A, 80B:
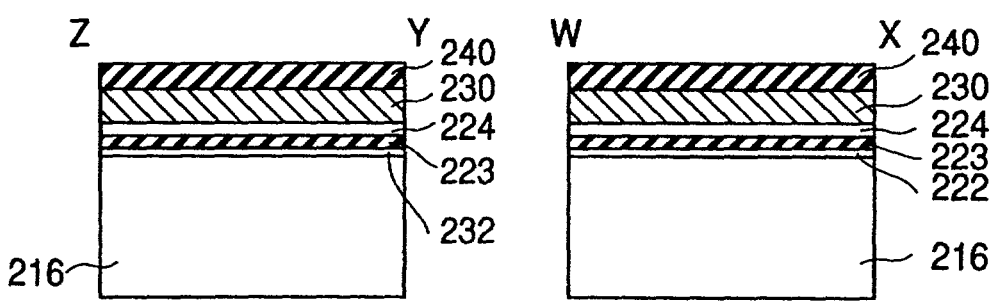
FIG. 80A is a cross-sectional view showing one step of a method of fabricating the semiconductor device according to the sixth embodiment, corresponding to a cross section taken along the "Y-Z" line of FIG. 77A.
FIG. 80B is a cross-sectional view showing one step of a method of fabricating the semiconductor device according to the sixth embodiment, corresponding to a cross section taken along the "W-X" line of FIG. 77A.

Then, as shown in FIGS. 80A and 80B, formed serially on the semiconductor substrate 216 are the tunnel insulating film 222 of a silicon oxide film, a silicon oxynitride film or the like in a thickness from about 1 to 15 nm, for example, and the data retention insulating film 223 of a silicon nitride film, a silicon oxynitride film, or an insulating film of $Ta_2O_5$, $TiO_2$, $Al_2O_3$ or the like in a thickness from about 3 to 30 nm, for example. Moreover, formed is the block insulating film 224 of a silicon oxide film, a silicon oxynitride film or the like in a thickness from about 1 to 15 nm, for example. Furthermore, the first gate electrode 230 of polysilicon or the like, for example, is deposited thereon in a thickness from about 10 to 100 nm. In addition, an insulating film of a silicon nitride film or the like is deposited in a thickness from about 10 to 200 nm, thus forming a mask material 240.

Figure 81A:
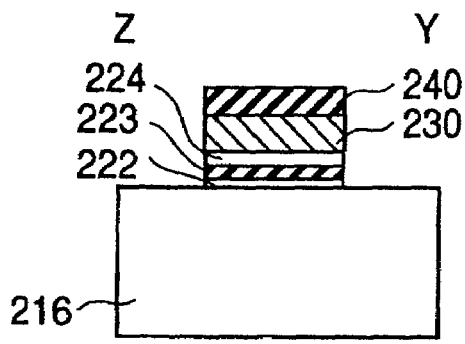
FIG. 81A is a cross-sectional view showing one step of the method of fabricating the semiconductor device according to the sixth embodiment, corresponding to the cross section taken along the "Y-Z" line of FIG. 77A.
Figure 81B:
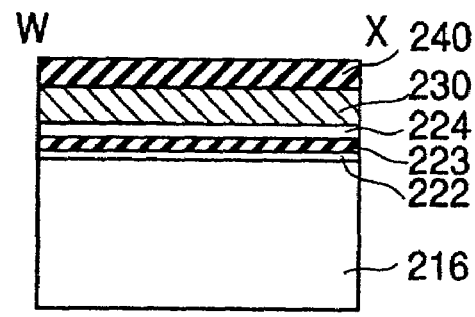
FIG. 81B is a cross-sectional view showing one step of the method of fabricating the semiconductor device according to the sixth embodiment, corresponding to the cross section taken along the "W-X" line of FIG. 77A.

Next, in the step shown in FIG. 81A, patterning for the element isolation regions is performed with photolithography, and then the mask material 240, the first gate electrode 230, the block insulating film 224, the data retention insulating film 223 and the tunnel insulating film 232 are processed by anisotropic etching. Note that etching is not performed in the cross section shown in FIG. 81B.

Figure 82A:
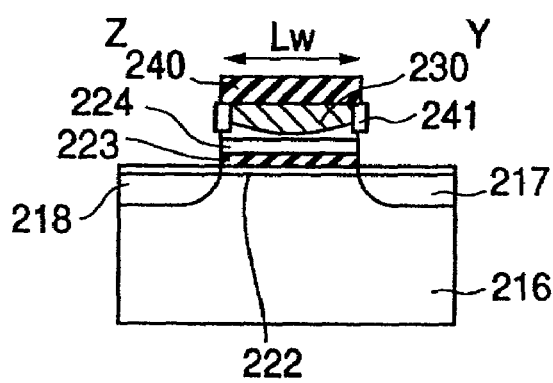
FIG. 82A is a cross-sectional view showing one step of the method of fabricating the semiconductor device according to the sixth embodiment, corresponding to the cross section taken along the "Y-Z" line of FIG. 77A.
Figure 82B:
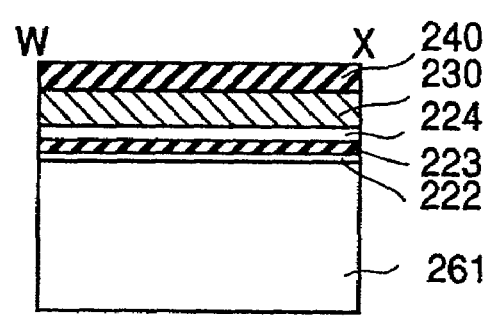
FIG. 82B is a cross-sectional view showing one step of the method of fabricating the semiconductor device according to the sixth embodiment, corresponding to the cross section taken along the "W-X" line of FIG. 77A.

Next, as shown in FIG. 82A, the source impurity region 217 and the drain impurity region 218 are formed by implanting impurities for diffusion layers into the semiconductor substrate 216 while using the mask material 240 as a mask. Subsequently, the first gate electrode 230 is subjected to oxidation. In this event, oxidation conditions are adjusted so as to allow an oxidizing agent to enter the gate electrode edges, so that the block insulating film 224 is thickened at the edge portions thereof. Note that neither the impurity implantation nor the oxidation is performed in the cross section shown in FIG. 82B.

Here, when a gate width of the memory cell is $L_w$, it is necessary to leave the block insulating film not to be thickened by bird's beaks in order to realize uniform writing/erasing operation modes. For this reason, a length of invasion by bird's beaks needs to be ½ of $L_w$ or less. A thickness of the oxide film for obtaining such a length of invasion needs to be set such that an increase in the film thickness of the oxide film at the gate electrode sidewall portion does not exceed ¼ of $L_w$.

Therefore, in the case where $L_w$ is downsized to 0.2 μm or less, the increase in the thickness of the oxide film needs to be 50 nm or less. Meanwhile, in the case where an amount of oxidation of the sidewall is 20 nm or less, an increase in the thickness of the oxide film is about ¼ of the amount of oxidation of the sidewall. Here, oxidation of the sidewall is required for 2 nm or more in order to avoid damaged regions upon formation of the element isolation films, and an increase in the thickness of the oxide film thickened at its edge portion is desirably set in a range from 0.6 nm to 50 nm inclusive.

Figure 83A:
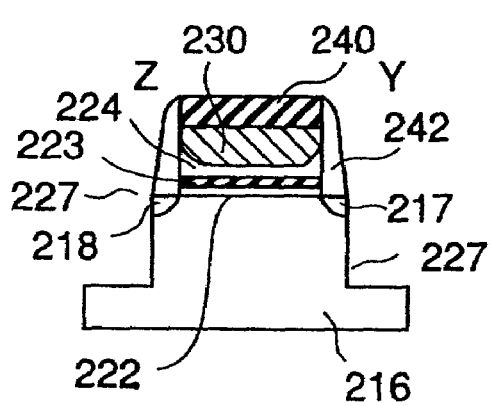
FIG. 83A is a cross-sectional view showing one step of the method of fabricating the semiconductor device according to the sixth embodiment, corresponding to the cross section taken along the "Y-Z" line of FIG. 77A.
Figure 83B:
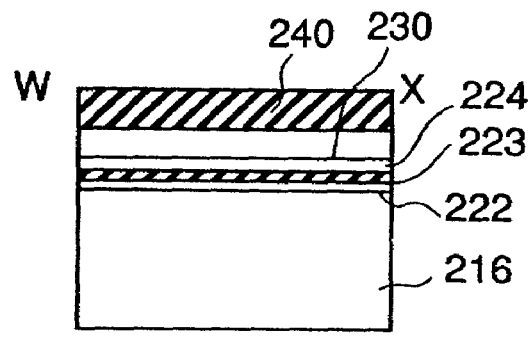
FIG. 83B is a cross-sectional view showing one step of the method of fabricating the semiconductor device according to the sixth embodiment, corresponding to the cross section taken along the "W-X" line of FIG. 77A.
Figures 84A, 84B:
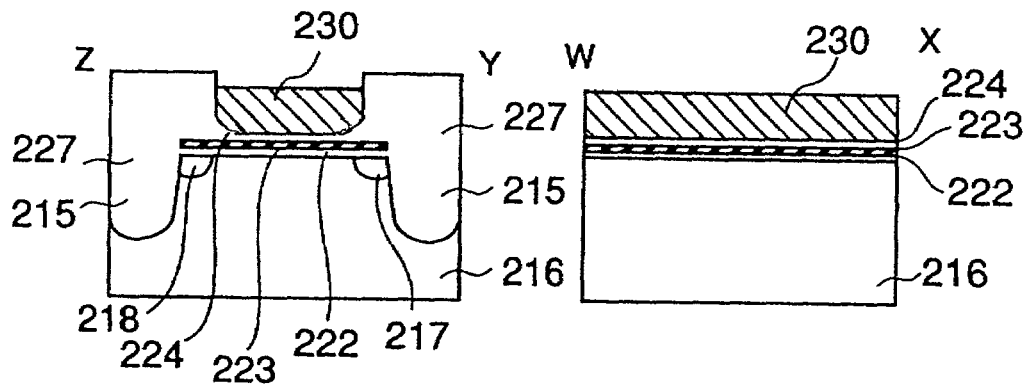
FIG. 84A is a cross-sectional view showing one step of the method of fabricating the semiconductor device according to the sixth embodiment, corresponding to the cross section taken along the "Y-Z" line of FIG. 77A.
FIG. 84B is a cross-sectional view showing one step of the method of fabricating the semiconductor device according to the sixth embodiment, corresponding to the cross section taken along the "W-X" line of FIG. 77A.

Next, as shown in FIG. 83A, an insulating film such as a silicon oxide film is deposited in a thickness from about 5 to 50 nm, for example, and is etched back by anisotropic etching, thus forming gate sidewall insulating films 242. Then, the semiconductor substrate 261 is processed by anisotropic etching while using the gate sidewall insulating films 242 as a mask, thus forming the element isolation trenches 227. Here, depths of the element isolation trenches to be formed therein are set in a range from about 50 nm to 300 nm, for example. Note that the element isolation trenches are not formed in accordance with the cross section as shown in FIG. 83B. By forming the gate sidewall insulating film 242 as described above, the source impurity region 217 and the drain impurity region 218 can be remained at edges of a channel. Widths of the remaining gate impurity region 217 and drain impurity region 218 are controllable corresponding to widths of the gate sidewall insulating films 242 remained.

Next, after performing a thermal treatment for recovery from etching damage as necessary, the element isolation trenches 227 are filled with an insulating film such as a silicon oxide film according to a method of depositing a silicon oxide film and the like, such as HDP-$SiO_2$ or TEOS. Thereafter, planarization is conducted by the CMP method, and then the mask material 240, which is a stopper for the CMP method, is removed by wet etching. Moreover, in the cross section shown in FIG. 84B, the mask material 240 is removed so as to expose an upper surface of the first gate electrode 230.

Figures 85A, 85B:
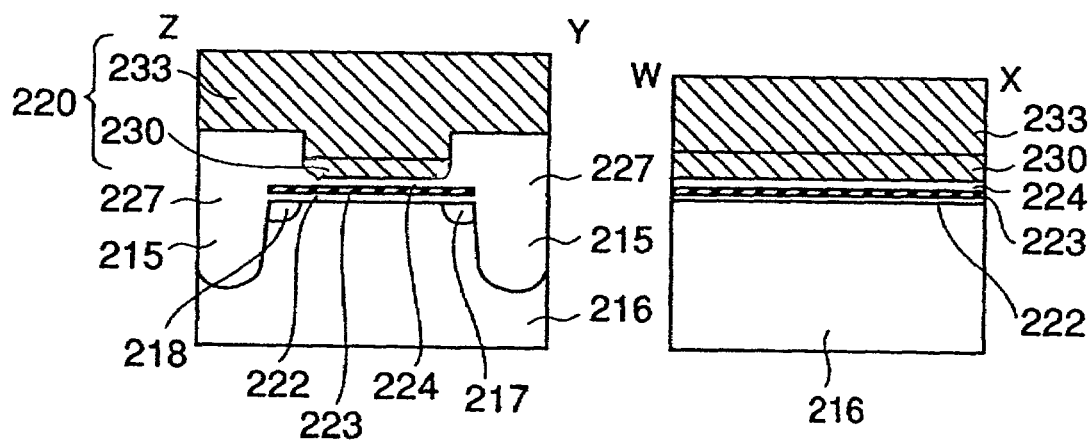
FIG. 85A is a cross-sectional view showing one step of the method of fabricating the semiconductor device according to the sixth embodiment, corresponding to the cross section taken along the "Y-Z" line of FIG. 77A.
FIG. 85B is a cross-sectional view showing one step of the method of fabricating the semiconductor device according to the sixth embodiment, corresponding to the cross section taken along the "W-X" line of FIG. 77A.

Next, as shown in FIGS. 85A and 85B, deposited is the second gate electrode 233 comprised of any of, for example: a stacked structure of polysilicon or WSi with polysilicon; a stacked structure of NiSi, MoSi, TiSi or CoSi with polysilicon; a stacked structure of metal with polysilicon; and a single layer structure of a metal compound of silicon or metal. In combination of the first gate electrode 230 and the second gate electrode 233, the gate electrode 220 of the memory cell is completed.

Figures 86A, 86B:
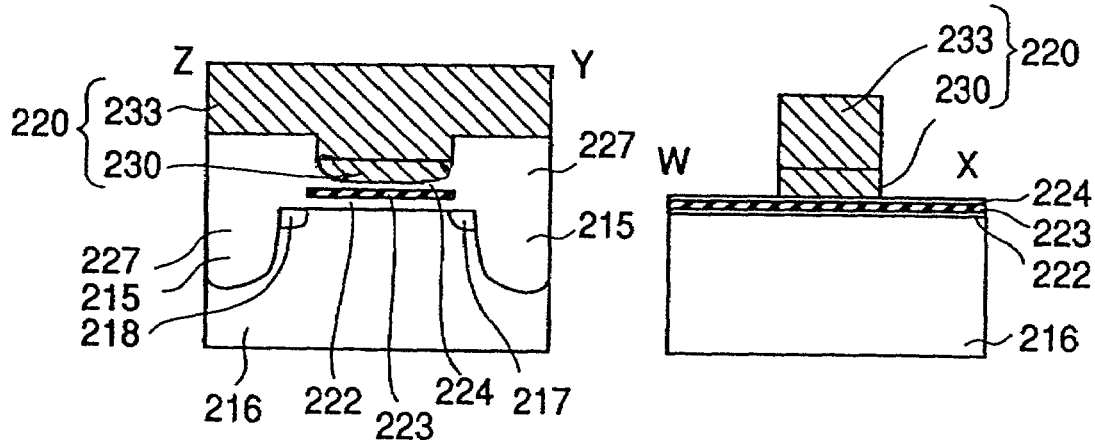
FIG. 86A is a cross-sectional view showing one step of the method of fabricating the semiconductor device according to the sixth embodiment, corresponding to the cross section taken along the "Y-Z" line of FIG. 77A; and FIG.

Next, as shown in FIG. 86B, a pattern for the gate is formed by photolithography, and the gate electrode 220 is etched by anisotropic etching. In this case, normally, whereas the block insulating film 224 is slightly etched, the data retention insulating film 223 should be avoided from etching. In addition, a thermal treatment may take place for recovery from etching damage, if necessary. Moreover, after the foregoing step, recovery from damage may be also conducted by oxidation of the first gate electrode to the extent in a range from 2 nm to 20 nm, for example. Note that the gate electrode 220 is not etched in the cross section shown in FIG. 86A.

Next, as shown in FIG. 87B, gate sidewall insulating films 241 are formed by oxidizing the gate electrode 220. In this event, oxidation conditions are adjusted so as to allow an oxidizing agent to enter the edges of the gate electrode 220, so that the block insulating film 224 is thickened at the edge portions thereof. Here, when a gate width of the memory cell is $L_w$, it is necessary to leave the block insulating film 224 not to be thickened by bird's beaks in order to realize uniform writing/erasing modes. For this reason, a length of invasion by bird's beaks needs to be ½ of $L_w$ or less. A thickness of the oxide film of the block insulating film 224 for obtaining such a length of invasion needs to be set such that an increase in the film thickness of the oxide film at the sidewall portion of the gate electrode 220 does not exceed ¼ of $L_w$.

Therefore, in the case where $L_w$ is downsized to 0.2 μm or less, the increase in the thickness of the oxide film needs to be 50 nm or less. Meanwhile, in the case where an amount of oxidation of the sidewall is 20 nm or less, an increase in the thickness of the oxide film is about ¼ of the amount of oxidation of the sidewall. Here, oxidation of the sidewall is required for 2 nm or more in order to avoid damaged regions upon formation of the element isolation films, and an increase in the thickness of the oxide film thickened at its edge portion is preferably set in a range from 0.6 nm to 50 nm inclusive. Note that the gate sidewall insulating film 241 is not formed in the cross section shown in FIG. 87A.

Next, as shown in FIG. 88B, etching is performed on the block insulating film 224, the data retention insulating film 223 and the tunnel insulating film 222 on the semiconductor substrate 216 in a region other than portions below the gate electrode 220 while using the gate electrode 220 and the gate sidewall insulating film 241 as a mask. Next, the interlayer insulating film 215 is deposited on an exposed surface, and the contact plug 221 is formed inside the interlayer insulating film 215, and then after the step of forming metal wiring (not shown), the non-volatile memory cell is completed.

According to the method of fabricating the semiconductor device of this embodiment, an effect similar to that in the method of fabricating the semiconductor device of the fifth embodiment can be obtained.

MODIFIED EXAMPLE OF SIXTH EMBODIMENT

In this modified example, a virtual ground array cell structure is realized as shown in FIG. 89. FIG. 89 shows an enlarged view of the structure corresponding to the cross section shown in FIG. 77C. Here, unlike the sixth embodiment, the element insulation regions 190 are not provided therein but p-type high-density impurity regions 245, for example, are provided in the semiconductor substrate 216 instead. A source diffusion layer 217 is formed in the semiconductor substrate 210 adjacently to the p-type high-density impurity region 245. Moreover, the interlayer insulating film 215 is formed on the p-type high-density impurity region 245 via a silicon oxide film 246. The tunnel insulating film 222 is formed on the semiconductor substrate 216. The data retention insulating film 223 is formed on the tunnel insulating film 222 as well as on a part of the silicon oxide film 246 contacting with the tunnel insulating film 222. The block insulating film 224 is formed on the data retention insulating film 223. The first gate electrode 230 and the second gate electrode 233 are stacked on the block insulating film 224.

The gate electrode sidewall insulating film 232 is formed on sidewalls of the first gate electrode 230 and the second gate electrode 233. Under an edge portion of the first gate electrode 230, the thickness in combination of the gate electrode sidewall insulating film 232 and the block insulating film 224 is formed thicker than the thickness of the block insulating film 224 in portions other than the edge portions thereof. Moreover, the data retention insulating film 223 is formed so as to protrude from the edges of the first gate electrode 230 in the right-and-left direction in FIG. 89.

In a method of fabricating this semiconductor device, the step of etching the semiconductor substrate shown in FIG. 83A according to the method of fabricating the semiconductor device of the sixth embodiment is not always necessary for realizing the virtual ground array cell structure, but a process of burying an insulating film from the surface of the semiconductor substrate 216 up to a height of the mask material 240 can be substituted for that step.

In addition, instead of the step shown in FIG. 83A, p-type impurities composed of boron or indium, for example, may be doped thereafter in a range from $10^{11}$ cm$^{-2}$ to $10^{14}$ cm$^{-2}$ as shown in FIG. 89, in order to improve element isolation between adjacent second gate electrodes. In this event, since either the element isolation film or the sidewall insulating film is also formed in upper parts of the source and the drain impurity regions in advance, it is possible to inhibit interfusion of the p-type impurities into the n-type source and drain electrodes by confining p-type impurity ions to stop at the element isolation film. Energy for implanting ions of the p-type impurities is set in a range from 1 eV to 100 eV. Moreover, in this event, damage caused by ions of the p-type impurity implantation, which are introduced to the charge storing film, can be separated by the gate electrode sidewall insulating film, whereby a memory cell of higher reliability can be achieved.

In the virtual ground array cell of the figuration as described above, a p-plus diffusion layer or an n-plus diffusion layer is formed instead of element isolation regions formed by burying an insulating material therein, and each of the diffusion layers serves for element isolation. Here, the n-plus diffusion layer is not fixed to a particular function, but the n-plus diffusion layer serves as a bit line or a source line.

This modified example has an effect similar to that of the sixth embodiment. Moreover, in the case where the p-type impurities composed of boron or indium, for example, are added in order to improve element isolation between adjacent gate electrodes, formation of an inversion layer at edge portions is suppressed, and furthermore, occurrence of problems such as uneven voltage-withstanding characteristics among channels between adjacent memory cells or current leakages can be reduced.

SEVENTH EMBODIMENT

A structure of a semiconductor device of this embodiment is illustrated in FIG. 90 and FIG. 91. This embodiment constitutes a NAND-type EEPROM, which is one type of typical non-volatile memory devices, the NAND-type EEPROM being a set of memory cells including the characteristics of the precedent third embodiment and fifth embodiment.

Here, FIG. 90A shows an equivalent circuit diagram of the NAND-type EEPROM and FIG. 90B shows a plan view of the memory cells. Here in the NAND-type EEPROM, memory cell transistors M0 to M15 are disposed in series between source-line contacts and bit-line contacts via a source selective transistor S1 where a SSL signal line is inputted to a gate thereof and another source selective transistor S2 where a GSL signal line is inputted to a gate thereof, thus constituting one NAND memory cell block. Each of gate electrodes (control gates) of the memory cell transistors are connected to each of data selective lines (word lines) WL 0 to WL 15. Moreover, a back gate of each of the memory cell transistors M0 to M15 is provided with well electric potential.

Moreover, as shown in FIG. 90B, a plurality of bit lines BL are disposed linearly and in parallel to one another with constant intervals in the vertical direction in the drawing. Perpendicular to the bit lines BL, a plurality of word lines are disposed under the bit lines as parallel to one another. Element isolation regions 250 are formed at spaces between the respective word lines WL 0 to WL 15 except for places under the bit lines, whereby source and drain regions 251 are insulatingly isolated. Bit-line contacts 252 are formed in the source and drain regions 251 of the bit lines BL adjacent to the SSL signal line. Moreover, SL contacts 253 provided with ground potential are connected with the source and drain regions 251 of the bit lines BL adjacent to the GSL signal line.

Furthermore, FIG. 91A shows a cross-sectional view of the memory cell in the row direction upon sectioning parallel to the word line (a cross-sectional view taken along the "III-IV" line in FIG. 90B); and FIG. 91B shows a cross-sectional view of the memory cell in the column direction upon sectioning perpendicularly to the word line (a cross-sectional view taken along the "I-II" line in FIG. 90B)

Note that the number of the memory cell transistors in one NAND block is 16 in FIG. 90, and that the selective transistors adopt MOS structures unlike the memory cells. However, the number of memory cells in one NAND block is not limited to 16, and the selective transistors may also adopt MONOS structures as the same as the memory cells. The configuration shown in FIG. 90 is a combination of the structures of the semiconductor devices of the third embodiment and of the fifth embodiment.

As shown in FIG. 91A, in this memory cell, an n-type well 256 is formed on a semiconductor substrate 255, and a p-type well 257 is formed on the n-type well 256. Element isolation trenches 258 are provided in the p-type well 257, and insulating materials are buried in the element isolation trenches 258, thus forming a plurality of element isolation regions 259. On the p-type well 257 between the plurality of element isolation regions 259, formed is a tunnel insulating film 260 of a silicon oxide film, a silicon oxynitride film or the line in a film thickness from about 1 to 15 nm, for example. In addition, a data retention insulating film 261 of an insulating film such as a silicon nitride film, a silicon oxynitride film, a $Ta_2O_5$ film, a $TiO_2$ film or an $Al_2O_3$ film is formed on the tunnel insulating film 260, in a film thickness from about 3 to 30 nm, for example.

Furthermore, a block insulating film 262 of a silicon oxide film, a silicon oxynitride film or the like is formed in a thickness from about 1 to 15 nm, for example, on the data retention insulating film 261. On the block insulating film 262, formed is a word line WL in a thickness from 10 nm to 500 nm of a stacked structure of a first gate electrode 263 and a second gate electrode 264, the first gate electrode being comprised of any of, for example: a stacked structure of polysilicon or tungsten silicide (WSi) with polysilicon, a stacked structure of NiSi, MoSi, TiSi or CoSi with polysilicon, a stacked structure of metal with polysilicon, and a single layer structure of a metal compound of silicon or metal. A first interlayer insulating film 265 is formed on the second gate electrode 264. A plurality of bit lines BL are formed inside an upper part of the first interlayer insulating film 265. A second interlayer insulating film 266 is formed on the bit lines BL and the first interlayer insulating film 265.

Here, regarding the data retention insulating film 261, edge portions thereof are formed so as to protrude into the element isolation regions 259. Moreover, regarding the block insulating film 262, edge portions thereof contacting with the element isolation regions 259 are formed thicker than other portions thereof.

Here, lengths of protrusions of the data retention insulating film 261 as well as a degree of the thickening of the block insulating film are similar to the precedent third embodiment and fifth embodiment.

In the cross section shown in FIG. 91B, the memory cell transistors are formed on the block insulating film 262 on the data retention insulating film 261 on the tunnel insulating 260, those of which are formed on the p-type well 257 in plural while being isolated from each other. Here gate electrode sidewall insulating films 267 are formed around the gate electrodes. A width of each block insulating film 262 is formed narrower than widths of each tunnel insulating film 260 and each data retention insulating film 261 as equivalent to a width of each gate electrode sidewall insulating film 267. The source and drain regions 251 are formed in the vicinity of the upper surface of the p-type well 257 between the respective gate electrodes.

The selective transistor S1 on one end of an array of the memory cells is formed as a stacked structure of a first gate electrode 269 and a second gate electrode 270 on a gate insulating film 268 provided on the p-type well 257. A gate sidewall insulating film 271 is formed around the selective transistor S1. The gate insulating film 268 is formed thicker under edges of the first gate electrode 269 in comparison with other portions thereof. A width of the selective transistor S1 is formed larger than widths of the memory cell transistors. The bit-line contact 252 is connected with the source and drain region 251 in the p-type well 257 at an end of the selective transistor S1. The bit-line contact 252 is provided within the first interlayer insulating film 265 and is connected with the bit line BL.

The selective transistor S2 on the other end of the array of the memory cells is formed on the p-type well 257 similarly to the selective transistor S1. The source-line contact 253 is connected with the source and drain region 251 in the p-type well 257 at an end of the selective transistor S2. The source-line contact 253 is provided within the first interlayer insulating film 265 and is connected with a source line 272 provided within the first interlayer insulating film 265.

Next, description will be made regarding operations of the semiconductor device of this embodiment. An erasing operation is conducted in a manner that high voltage (from 10 to 25 V, for example) is applied to the semiconductor substrate in a state where the gate electrode is set to 0 V, for example, thereby injecting holes from the semiconductor substrate into the charge storing region. Otherwise, the erasing operation is conducted in a manner that drain electric potential is negatively biased with respect to source electric potential, thereby generating hot holes accelerated by a channel, and further, that the gate electrode is negatively biased with respect to the source electric potential, thereby injecting the hot holes into the charge storing region. Yet otherwise, the erasing operation is conducted in a manner that the source electric potential and the drain electric potential are positively biased with respect to well electric potential, thereby generating hot holes at a junction between the impurity region and the well, and further, that the gate electrode is negatively biased with respect to the well electric potential, thereby injecting the hot holes into the charge storing region.

A writing operation is conducted in a manner that high voltage (from 10 to 25 V, for example) is applied to the gate electrode in a state where the semiconductor substrate is set to 0 V, for example, whereby electric charges move from the semiconductor substrate via the tunnel insulating film so as to inject electrons into the charge storing region. Otherwise, the writing operation is conducted in a manner that the drain electric potential is positively biased with respect to the source electric potential, thereby generating hot electrons accelerated by a channel, and further, that the gate electrode is positively biased with respect to the source electric potential, thereby injecting the hot electrons into the charge storing region.

In a reading operation, the bit line connected with the drain contact is pre-charged and made to be in a floating mode, and then the voltage of the gate electrode of the memory cell selected for reading is set to read voltage Vref and a source line is set to 0 V. Thereafter, the bit line detects as whether or not currents flow in the memory cells. The voltage at the control gates of the memory cells not selected for reading is set to non-selective read voltage Vread. Gate voltage on the selective transistors S1 and S2 is set to power source voltage Vcc, and the source line is set to 0 V. The reading operation is conducted in a manner that the bit line detects as whether or not currents flow in the memory cells selected for reading. Specifically, as shown in FIG. 92, Vref is given to a gate M2 of the memory cell selected for reading, and Vread is given to gates of the other memory cells M0, M1 and M3 to M15 which are unselected for reading. Meanwhile, Vdd is given to gates of the selective transistors S1 and S2.

In other words, in the writing operation mode where a threshold Vth of the memory cell is greater than Vref, the memory cell is turned off and the bit line retains the pre-charged electric potential. To the contrary, in the erasing operation mode where the threshold Vth of the selected memory cell is smaller than Vref, the memory cell is turned on and the electric potential of the bit line is decreased from the pre-charged electric potential by ΔV. Data in the memory cell is read out by detecting such changes in electric potential with a sense amplifier. Threshold voltage of the memory cell varies in accordance with variation in amounts of electric charges in the charge storing insulating film; accordingly, the data can be read out by detecting such variation.

Here, Vref is intermediate voltage between a threshold in the writing operation mode and a threshold in the erasing mode, Vread is voltage higher than the threshold in the writing mode and Vdd is voltage higher than a threshold of the selective transistor.

In a reading operation of a NAND-type EEPROM, since the voltage Vread higher than the threshold in the writing operation mode is applied to word lines unselected for reading as described above, variation of thresholds attributable to the read-disturb effect becomes greater in comparison with the case of using the voltage Vref as described in the fifth and sixth embodiments.

On the contrary, the semiconductor device of this embodiment has the block insulating film thickened under the edge portions of the gate electrode, whereby the electric fields attributable to Vread are weakened at the edge portions and a rise in an erasing threshold is reduced. When the data retention insulating film is used as the charge storing region, as electric charges do not move within the data retention insulating film, the thresholds at the edge portions remain low even if the threshold at the central portion of the channel rises due to the read-disturb effect. In particular, since the thresholds at two sides parallel to the direction of reading currents flowing, i.e. at the element isolation edges are suppressed to be low, the threshold of the memory cell is also suppressed to be low, whereby the problem of the rise in the erasing threshold attributable to Vread stress can be resolved.

Moreover, in this embodiment, both edges of the date retention insulating film have shapes of protrusion with respect to the edges of element isolation regions or the edges of the gate electrode. For this reason, the both edges of the data retention insulating film, which are deteriorated in the charge retention characteristics due to fabrication damage, are not used as the charge storing region or as the gate insulating film of the transistor. Accordingly, reliability of the memory cell is enhanced. In particular, since the data retention insulating film protrudes at the two sides parallel to the direction of reading currents flowing, i.e. at the element isolation edges, it is possible to resolve inconvenience that decreases in the thresholds attributable to escape of the electric charges from the edges of the gate electrode are detected as the decrease in the threshold of the memory cell.

Furthermore, in the semiconductor device of this embodiment, two adjacent memory cells do not share one data retention insulating film in common. Accordingly, the semiconductor device of this embodiment also resolves inconvenience that the thresholds of the memory cells vary due to exchanges of electric charge between the memory cells caused by movement of the electric charges within the insulating film.

In the foregoing, description has been made regarding the example of the application of the memory cell having the characteristics of the first embodiment as well as the third embodiment with respect to the NAND-type EEPROM. However, scope of application is not limited to the foregoing. In other words, the memory cell to be used may include any characteristics as cited in the third to the sixth embodiments, or the memory cell may include only a part of the characteristic as cited in the third to sixth embodiments.

MODIFIED EXAMPLE OF SEVENTH EMBODIMENT

Application of this embodiment is not limited to a NAND-type EEPROM. In other words, this embodiment may be also applied to an AND-type EEPROM, which is this modified example, of which an equivalent circuit diagram and electric potential in a mode of reading operation are shown in FIG. 93A. Specifically, respective drains of memory cell transistors M0 to M15, each constituting one memory cell, are mutually connected with a drain of a selective transistor S1 in which a source thereof is connected with a bit line BL. Sources of the memory cell transistors M0 to M15 are mutually connected with each other to a drain of a selective transistor S2. A source of the selective transistor S2 is connected with a common source line Source. Here, in a reading mode, Vref is inputted to a gate of the memory cell transistor M2 selected for reading, and Vread is inputted to gates of other memory cell transistors M0, M1, and M3 to M15. Vdd is inputted to gates of the selective transistors S1 and S2.

Moreover, this embodiment may be also applied to a NOR-type EEPROM, of which an equivalent circuit diagram and a reading operation are shown in FIG. 93B. A drain of a memory cell transistor M1 is connected with a first bit line BL1. A drain of a memory cell transistor M2 is connected with a source of the memory cell transistor M1, and further, a drain of a memory cell transistor M3 is connected with a source of the memory cell transistor M2. Source electric potential VSL is inputted to a source of the memory cell transistor M3. Moreover, a drain of a memory cell transistor M4 is connected with an adjacent bit line BL2. A drain of a memory cell transistor M5 is connected with a source of the memory cell transistor M4, and further, a drain of a memory cell transistor M6 and the bit line BL2 are connected with a source of the memory cell transistor M5. Source electric potential VSL is inputted to a source of the memory cell transistor M6.

Here, Vref electric potential is given to a gate of the memory cell transistor M2 selected for reading and a gate of the memory cell transistor M5 connected with the adjacent bit line. The selected bit line BL1 is connected with the source of the memory cell transistor M2 selected for reading. Moreover, VSL electric potential is given to the sources of the memory cell transistors M1 and M4. Furthermore, Vread electric potential is given to gates of the memory cell transistors M1, M3, M4 and M6.

Although it is not illustrated herein, this embodiment is also applicable to other EEPROMs such as a DINOR-type. Note that this embodiment is also applicable to an EEPROM of a virtual ground array structure. In the case of the AND-type, the semiconductor device of the structure according to either the fourth embodiment or the sixth embodiment will be applied thereto. In the case of the NOR-type, the semiconductor device of the structure according to either the third embodiment or the fifth embodiment will be applied thereto. Moreover, in the case of the semiconductor device of the virtual ground array structure, the semiconductor device according to any one of the third embodiment to the sixth embodiment will be applied thereto.

In any type of EEPROMs, deterioration in data retention characteristics at edge portions of a gate electrode is resolved by a data retention insulating film having both edges protruding with respect to a gate electrode, to a semiconductor substrate, or to the both. In particular, protrusions at the both edges of the data retention insulating film on two sides parallel to the direction of reading currents flowing resolve the problem that decreases in thresholds at the edges of the gate electrode are detected as a decrease in a threshold of a memory cell therein. In other words, since portions of the data retention insulating film damaged during the fabrication processes do not exist within a channel region, decrease in thresholds can be prevented, whereby the data retention characteristics are enhanced.

Moreover, variation of thresholds at the edge portions of the gate electrode attributable to gate voltage stress upon data reading can be suppressed by thickening a gate insulating film, preferably a film thickness of a block insulating film disposed between the data retention insulating film and the gate electrode. In particular, by thickening the gate insulating film, preferably the block insulating film, on two sides parallel to the direction of reading currents flowing, suppression of variation in the thresholds at the edge portions of the gate electrode is detected as suppression of variation in the threshold of the memory cell. Accordingly, read-disturb characteristics of the memory cell are improved. A rise of the threshold can be prevented particularly when weak electric fields are applied.

Here, lengths of the protrusions of the data retention insulating film as well as degrees of thickening of the block insulating film are similar to the fourth embodiment and sixth embodiment described previously.

Moreover, severing of the data retention insulating films between two adjacent memory cells can prevent variation of thresholds attributable to exchange of electric charges between the memory cells.

In the above third embodiments to sixth embodiments, disclosed are examples of forming a contact electrode for each transistor in order to facilitate understanding of the embodiments. However, as shown in this embodiment, it is not always necessary to form the contact electrode per transistor. Instead, it is feasible to constitute serial or parallel connections among gate electrodes or drain electrodes, for example.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
a semiconductor substrate;
a memory cell having a first channel and a first gate insulating film formed on the semiconductor substrate, the first gate insulating film comprising multiple layer films including a charge storage layer;
first shallow trench isolation regions formed in trenches provided in the semiconductor substrate, the memory cell being sandwiched between the first shallow trench isolation regions;
a transistor having a second channel and a second gate insulating film formed on the semiconductor substrate; and
second shallow trench isolation regions formed in trenches provided in the semiconductor substrate, the transistor being sandwiched between the second shallow trench isolation regions;
wherein the first shallow trench isolation regions have first concave portions on upper ends thereof;
wherein the second shallow trench isolation regions have second concave portions on upper ends thereof;
wherein an entire extent of the first concave portions are formed above the charge storage layer,
wherein a film thickness of the first gate insulating film at a central portion of the first channel and at portions contacting with the first shallow trench isolation regions are equal,
wherein a film thickness of the second gate insulating film at a central portion of the second channel and at portions contacting with the second shallow trench isolation regions are equal, and
wherein heights, from a surface of the semiconductor substrate, of upper surfaces of the first shallow trench isolation regions are higher than heights, from the surface of the semiconductor substrate, of upper surfaces of the second shallow trench isolation regions.

2. The semiconductor device according to claim 1,
wherein the first gate insulating film includes a first insulating film as the charge storage layer comprised of silicon and nitrogen as main constituent elements thereof, a second insulating film formed on the first insulating film, the second insulating film comprised of silicon and oxygen, and a third insulating film formed between the first insulating film and the semiconductor substrate, the third insulating film comprised of silicon and oxygen, and
wherein a film thickness of the second insulating film at a central portion of the first channel and at portions contacting with the first shallow trench isolation regions are equal.

3. The semiconductor device according to claim 1,
wherein the memory cell has a first gate electrode and the transistor has a second gate electrode, and
wherein the first gate electrode and the second gate electrode comprise polycrystalline silicon films, which are doped with impurities of conductivity types opposite to each other.

4. The semiconductor device according to claim 1, wherein each of the first shallow trench isolation regions includes a first insulating filler, wherein each of the second shallow trench isolation regions includes a second insulating filler, wherein the upper surface of the first shallow trench isolation regions is the upper surface of the first insulating filler, and wherein the upper surface of the second shallow trench isolation regions is the upper surface of the second insulating filler.

5. A semiconductor device comprising:

a semiconductor substrate;

a memory cell having a first channel and a first gate insulating film formed on the semiconductor substrate, the first gate insulating film comprising multiple layer films including a charge storage layer;

first shallow trench isolation regions formed in trenches provided in the semiconductor substrate, the memory cell being sandwiched between the first shallow trench isolation regions;

a transistor having a second channel and a second gate insulating film formed on the semiconductor substrate; and second shallow trench isolation regions formed in trenches provided in the semiconductor substrate, the transistor being sandwiched between the second shallow trench isolation regions;

wherein the first shallow trench isolation regions have first concave portions on upper ends thereof, wherein the second shallow trench isolation regions have second concave portions on upper ends thereof, wherein an entire extent of the first concave portions are formed above the charge storage layer, wherein a film thickness of the first gate insulating film at a central portion of the first channel and at portions contacting with the first shallow trench isolation regions are equal, wherein a film thickness of the second gate insulating film at a central portion of the second channel and at portions contacting with the second shallow trench isolation regions are equal, wherein the memory cell has a first gate electrode and the transistor has a second gate electrode, and wherein the first gate electrode and the second gate electrode comprise polycrystalline silicon films, which are doped with impurities of conductivity types opposite to each other.

6. The semiconductor device according to claim 5, wherein the first gate insulating film includes a first insulating film as the charge storage layer comprised of silicon and nitrogen as main constituent elements thereof, a second insulating film formed on the first insulating film, the second insulating film comprised of silicon and oxygen, and a third insulating film formed between the first insulating film and the semiconductor substrate, the third insulating film comprised of silicon and oxygen, and wherein a film thickness of the second insulating film at a central portion of the first channel and at portions contacting with the first shallow trench isolation regions are equal.

* * * * *